United States Patent
Wala et al.

(10) Patent No.: US 11,329,701 B2
(45) Date of Patent: *May 10, 2022

(54) MASTER REFERENCE FOR BASE STATION NETWORK INTERFACE SOURCED FROM DISTRIBUTED ANTENNA SYSTEM

(71) Applicant: CommScope Technologies LLC, Hickory, NC (US)

(72) Inventors: Philip M. Wala, Savage, MN (US); Dean Zavadsky, Shakopee, MN (US); Jody Forland, St. Bonifacius, MN (US); Jeffrey J. Cannon, Chanhassen, MN (US); John M. Hedin, Mercer, WI (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/107,531

(22) Filed: Nov. 30, 2020

(65) Prior Publication Data

US 2021/0083726 A1     Mar. 18, 2021

Related U.S. Application Data

(63) Continuation of application No. 16/030,642, filed on Jul. 9, 2018, now Pat. No. 10,855,338, which is a
(Continued)

(51) Int. Cl.
    *H04B 7/024*           (2017.01)
    *H04B 7/26*            (2006.01)
    (Continued)

(52) U.S. Cl.
    CPC ............. *H04B 7/024* (2013.01); *H01Q 1/246* (2013.01); *H03J 7/04* (2013.01); *H04B 7/26* (2013.01);
(Continued)

(58) Field of Classification Search
    CPC .... H04B 7/024; H04B 10/25752; H04B 1/40; H04B 7/26; H04B 10/40; H04B 10/60;
(Continued)

(56) References Cited

U.S. PATENT DOCUMENTS

| 4,183,054 A | 1/1980 | Patisaul et al. |
| 4,451,916 A | 5/1984 | Casper et al. |

(Continued)

FOREIGN PATENT DOCUMENTS

| CA | 2069462 C | 7/1993 |
| CA | 2138763 A1 | 1/1994 |

(Continued)

OTHER PUBLICATIONS

U.S. Patent and Trademark Office, "Supplemental Notice of Allowability", U.S. Appl. No. 14/187,115, dated Mar. 14, 2018, pp. 1-4, Published; US.

(Continued)

*Primary Examiner* — Ajibola A Akinyemi
(74) *Attorney, Agent, or Firm* — Fogg & Powers LLC

(57) ABSTRACT

A network interface for use within a distributed antenna system, the network interface including circuitry configured to: receive a downlink digital communication signal from an external device external to the distributed antenna system, wherein a reference clock is embedded in the downlink digital communication signal; generate a master reference clock for the distributed antenna system using the reference clock embedded in the downlink digital communication signal; convert the downlink digital communication signal into a downlink signal; communicate the downlink signal toward a remote antenna unit within the distributed antenna system; and wherein the distributed antenna system is configured to distribute the master reference clock to various components of the distributed antenna system to keep the
(Continued)

various components of the distributed antenna system locked to a single clock, wherein the various components of the distributed antenna system include the remote antenna unit.

17 Claims, 30 Drawing Sheets

Related U.S. Application Data continuation of application No. 14/187,115, filed on Feb. 21, 2014, now Pat. No. 10,020,850.

(60) Provisional application No. 61/767,968, filed on Feb. 22, 2013.

(51) Int. Cl.
| | | |
|---|---|---|
| *H04W 24/00* | (2009.01) | |
| *H03J 7/04* | (2006.01) | |
| *H04W 16/28* | (2009.01) | |
| *H04W 88/08* | (2009.01) | |
| *H01Q 1/24* | (2006.01) | |
| *H04W 56/00* | (2009.01) | |
| *H04B 1/40* | (2015.01) | |

(52) U.S. Cl.
CPC ........... *H04W 16/28* (2013.01); *H04W 24/00* (2013.01); *H04W 88/08* (2013.01); *H04B 1/40* (2013.01); *H04W 56/00* (2013.01)

(58) Field of Classification Search
CPC .... H04B 10/69; H04B 1/0096; H04B 1/0475; H04B 1/713; H04B 1/7156; H04B 2001/71563; H04B 2201/71338; H04B 2203/5404; H04B 2203/5412; H04B 2203/5416; H04B 3/32; H04B 3/54; H04B 3/542; H01Q 1/246
USPC ........................................................ 455/517
See application file for complete search history.

(56) References Cited

U.S. PATENT DOCUMENTS

| | | |
|---|---|---|
| 4,611,323 A | 9/1986 | Hessenmuller |
| 4,628,501 A | 12/1986 | Loscoe |
| 4,654,843 A | 3/1987 | Roza et al. |
| 4,691,292 A | 9/1987 | Rothweiler |
| 4,999,831 A | 3/1991 | Grace |
| 5,193,109 A | 3/1993 | Chien-Yeh Lee |
| 5,243,598 A | 9/1993 | Lee |
| 5,303,287 A | 4/1994 | Laborde |
| 5,321,736 A | 6/1994 | Beasley |
| 5,321,849 A | 6/1994 | Lemson |
| 5,339,184 A | 8/1994 | Tang |
| 5,377,255 A | 12/1994 | Beasley |
| 5,381,459 A | 1/1995 | Lappington |
| 5,400,391 A | 3/1995 | Emura et al. |
| 5,461,627 A | 10/1995 | Rypinski |
| 5,519,691 A | 5/1996 | Darcie et al. |
| 5,533,011 A | 7/1996 | Dean et al. |
| 5,545,397 A | 8/1996 | Spielvogel et al. |
| 5,566,168 A | 10/1996 | Dent |
| 5,621,786 A | 4/1997 | Fischer et al. |
| 5,627,879 A | 5/1997 | Russell et al. |
| 5,634,191 A | 5/1997 | Beasley |
| 5,642,405 A | 6/1997 | Fischer et al. |
| 5,644,622 A | 7/1997 | Russell et al. |
| 5,657,374 A | 8/1997 | Russell et al. |
| 5,678,177 A | 10/1997 | Beasley |
| 5,682,256 A | 10/1997 | Motley et al. |
| 5,687,195 A | 11/1997 | Hwang et al. |
| 5,732,076 A | 3/1998 | Ketseoglou et al. |
| 5,761,619 A | 6/1998 | Danne et al. |
| 5,765,099 A | 6/1998 | Georges et al. |
| 5,781,541 A | 7/1998 | Schneider |
| 5,781,859 A | 7/1998 | Beasley |
| 5,802,173 A | 9/1998 | Hamilton-Piercy et al. |
| 5,805,983 A | 9/1998 | Naidu et al. |
| 5,809,395 A | 9/1998 | Hamilton-Piercy et al. |
| 5,822,324 A | 10/1998 | Kostresti et al. |
| 5,845,199 A | 12/1998 | Longshore |
| 5,852,651 A | 12/1998 | Fischer et al. |
| 5,867,485 A | 2/1999 | Chambers et al. |
| 5,870,392 A | 2/1999 | Ann |
| 5,890,055 A | 3/1999 | Chu et al. |
| 5,907,544 A | 5/1999 | Rypinski |
| 5,914,963 A | 6/1999 | Basile |
| 5,924,022 A | 7/1999 | Beasley et al. |
| 5,987,014 A | 11/1999 | Magill et al. |
| 6,023,628 A | 2/2000 | Beasley |
| 6,034,950 A | 3/2000 | Sauer et al. |
| 6,108,113 A | 8/2000 | Fee |
| 6,108,550 A | 8/2000 | Wiorek et al. |
| 6,108,626 A | 8/2000 | Cellario et al. |
| 6,157,659 A | 12/2000 | Bird |
| 6,157,810 A | 12/2000 | Georges et al. |
| 6,188,693 B1 | 2/2001 | Murakami |
| 6,222,660 B1 | 4/2001 | Traa |
| 6,226,274 B1 | 5/2001 | Reese et al. |
| 6,230,021 B1 | 5/2001 | Ohdachi |
| 6,246,675 B1 | 6/2001 | Beasley et al. |
| 6,373,887 B1 | 4/2002 | Aiyagari et al. |
| 6,377,640 B2 | 4/2002 | Trans |
| 6,498,936 B1 | 12/2002 | Raith |
| 6,567,473 B1 | 5/2003 | Tzannes |
| 6,667,973 B1 | 12/2003 | Gorshe et al. |
| 6,674,966 B1 | 1/2004 | Koonen |
| 6,704,545 B1 | 3/2004 | Wala |
| 6,729,929 B1 | 5/2004 | Sayers et al. |
| 6,768,745 B1 | 7/2004 | Gorshe et al. |
| 6,785,558 B1 | 8/2004 | Stratford et al. |
| 6,826,163 B2 | 11/2004 | Mani et al. |
| 6,826,164 B2 | 11/2004 | Mani et al. |
| 6,831,901 B2 | 12/2004 | Millar |
| 6,865,390 B2 | 3/2005 | Goss et al. |
| 6,917,614 B1 | 7/2005 | Laubach et al. |
| 6,963,552 B2 | 11/2005 | Sabat, Jr. et al. |
| 7,127,175 B2 | 10/2006 | Mani et al. |
| 7,205,864 B2 | 4/2007 | Schultz, Jr. et al. |
| 7,215,651 B2 | 5/2007 | Millar |
| 7,289,972 B2 | 10/2007 | Rieser et al. |
| 7,313,415 B2 | 12/2007 | Wake et al. |
| 7,474,852 B1 | 1/2009 | Jachetta et al. |
| 7,733,901 B2 | 6/2010 | Salkini et al. |
| 7,761,093 B2 | 7/2010 | Sabat, Jr. et al. |
| 7,787,854 B2 | 8/2010 | Conyers et al. |
| 7,920,858 B2 | 4/2011 | Sabat, Jr. et al. |
| 8,027,270 B1 | 9/2011 | Campana et al. |
| 8,472,579 B2 | 6/2013 | Uyehara et al. |
| 8,837,659 B2 | 9/2014 | Uyehara et al. |
| 10,020,850 B2 | 7/2018 | Wala et al. |
| 10,855,338 B2 | 12/2020 | Wala et al. |
| 2001/0036163 A1 | 11/2001 | Sabat, Jr. et al. |
| 2001/0044292 A1 | 11/2001 | Jeon et al. |
| 2002/0142739 A1 | 10/2002 | Smith |
| 2002/0167954 A1 | 11/2002 | Highsmith et al. |
| 2002/0191565 A1 | 12/2002 | Mani et al. |
| 2003/0015943 A1 | 1/2003 | Kim et al. |
| 2003/0043928 A1 | 3/2003 | Ling et al. |
| 2003/0058814 A1 | 3/2003 | Kim |
| 2003/0203717 A1 | 10/2003 | Chuprun et al. |
| 2004/0010609 A1 | 1/2004 | Vilander et al. |
| 2004/0032354 A1 | 2/2004 | Knobel et al. |
| 2004/0037565 A1 | 2/2004 | Young et al. |
| 2004/0053602 A1 | 3/2004 | Wurzburg |
| 2004/0106387 A1 | 6/2004 | Bauman et al. |
| 2004/0106435 A1 | 6/2004 | Bauman et al. |
| 2004/0132474 A1 | 7/2004 | Wala |
| 2004/0198453 A1 | 10/2004 | Cutrer et al. |
| 2004/0203339 A1 | 10/2004 | Bauman |
| 2004/0203703 A1 | 10/2004 | Fischer |

(56) References Cited

U.S. PATENT DOCUMENTS

| | | |
|---|---|---|
| 2004/0219950 A1 | 11/2004 | Pallonen et al. |
| 2005/0147067 A1 | 7/2005 | Mani et al. |
| 2005/0201323 A1 | 9/2005 | Mani et al. |
| 2005/0250503 A1 | 11/2005 | Cutrer |
| 2006/0026017 A1 | 2/2006 | Walker |
| 2006/0066484 A1 | 3/2006 | Sayers |
| 2006/0094470 A1* | 5/2006 | Wake ............... H04W 88/085 455/562.1 |
| 2006/0121944 A1 | 6/2006 | Buscaglia et al. |
| 2006/0153070 A1 | 7/2006 | DelRegno et al. |
| 2006/0172775 A1 | 8/2006 | Conyers et al. |
| 2006/0193295 A1 | 8/2006 | White et al. |
| 2007/0008939 A1 | 1/2007 | Fischer |
| 2007/0147278 A1 | 6/2007 | Millar |
| 2007/0274279 A1 | 11/2007 | Wood et al. |
| 2008/0181282 A1 | 7/2008 | Wala et al. |
| 2008/0192855 A1 | 8/2008 | Shapira et al. |
| 2008/0240164 A1 | 10/2008 | Zavadsky |
| 2008/0287153 A1 | 11/2008 | Fullam |
| 2009/0061940 A1 | 3/2009 | Scheinert et al. |
| 2009/0067363 A1* | 3/2009 | Ruiz ............... H04W 24/00 370/315 |
| 2009/0180407 A1 | 7/2009 | Sabat et al. |
| 2009/0316608 A1* | 12/2009 | Singh ............... H04B 7/15507 370/280 |
| 2009/0316611 A1 | 12/2009 | Stratford et al. |
| 2010/0046494 A1 | 2/2010 | Palanki et al. |
| 2010/0093391 A1 | 4/2010 | Saban et al. |
| 2010/0135276 A1 | 6/2010 | Hedin et al. |
| 2010/0178936 A1 | 7/2010 | Wala et al. |
| 2010/0215028 A1 | 8/2010 | Fischer |
| 2011/0143649 A1 | 6/2011 | Sabat, Jr. et al. |
| 2011/0243291 A1 | 10/2011 | McAllister et al. |
| 2011/0280209 A1 | 11/2011 | Wegener |
| 2012/0027145 A1 | 2/2012 | Uyehara et al. |
| 2012/0177026 A1 | 7/2012 | Uyehara et al. |
| 2012/0281622 A1 | 11/2012 | Saban et al. |
| 2013/0017863 A1 | 1/2013 | Kummetz et al. |
| 2018/0323831 A1 | 11/2018 | Wala et al. |

FOREIGN PATENT DOCUMENTS

| | | |
|---|---|---|
| CA | 2156046 A1 | 1/1995 |
| CA | 2058736 C | 2/1995 |
| CA | 2125411 C | 5/1995 |
| CA | 2128842 A1 | 1/1996 |
| CA | 2134365 A1 | 4/1996 |
| CA | 2087285 A1 | 6/1996 |
| CA | 2058737 C | 3/1997 |
| CA | 2158386 A1 | 3/1997 |
| CA | 2168681 A1 | 8/1997 |
| CA | 2215079 A1 | 3/1999 |
| CN | 1455993 A | 11/2003 |
| CN | 1719761 A | 1/2006 |
| CN | 1753329 A | 3/2006 |
| CN | 101267251 A | 9/2008 |
| CN | 101351035 A | 1/2009 |
| CN | 102047584 A | 5/2011 |
| EP | 0391597 A2 | 10/1990 |
| EP | 0876073 A2 | 11/1998 |
| EP | 1214809 B1 | 3/2006 |
| GB | 2253770 A | 9/1992 |
| GB | 2289198 A | 11/1995 |
| GB | 2315959 A | 2/1998 |
| GB | 2320653 A | 6/1998 |
| JP | 2000333240 A | 11/2000 |
| JP | 2001197012 A | 7/2001 |
| JP | 2003023396 A | 1/2003 |
| JP | 2004180220 A | 6/2004 |
| JP | 2004194351 A | 7/2004 |
| KR | 1019970055364 A | 12/1999 |
| WO | 9115927 A1 | 10/1991 |
| WO | 9413067 A1 | 6/1994 |
| WO | 9533350 A1 | 12/1995 |
| WO | 9628946 A1 | 9/1996 |
| WO | 9716000 A1 | 5/1997 |
| WO | 9732442 A1 | 9/1997 |
| WO | 9824256 A2 | 6/1998 |
| WO | 9937035 A1 | 7/1999 |
| WO | 0117156 A1 | 3/2001 |
| WO | 0174013 A2 | 10/2001 |
| WO | 0174100 A1 | 10/2001 |
| WO | 0182642 A1 | 11/2001 |
| WO | 03079645 A2 | 9/2003 |
| WO | 2007075579 A2 | 7/2007 |
| WO | 2009138876 A2 | 11/2009 |
| WO | 2009155602 A1 | 12/2009 |

OTHER PUBLICATIONS

U.S. Patent and Trademark Office, "Supplemental Notice of Allowability", U.S. Appl. No. 14/187,115, dated Jun. 13, 2018, pp. 1-6, Published: US.

State Intellectual Property Office, P.R. China, "Second Office Action from CN Application No. 200680029629.2 dated Aug. 10, 2011", from Foreign Counterpart to U.S. Appl. No. 11/150,820, dated Aug. 10, 2011, pp. 1-13, Published: CN.

State Intellectual Property Office, P.R. China, "Second Office Action from CN Application No. 201180036792.2 dated Aug. 28, 2015", from Foreign Counterpart to U.S. Appl. No. 12/845,060, Aug. 28, 2015, pp. 1-22, Published: CN.

State Intellectual Property Office, P.R. China, "Second Office Action from CN Application No. 201210153142.2 dated Oct. 24, 2014", from Foreign Counterpart to U.S. Appl. No. 11/150,820, dated Oct. 24, 2014, pp. 1-7, Published: CN.

State Intellectual Property Office, P.R. China, "Third Office Action from CN Application No. 2006800296292.2 dated Nov. 16, 2011", from Foreign Counterpart to U.S. Appl. No. 11/150,820, dated Nov. 16, 2011, pp. 1-7, Published: CN.

U.S. Patent and Trademark Office, "Advisory Action", U.S. Appl. No. 11/150,820, dated Apr. 30, 2014, pp. 1-3, Published: US.

U.S. Patent and Trademark Office, "Advisory Action", U.S. Appl. No. 14/187,115, dated Sep. 29, 2016, pp. 1-8, Published: US.

U.S. Patent and Trademark Office, "Advisory Action", U.S. Appl. No. 14/187,115, dated Nov. 3, 2017, pp. 1-7, Published: US.

U.S. Patent and Trademark Office, "Advisory Action", U.S. Appl. No. 16/030,642, dated Apr. 2, 2020, pp. 1 through 12, Published: US.

U.S. Patent and Trademark Office, "Corrected Notice of Allowability", U.S. Appl. No. 12/845,060, dated Mar. 28, 2013, pp. 1-25, Published: US.

U.S. Patent and Trademark Office, "Decision on Appeal", U.S. Appl. No. 11/150,820, dated Jul. 6, 2016, pp. 1-10, Published: US.

U.S. Patent and Trademark Office, "Decision on Appeal", Application No. 11/19/12, pp. 1-6, Published: US.

U.S. Patent and Trademark Office, "Decision on Appeal", U.S. Appl. No. 12/775,897, dated Sep. 2, 2015, pp. 1-12, Published: US.

U.S. Patent and Trademark Office, "Examiner's Answer", U.S. Appl. No. 11/150,820, dated Nov. 4, 2014, pp. 1-31, Published: US.

U.S. Patent and Trademark Office, "Examiner's Answer", U.S. Appl. No. 11/150,820, dated Nov. 17, 2009, pp. 1-24, Published: US.

U.S. Patent and Trademark Office, "Examiner's Answer", U.S. Appl. No. 12/775,897, dated Jan. 4, 2013, pp. 1-30, Published: US.

U.S. Patent and Trademark Office, "Final Office Action", U.S. Appl. No. 11/150,820, dated Feb. 6, 2014, pp. 1-20, Published: US.

U.S. Patent and Trademark Office, "Final Office Action", U.S. Appl. No. 11/150,820, dated Sep. 27, 2007, pp. 1-25, Published: US.

U.S. Patent and Trademark Office, "Final Office Action", U.S. Appl. No. 11/150,820, dated Dec. 29, 2008, pp. 1-27, Published: US.

U.S. Patent and Trademark Office, "Final Office Action", U.S. Appl. No. 12/775,897, dated May 7, 2012, pp. 1-26, Published: US.

U.S. Patent and Trademark Office, "Final Office Action", U.S. Appl. No. 14/187,115, dated Jul. 15, 2016, pp. 1-31, Published: US.

U.S. Patent and Trademark Office, "Final Office Action", U.S. Appl. No. 14/187,115, dated Aug. 10, 2017, pp. 1-26, Published: US.

(56) References Cited

OTHER PUBLICATIONS

U.S. Patent and Trademark Office, "Final Office Action", U.S. Appl. No. 16/030,642, dated Jan. 7, 2020, pp. 1 through 48, Published: US.
U.S. Patent and Trademark Office, "Interview Summary", U.S. Appl. No. 14/187,115, dated May 8, 2017, pp. 1-3, Published: US.
U.S. Patent and Trademark Office, "Interview Summary", U.S. Appl. No. 14/187,115, dated Oct. 21, 2016, pp. 1-3, Published: US.
U.S. Patent and Trademark Office, "Notice of Allowance", "from U.S. Appl. No. 13/914,838", dated May 15, 2014, pp. 1-16, Published in: US.
U.S. Patent and Trademark Office, "Notice of Allowance", "U.S. Appl. No. 12/845,060", dated Mar. 4, 2013, pp. 1-10.
U.S. Patent and Trademark Office, "Notice of Allowance", U.S. Appl. No. 14/187,115, dated Feb. 27, 2018, pp. 1-14, Published: US.
U.S. Patent and Trademark Office, "Notice of Allowance", U.S. Appl. No. 15/268,453, dated Sep. 10, 2018, pp. 1-21, Published: US.
U.S. Patent and Trademark Office, "Notice of Allowance", U.S. Appl. No. 15/268,453, dated Apr. 12, 2018, pp. 1-74, Published in: US.
U.S. Patent and Trademark Office, "Notice of Allowance", U.S. Appl. No. 16/030,642, dated Jul. 14, 2020, pp. 1 through 20, Published: US.
U.S. Patent and Trademark Office, "Office Action", "from U.S. Appl. No. 13/914,838", dated Nov. 20, 2013, pp. 1-47, Published in: US.
U.S. Patent and Trademark Office, "Office Action", "U.S. Appl. No. 12/845,060", dated Oct. 2, 2012, pp. 1-28.
U.S. Patent and Trademark Office, "Office Action", U.S. Appl. No. 11/150,820, dated Mar. 16, 2007, pp. 1-21, Published: US.
U.S. Patent and Trademark Office, "Office Action", U.S. Appl. No. 11/150,820, dated Mar. 24, 2008, pp. 1-17, Published: US.
U.S. Patent and Trademark Office, "Office Action", U.S. Appl. No. 11/150,820, dated Sep. 6, 2013, pp. 1-31, Published: US.
U.S. Patent and Trademark Office, "Office Action", U.S. Appl. No. 12/775,897, dated Dec. 28, 2011, pp. 1-29, Published: US.
U.S. Patent and Trademark Office, "Office Action", U.S. Appl. No. 12/913,179, dated Mar. 18, 2013, pp. 1-49, Published: US.
U.S. Patent and Trademark Office, "Office Action", U.S. Appl. No. 14/187,115, dated Nov. 18, 2015, pp. 1-46, Published: US.
U.S. Patent and Trademark Office, "Office Action", U.S. Appl. No. 14/187,115, dated Dec. 30, 2016, pp. 1-25, Published: US.
U.S. Patent and Trademark Office, "Office Action", U.S. Appl. No. 15/268,453, dated Aug. 22, 2019, pp. 1-22, Published: US.
U.S. Patent and Trademark Office, "Office Action", U.S. Appl. No. 16/030,642, dated Jun. 4, 2019, pp. 1-17, Published: US.
U.S. Patent and Trademark Office, "Office Action", U.S. Appl. No. 16/277,816, dated Aug. 23, 2019, pp. 1-11, Published: US.
U.S. Patent and Trademark Office, "Pre-Appeal Brief Decision", U.S. Appl. No. 11/150,820, dated Jun. 19, 2014, pp. 1-2, Published: US.
U.S. Patent and Trademark Office, "Pre-Appeal Brief Decision", U.S. Appl. No. 12/775,897, dated Sep. 18, 2012, pp. 1-2, Published: US.
U.S. Patent and Trademark Office, "Pre-Appeal Brief Decision", U.S. Appl. No. 16/030,642, dated May 22, 2020, pp. 1 through 2, Published: US.
U.S. Patent and Trademark Office, "Notice of Allowance", U.S. Appl. No. 15/268,453, dated Jun. 25, 2020, pp. 1-63, Published: US.
U.S. Patent and Trademark Office, "Notice of Allowance", U.S. Appl. No. 16/277,816, dated Jun. 26, 2020, pp. 1-64, Published: US.
"DigivanceTM, Indoor Coverage Solution", "www.adc.com", 2001, pp. 1-8, Publisher: ADC.
"Flexwave Spectrum One Solution for Your Wireless Services", at least as early as Dec. 12, 2014, pp. 1 through 8, TE Connectivity Ltd.
"InterReach Spectrum", at least as early as Sep. 12, 2011, pp. 1 through 12, GraybaR, TE Connectivity Ltd.

"Tektronix Synchronous Optical Network (SONET)", "http://www.iec.org/online/tutorials/sonet/topic03.html", Aug. 28, 2002, pp. 1-5, Publisher: International Engineering Consortium.
Andrew Wireless Solutions, "ION Series IONTM—B Series", at least as early as Feb. 26, 2008, pp. 1 through 4, CommScope.
Canadian Intellectual Property Office, "Office Action from CA Application No. 2914104", from Foreign Counterpart to U.S. Appl. No. 14/187,115, filed Jan. 15, 2020, pp. 1-6, Published: CA.
China National Intellectual Property Administration, "Second Office Action from CN Application No. 201480022991.1", Foreign Counterpart to U.S. Appl. No. 14/187,115, dated Sep. 4, 2018, pp. 1-8, Published: CN.
European Patent Office, "Communication of a notice of opposition from European Application No. 11813094.7", from Foreign Counterpart to U.S. Appl. No. 12/845,060, dated Sep. 28, 2015, pp. 1-54, Published: EP.
European Patent Office, "Communication of notices of opposition from EP Application No. 11813094.7", from Foreign Counterpart to U.S. Appl. No. 12/845,060, dated Oct. 22, 2015, p. 1, Published: EP.
European Patent Office, "Communication pursuant to Article 94(3) from EP Application No. 06772594.5", from Foreign Counterpart to U.S. Appl. No. 11/150,820, dated Oct. 5, 2009, pp. 1-3, Published: EP.
European Patent Office, "Communication pursuant to Article 94(3) from EP Application No. 06772594.5", from Foreign Counterpart to U.S. Appl. No. 11/150,820, dated Nov. 12, 2010, pp. 1-5, Published: EP.
European Patent Office, "Communication pursuant to Article 94(3) from EP Application No. 06772594.5", from Foreign Counterpart to U.S. Appl. No. 11/150,820, dated Nov. 3, 2011, pp. 1-3, Publication: EP.
European Patent Office, "Communication pursuant to Article 94(3) from EP Application No. 06772594.5", from Foreign Counterpart to U.S. Appl. No. 11/150,820, dated Apr. 14, 2008, pp. 1-7, Published: EP.
European Patent Office, "Communication pursuant to Article 94(3) from EP Application No. 14003681.5", from Foreign Counterpart to U.S. Appl. No. 12/845,060, dated Mar. 9, 2016, pp. 1-6, Published: EP.
State Intellectual Property Office, P.R. China, "First Office Action from CN Application No. 201480022991.1 dated Nov. 6, 2017", from Foreign Counterpart to PCT Application No. PCT/US2014/017643, dated Nov. 6, 2017, pp. 1-27, Published: CN.
State Intellectual Property Office, P.R. China, "First Office Action from CN Application No. 201210153142.2" from Foreign Counterpart to U.S. Appl. No. 11/150,820, dated Feb. 25, 2014, pp. 1-31, Published: CN.
European Patent Office, "Decision Revoking the Patent from EP Application No. 11813094.7", "from Foreign Counterpart of U.S. Appl. No. 12/845,060", dated Dec. 8, 2017, pp. 1-17, Published in: EP.
European Patent Office, "Decision to refuse a European Patent application from EP Application No. 14003681.5 dated Jan. 25, 2019", from Foreign Counterpart to U.S. Appl. No. 12/845,060, pp. 1-28, Published: EP.
European Patent Office, "Extended European Search Report from EP Application No. 11813094.7", from Foreign Counterpart to U.S. Appl. No. 12/845,060, dated Aug. 14, 2013, pp. 1-6, Published: EP.
European Patent Office, "Extended European Search Report from EP Application No. 14003681.5", from Foreign Counterpart to U.S. Appl. No. 12/845,060, dated Apr. 7, 2005, pp. 1-4, Published: EP.
European Patent Office, "Extended European Search Report from EP Application No. 14754576.8", Foreign Counterpart to U.S. Appl. No. 14/187,115, dated Sep. 21, 2016, pp. 1-7, Published: EP.
European Patent Office, "Extended European Search Report from EP Application No. 18211421.5 dated Feb. 12, 2019", from Foreign Counterpart to U.S. Appl. No. 14/187,115, pp. 1-8, Published: EP.
European Patent Office, "Minutes of EP Oral Proceedings from EP Application No. 11813094.7", "from Foreign Counterpart of U.S. Appl. No. 12/845,060", dated Dec. 8, 2017, pp. 1-6, Published in: EP.

(56) References Cited

OTHER PUBLICATIONS

European Patent Office, "Result of consultation from EP Application No. 11813094.7", from Foreign Counterpart to U.S. Appl. No. 12/845,060, dated Sep. 11, 2017, pp. 1-4, Published: EP.
European Patent Office, "Summons to attend oral proceedings pursuant to Rule 115(1) from EP Application No. 11813094.7", from Foreign Counterpart to U.S. Appl. No. 12/845,060, dated Jan. 11, 2017, pp. 1-20, Published: EP.
European Patent Office, "Summons to Oral Proceedings in Examination Procedure for EP Application No. 14003681.5", "Foreign Counterpart to U.S. Appl. No. 12/845,060", dated Jan. 24, 2018, pp. 1-11, Published in: E.P.
Grace, Martin K., "Synchronous Quantized Subcarrier Multiplexing for Transport of Video, Voice and Data", "IEEE Journal on Selected Areas in Communications", Sep. 1990, pp. 1351-1358, vol. 8, No. 7, Publisher: IEEE.
Harvey et al., "Cordless Communications Utilising Radio Over Fibre Techniques for the Local Loop", "IEEE International Conference on Communications", Jun. 1991, pp. 1171-1175, Publisher: IEEE.
International Bureau, "Notification Concerning Transmittal of International Preliminary Report on Patentability from PCT Application No. PCT/US2006/022342", from Foreign Counterpart to U.S. Appl. No. 11/150,820, dated Dec. 27, 2007, pp. 1-9, Published: Switzerland.
International Bureau, "Notification Concerning Transmittal of International Preliminary Report on Patentability from PCT Application No. PCT/US2011/045495", from Foreign Counterpart to U.S. Appl. No. 12/845,060, dated Feb. 7, 2013, pp. 1-6, Published: Switzerland.
International Bureau, "Notification Concerning Transmittal of International Preliminary Report on Patentability from PCT Application No. PCT/US2014/017643", from Foreign Counterpart to U.S. Appl. No. 12/845,060, dated Sep. 3, 2015, pp. 1-13, Published: Switzerland.
International Bureau, "Notification Concerning Transmittal of the International Report on Patentability from PCT Application No. PCT/US2011/057575", from Foreign Counterpart to U.S. Appl. No. 12/913,179, dated May 10, 2013, pp. 1-7, Published: Switzerland.
International Searching Authority, "Notification of Transmittal of the International Search Report and the Written Opinion of the International Searching Authority from PCT Application No. PCT/US2006/022342", from Foreign Counterpart to U.S. Appl. No. 11/150,820, dated Nov. 7, 2006, pp. 1-13, Published: WO.
International Searching Authority, "Notification of Transmittal of the International Search Report and the Written Opinion of the International Searching Authority from PCT Application No. PCT/US2011/045495", from Foreign Counterpart to U.S. Appl. No. 12/845,060, dated Feb. 17, 2012, pp. 1-9, Published: WO.
International Searching Authority, "Notification of Transmittal of the International Search Report and the Written Opinion of the International Searching Authority from PCT Application No. PCT/US2014/017643", from Foreign Counterpart to U.S. Appl. No. 12/845,060, dated Jun. 2, 2014, pp. 1-16, Published: WO.

Japanese Patent Office, "Final Office Action from JP Application No. 2008515931", from Foreign Counterpart to U.S. Appl. No. 11/150,820, dated Feb. 28, 2012, pp. 1-8, Published: JP.
Japanese Patent Office, "Office Action from JP Application No. 2008515931", from Foreign Counterpart to U.S. Appl. No. 11/150,820, dated Nov. 1, 2011, pp. 1-10, Published: JP.
State Intellectual Property Office, P.R. China, "First Office Action from CN Application No. 201180036792.2", from Foreign Counterpart to U.S. Appl. No. 12/845,060, dated Mar. 3, 2015, pp. 1-25, Published: CN.
Korean Intellectual Property Office, "Notice to File Response from KR Application No. 10-2015-7024364", from Foreign Counterpart to U.S. Appl. No. 14/187,115, filed Feb. 17, 2020, pp. 1 through 23, Published: KR.
Korean Intellectual Property Office, "Office Action from KR Application No. 2007-7030470", from Foreign Counterpart to U.S. Appl. No. 11/150,820, dated Sep. 17, 2012, pp. 1-5, Published: KR.
Spectracom, "White Paper: A Master Clock Approach to Distributing Precision Time and Frequency", "https://spectracom.com/sites/default/files/document-files/Time_and_Frequency_Distribution_WP11-101_A.pdf", Jan. 31, 2014, pp. 1-5, Publisher: Spectracom.
State Intellectual Property Office, P.R. China, "First Office Action for CN Application No. 20160144515.8", from Foreign Counterpart of U.S. Appl. No. 14/187,115, dated Oct. 10, 2017, pp. 1-11, Published in: CN.
State Intellectual Property Office, P.R. China, "First Office Action from CN Application No. 200680029629.2", from Foreign Counterpart to U.S. Appl. No. 11/150,820, dated Oct. 9, 2010, pp. 1-33, Published: CN.
Canadian Intellectual Property Office, "Office Action from CA Application No. 2,914,104", from Foreign Counterpart to U.S. Appl. No. 14/187,115, filed Oct. 8, 2020, pp. 1 through 3, Published: CA.
Canadian Intellectual Property Office, "Office Action from CA Application No. 2,914,104", from Foreign Counterpart to U.S. Appl. No. 14/187,115, dated Aug. 4, 2021, pp. 1 through 3, Published: CA.
European Patent Office, "Extended European Search Report from EP Application No. 21157864.6", from Foreign Counterpart to U.S. Appl. No. 14/187,115, filed Apr. 22, 2021, pp. 1 through 6, Published: EP.
Canadian Intellectual Property Office, "Office Action from CA Application No. 2803013", from Foreign Counterpart to U.S. Appl. No. 12/845,060, dated Jun. 1, 2017, pp. 1-4, Published: CA.
International Searching Authority, "Notification of Transmittal of the International Search Report and the Written Opinion of the International Searching Authority from PCT Application No. PCT/US2011/057575", from Foreign Counterpart to U.S. Appl. No. 12/913,179, dated Feb. 17, 2012, pp. 1-10, Published: WO.
U.S. Patent and Trademark Office, "Final Office Action", U.S. Appl. No. 15/268,453, dated Jan. 30, 2020, pp. 1-16, Published: US.
U.S. Patent and Trademark Office, "Final Office Action", U.S. Appl. No. 16/277,816, dated Jan. 30, 2020, pp. 1-58, Published: US.
China National Intellectual Property Administration, "The First Office Action from CN Application No. 14187115.1 dated Dec. 15, 2021", from Foreign Counterpart to U.S. Appl. No. 14/187,115, pp. 1 through 15, Published: CN.

* cited by examiner

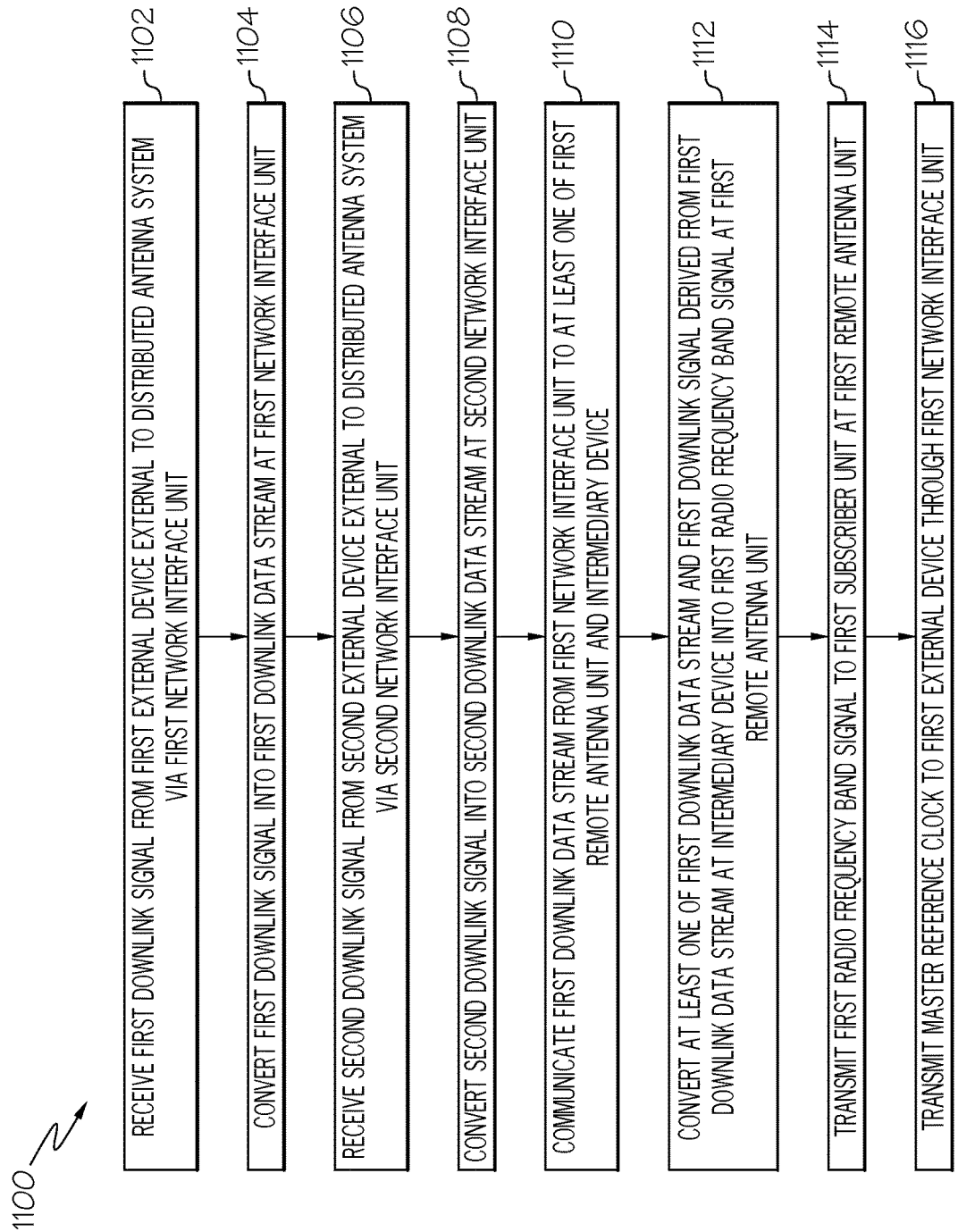

MASTER REFERENCE FOR BASE STATION NETWORK INTERFACE SOURCED FROM DISTRIBUTED ANTENNA SYSTEM

CROSS-REFERENCE TO RELATED APPLICATIONS

This application is a continuation application of U.S. patent application Ser. No. 16/030,642 entitled "MASTER REFERENCE FOR BASE STATION NETWORK INTERFACE SOURCED FROM DISTRIBUTED ANTENNA SYSTEM" and filed on Jul. 9, 2018 which is a continuation application of U.S. patent application Ser. No. 14/187,115 entitled "MASTER REFERENCE FOR BASE STATION NETWORK INTERFACE SOURCED FROM DISTRIBUTED ANTENNA SYSTEM" and filed on Feb. 21, 2014 which claims the benefit of U.S. Provisional Patent Application Ser. No. 61/767,968 filed on Feb. 22, 2013, all of which are hereby incorporated herein by reference.

This application is related to the following co-pending United States patent application, which is hereby incorporated herein by reference:

U.S. patent application Ser. No. 12/845,060 entitled "DISTRIBUTED DIGITAL REFERENCE CLOCK" filed on Jul. 28, 2010 and which is referred to herein as the '060 Application.

BACKGROUND

Distributed Antenna Systems (DAS) are used to distribute wireless signal coverage into building or other substantially closed environments. For example, a DAS may distribute antennas within a building. The antennas are typically connected to a radio frequency (RF) signal source, such as a service provider. Various methods of transporting the RF signal from the RF signal source to the antenna have been implemented in the art.

SUMMARY

A distributed antenna system includes a first base station network interface unit configured to receive first downlink signals from a first external device external to the distributed antenna system and to convert the first downlink signals into a first downlink data stream; a second base station network interface unit configured to receive second downlink signals from a second external device external to the distributed antenna system and to convert the second downlink signals into a second downlink data stream; and a first remote antenna unit communicatively coupled to the first base station network interface unit and configured to receive at least one of the first downlink data stream from the first base station network interface unit and a first downlink signal derived from the first downlink data stream. The first remote antenna unit has a first radio frequency converter configured to convert at least one of the first downlink data stream and the first downlink signal derived from the first downlink data stream into a first radio frequency band signal and a first radio frequency antenna configured to transmit the first radio frequency band signal to a first subscriber unit. The distributed antenna system is configured to transmit a master reference clock to the first external device.

DRAWINGS

Understanding that the drawings depict only exemplary embodiments and are not therefore to be considered limiting in scope, the exemplary embodiments will be described with additional specificity and detail through the use of the accompanying drawings, in which:

FIGS. 2A-2J are block diagrams of exemplary embodiments of base station network interfaces used in distributed antenna systems, such as the exemplary distributed antenna systems in FIGS. 1A-1E;

Figure 9:
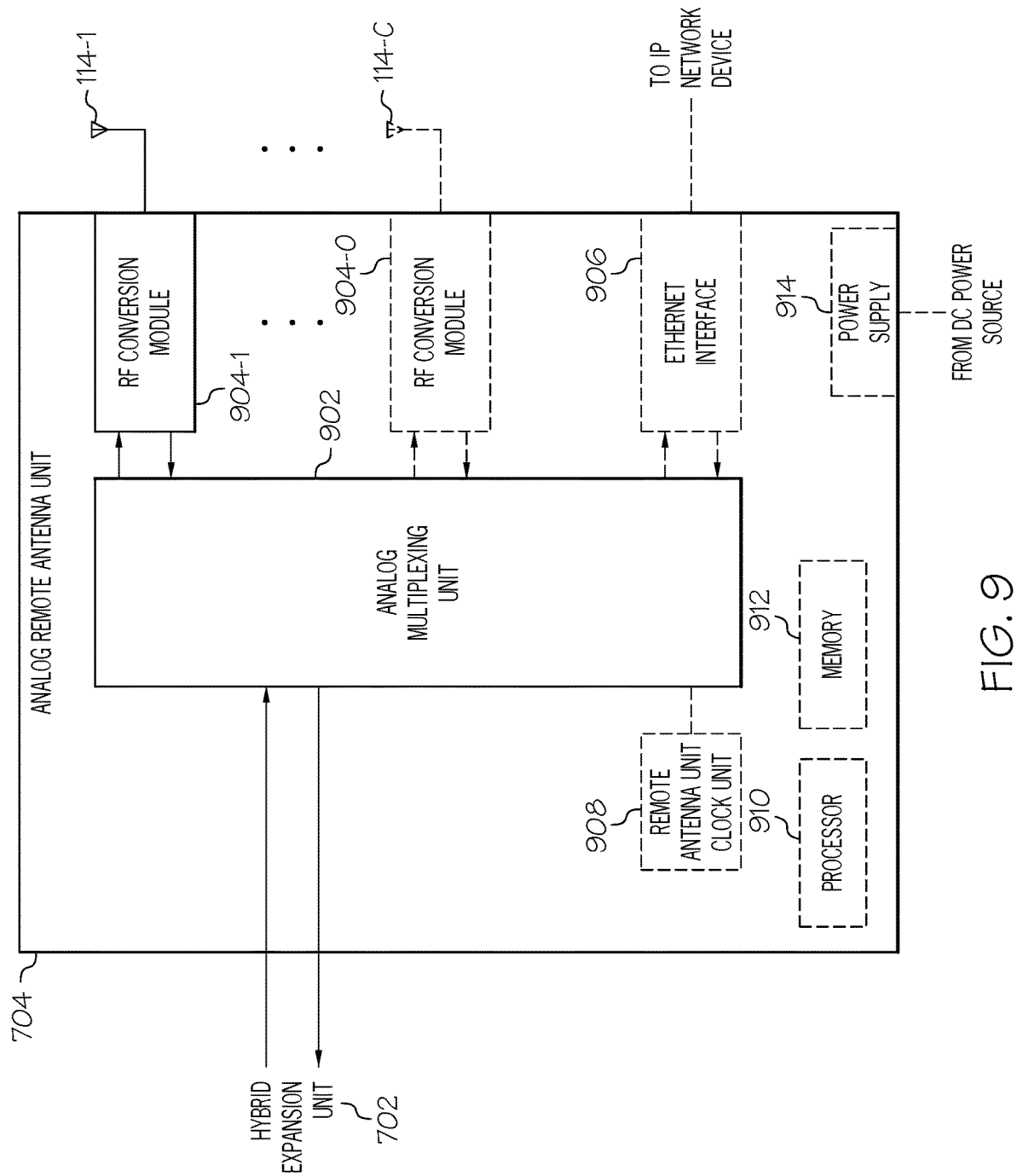
FIG. 9 is a block diagram of an exemplary embodiment of a remote antenna unit used in hybrid or analog distributed antenna systems, such as the exemplary hybrid distributed antenna system in FIG. 7.
Figure 10A:
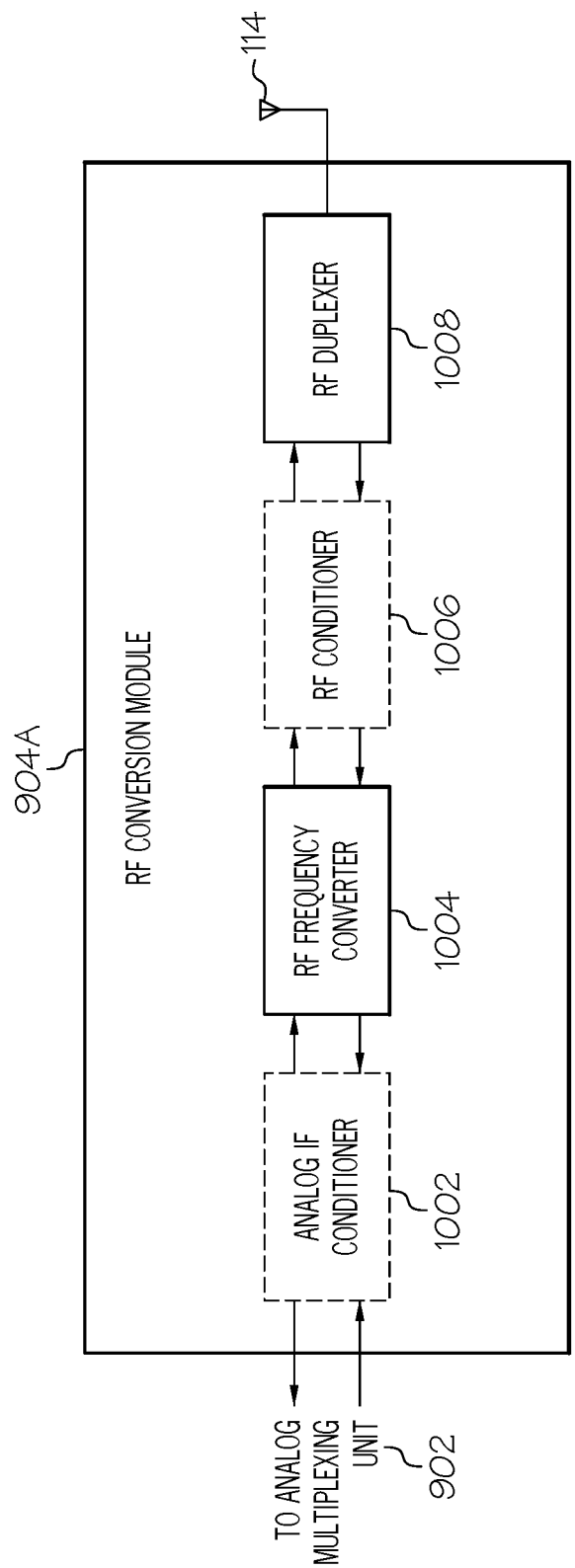
Figure 10B:
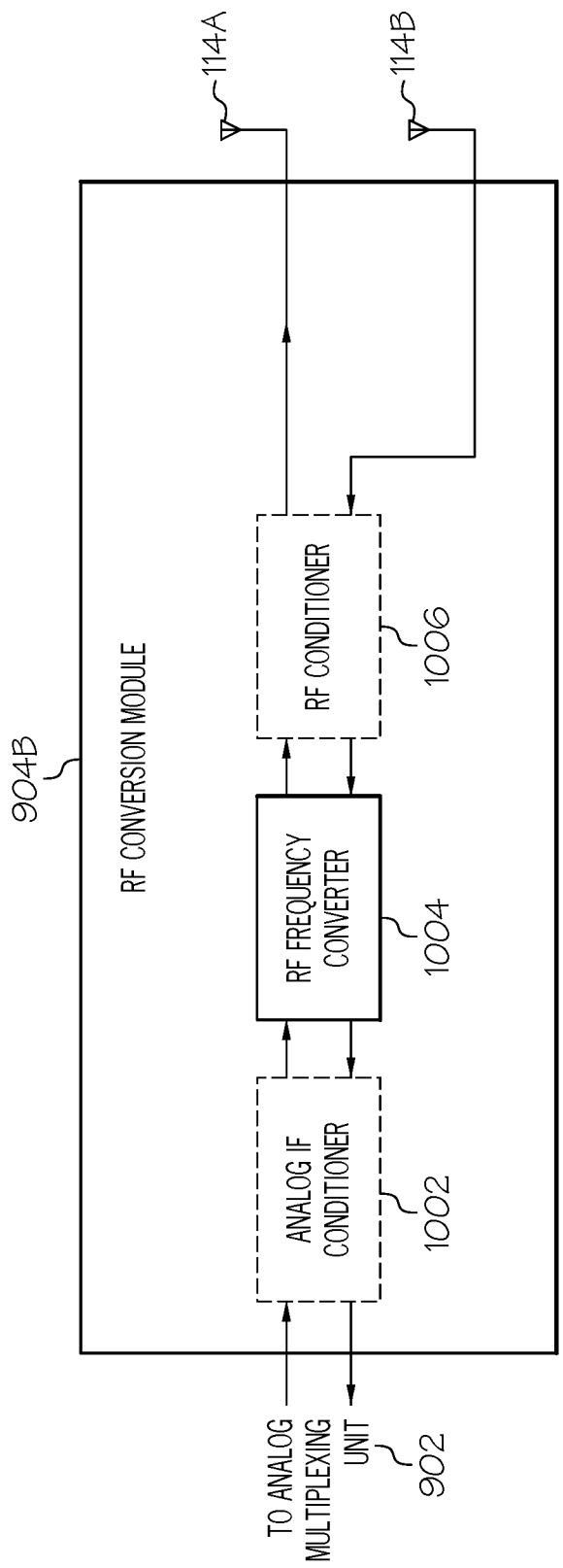
Figure 10C:
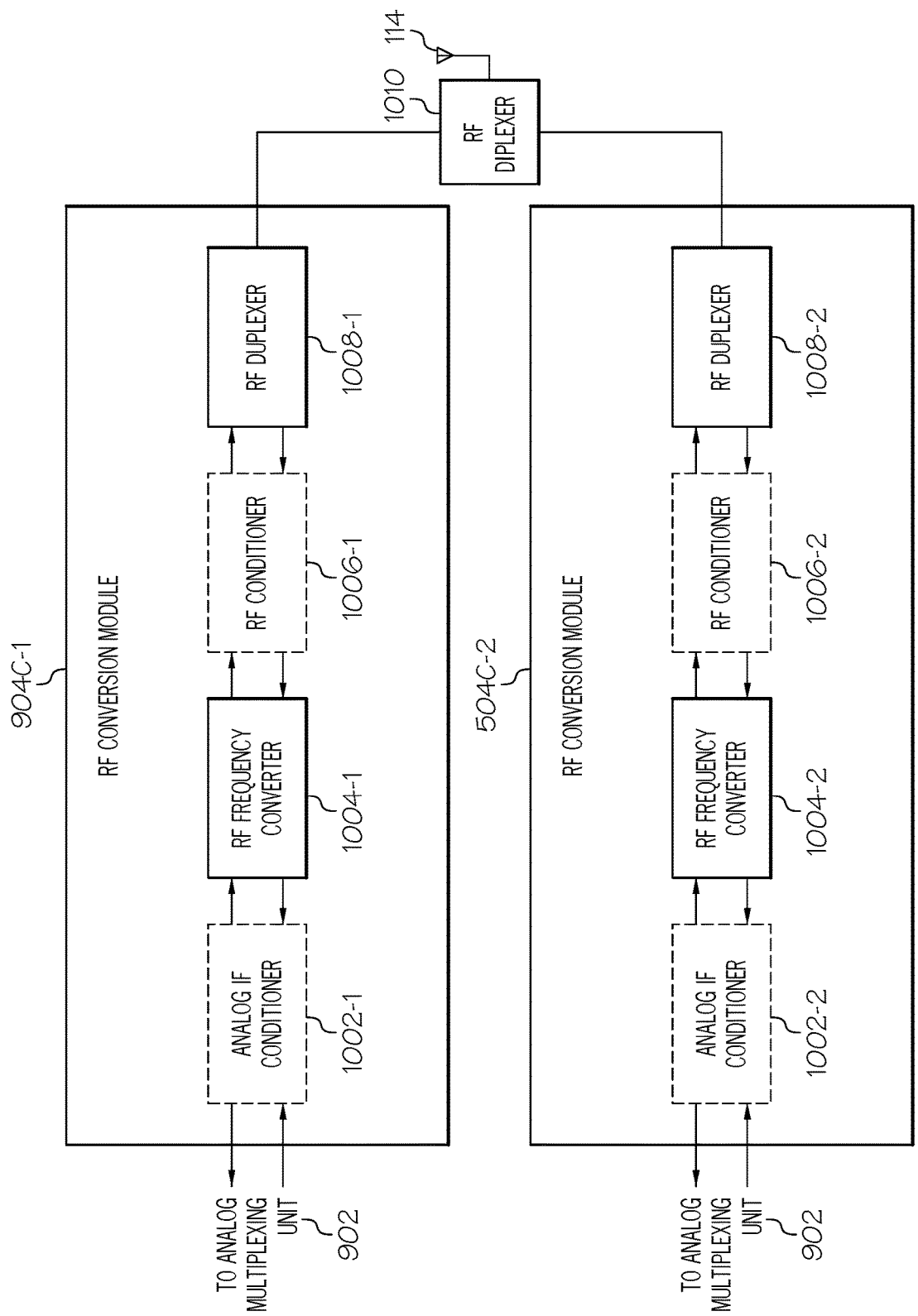

FIGS. 10A-10C are block diagrams of exemplary embodiments of RF conversion modules used in hybrid or analog remote antenna units of hybrid or analog distributed antenna systems, such as the exemplary remote antenna unit in FIG. 9; and FIG. 11 is a flow diagram illustrating one exemplary embodiment of a method of sourcing a master reference clock for a base station network interface from a distributed antenna system.

In accordance with common practice, the various described features are not drawn to scale but are drawn to emphasize specific features relevant to the exemplary embodiments. Like reference numbers and designations in the various drawings indicate like elements.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

The embodiments described below describe a distributed antenna system and components within the distributed antenna system. The distributed antenna system is connected to a plurality of external devices through a plurality of base station network interface units. In exemplary embodiments, at least one base station network interface unit of the distributed antenna system provides a master reference clock to at least one of the external devices. In exemplary embodiments, the master reference clock is generated within the distributed antenna system. In exemplary embodiments, the master reference clock is derived from another external device through another base station network interface unit.

FIGS. 1A-1E are block diagrams of exemplary embodiments of distributed antenna systems 100. Each of FIGS. 1A-1E illustrates a different embodiment of a distributed antenna system 100, labeled 100A-100E respectively.

Figure 1A:
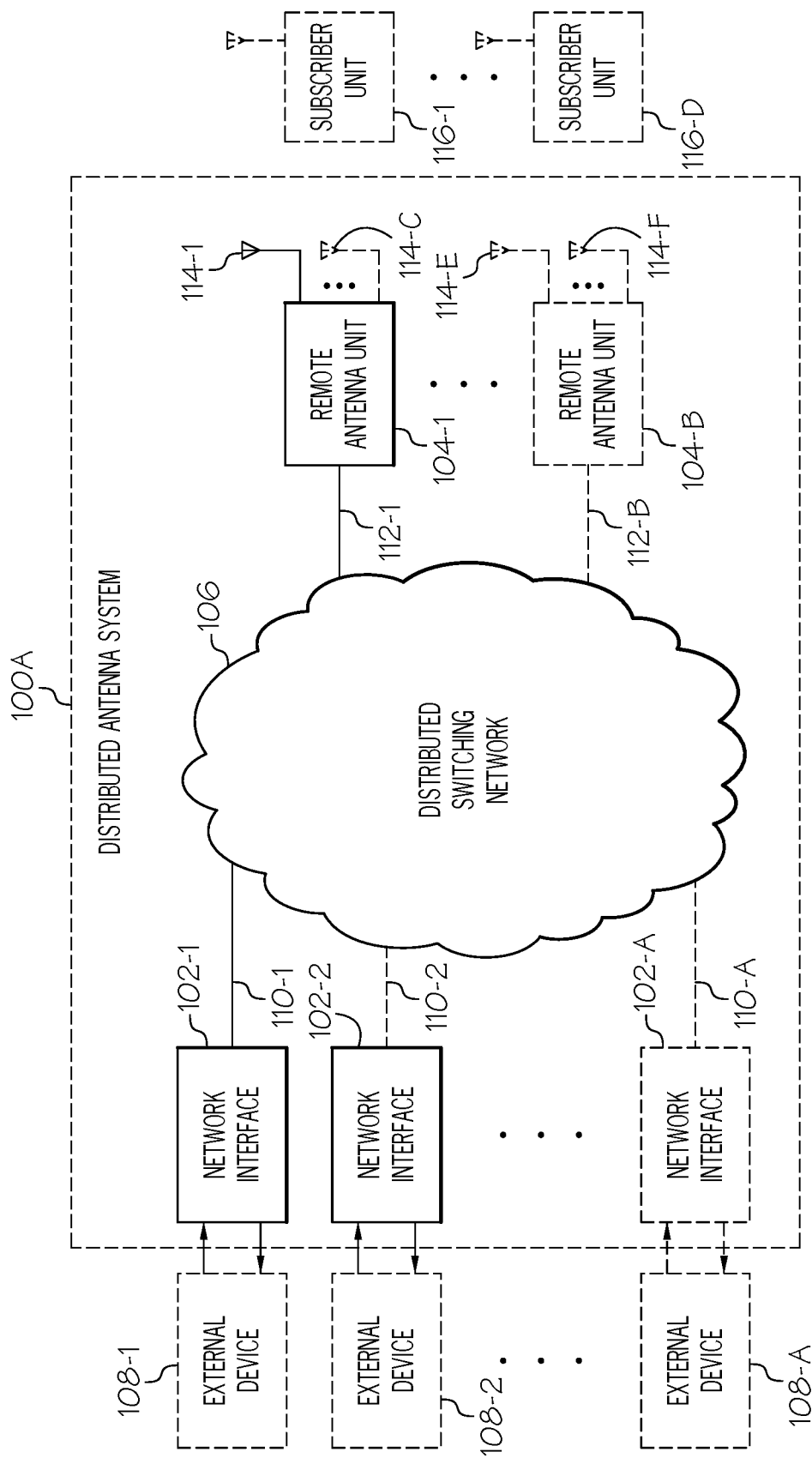
FIGS. 1A-1E are block diagrams of exemplary embodiments of distributed antenna systems.

FIG. 1A is a block diagram of an exemplary embodiment of a distributed antenna system 100, distributed antenna system 100A. Distributed antenna system 100A includes a plurality of network interfaces 102 (including network interface 102-1, network interface 102-2, and any amount of optional network interfaces 102 through optional network interface 102-A), at least one remote antenna unit 104 (including remote antenna unit 104-1 and any amount of optional remote antenna units 104 through optional remote antenna unit 104-B), and a distributed switching network 106.

Each network interface 102 is communicatively coupled to an external device 108 that is configured to provide signals to be transported through the distributed antenna system 100A to the network interface 102. In the forward path, each network interface 102 is configured to receive signals from at least one external device 108. Specifically, network interface 102-1 is communicatively coupled to external device 108-1, network interface 102-2 is communicatively coupled to external device 108-2, and optional network interface 102-A is communicatively coupled to optional external device 108-A. Each network interface 102 is also communicatively coupled to the distributed switching network 106 across a digital communication link 110. Specifically, network interface 102-1 is communicatively coupled to the distributed switching network 106 across digital communication link 110-1, network interface 102-2 is communicatively coupled to the distributed switching network 106 across digital communication link 110-2, and optional network interface 102-A is communicatively coupled to the distributed switching network 106 across digital communication link 110-A. As described in more detail below, each network interface 102 is configured to convert signals from the external device 108 to which it is communicatively coupled into a downlink data stream and further configured to communicate the downlink data stream to the distributed switching network 106 (either directly or through other components of the distributed antenna system 100) across a respective digital communication link 110.

Similarly in the reverse path, in exemplary embodiments each network interface 102 is configured to receive uplink data streams across a respective digital communication link 110 from distributed switching network 106. Each network interface 102 is further configured to convert the received uplink data stream to signals formatted for the associated external device 108 and further configured to communicate the signals formatted for the associated external device 108 to the associated external device 108.

Distributed switching network 106 couples the plurality of network interfaces 102 with the at least one remote antenna unit 104. Distributed switching network 106 may include one or more distributed antenna switches or other components that functionally distribute downlink signals from the network interfaces 102 to the at least one remote antenna unit 104. Distributed switching network 106 also functionally distributes uplink signals from the at least one remote antenna unit 104 to the network interfaces 102. In exemplary embodiments, the distributed switching network 106 can be controlled by a separate controller or another component of the system. In exemplary embodiments the switching elements of the distributed switching network 106 are controlled either manually or automatically. In exemplary embodiments, the routes can be pre-determined and static. In other exemplary embodiments, the routes can dynamically change based on time of day, load, or other factors.

Each remote antenna unit 104 is communicatively coupled to the distributed switching network 106 across a digital communication link 112. Specifically, remote antenna unit 104-1 is communicatively coupled to the distributed switching network 106 across digital communication link 112-1 and optional remote antenna unit 104-B is communicatively coupled to the distributed switching network 106 across digital communication link 112-B. Each remote antenna unit 104 includes components configured for extracting at least one downlink data stream from an aggregate downlink data stream and components configured for aggregating at least one uplink data stream into an aggregate uplink data stream as well as at least one radio frequency converter configured to convert between at least one data stream and at least one radio frequency band and at least one radio frequency antenna 114 configured to transmit and receive signals in the at least one radio frequency band to at least one subscriber unit 116.

In the downstream, each remote antenna unit 104 is configured to extract at least one downlink data stream from the downlink aggregate data stream. Each remote antenna unit 104 is further configured to convert the at least one downlink data stream into a downlink radio frequency (RF) signal in a radio frequency band. In exemplary embodiments, this may include digital to analog converters and oscillators. Each remote antenna unit 104 is further configured to transmit the downlink radio frequency signal in the radio frequency band to at least one subscriber unit using at least one radio frequency antenna 114. In a specific exemplary embodiment, remote antenna unit 104-1 is configured to extract at least one downlink data stream from the downlink aggregate data stream received from the distributed antenna switch 102 and further configured to convert the at least one downlink data stream into a downlink radio frequency signal in a radio frequency band. Remote antenna unit 104-1 is further configured to transmit the downlink radio frequency signal in a radio frequency band using a radio frequency band antenna 114-1 to at least one subscriber unit 116-1. In exemplary embodiments, remote antenna unit 104-1 is configured to extract a plurality of downlink data streams from the downlink aggregate data stream received from the distributed switching network 106 and configured to convert the plurality of downlink data streams to a plurality of downlink radio frequency signals. In exemplary embodiments with a plurality of radio frequency signals, the remote antenna unit 104-1 is further configured to transmit the downlink radio frequency signal in at least one radio frequency band to at least subscriber unit 116-1 using at least radio frequency antenna 114-1. In exemplary embodiments, the remote antenna unit 104-1 is configured to transmit one downlink radio frequency signal to one subscriber unit 116-1 using an antenna 114-1 and another radio frequency signal to another subscriber unit 116-D using another antenna 114-C. In exemplary embodiments, other combinations of radio frequency antennas 114 and other components are used to communicate other combinations of radio frequency signals in other various radio frequency bands to various subscriber units 116.

Similarly in the reverse path, in exemplary embodiments each remote antenna unit 104 is configured to receive uplink radio frequency signals from at least one subscriber unit 116 using at least one radio frequency antenna 114. Each remote antenna unit 104 is further configured to convert the radio frequency signals to at least one uplink data stream. Each remote antenna unit 104 is further configured to aggregate the at least one uplink data stream into an aggregate uplink data stream and further configured to communicate the aggregate uplink data stream across at least one digital communication link 112 to the distributed switching network 106.

In exemplary embodiments, a master reference clock is distributed between the various components of the distributed antenna system 100A to keep the various components locked to the same clock. In exemplary embodiments, a master reference clock is provided to at least one external device 108 via at least one network interface 102 so that the external device can lock to the master reference clock as well. In other exemplary embodiments, the master reference clock is provided from at least one external device to the distributed antenna system 100A via at least one network interface 102. In exemplary embodiments, the master reference clock is generated within a component of the distributed antenna system, such as a network interface 102, a remote antenna unit 104, or somewhere within the distributed switching network 106.

Figure 1B:
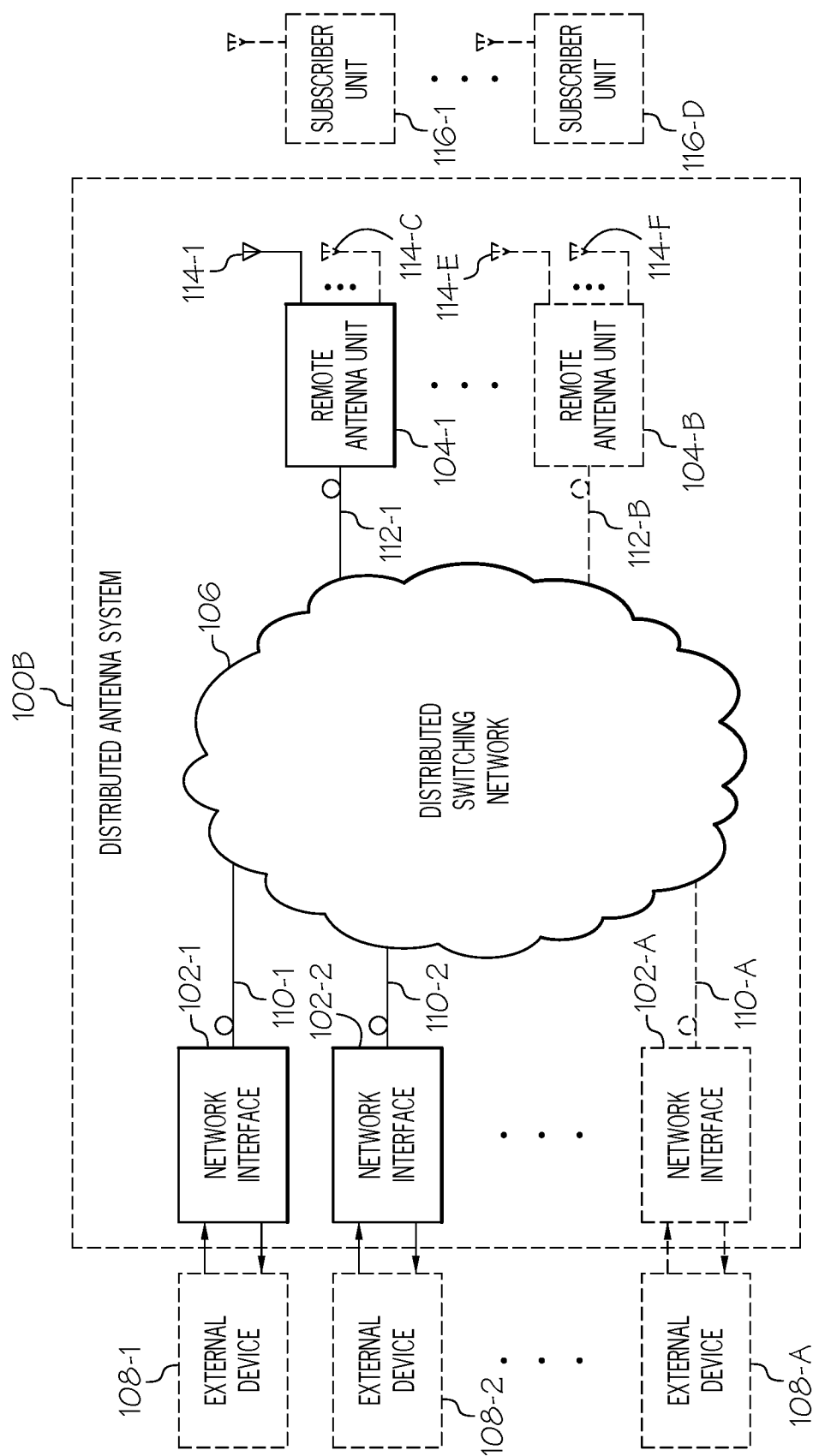

FIG. 1B is a block diagram of an exemplary embodiment of a distributed antenna system 100, distributed antenna system 100B. Distributed antenna system 100B includes a plurality of network interfaces 102 (including network interface 102-1, network interface 102-2, and any amount of optional network interfaces 102 through optional network interface 102-A), at least one remote antenna unit 104 (including remote antenna unit 104-1 and any amount of optional remote antenna units 104 through optional remote antenna unit 104-B), and a distributed switching network 106. Distributed antenna system 100B includes similar components to distributed antenna system 100A and operates according to similar principles and methods as distributed antenna system 100A described above. The difference between distributed antenna system 100B and distributed antenna system 100A is that both digital communication links 110 and digital communication links 112 are optical communication links.

Figure 1C:
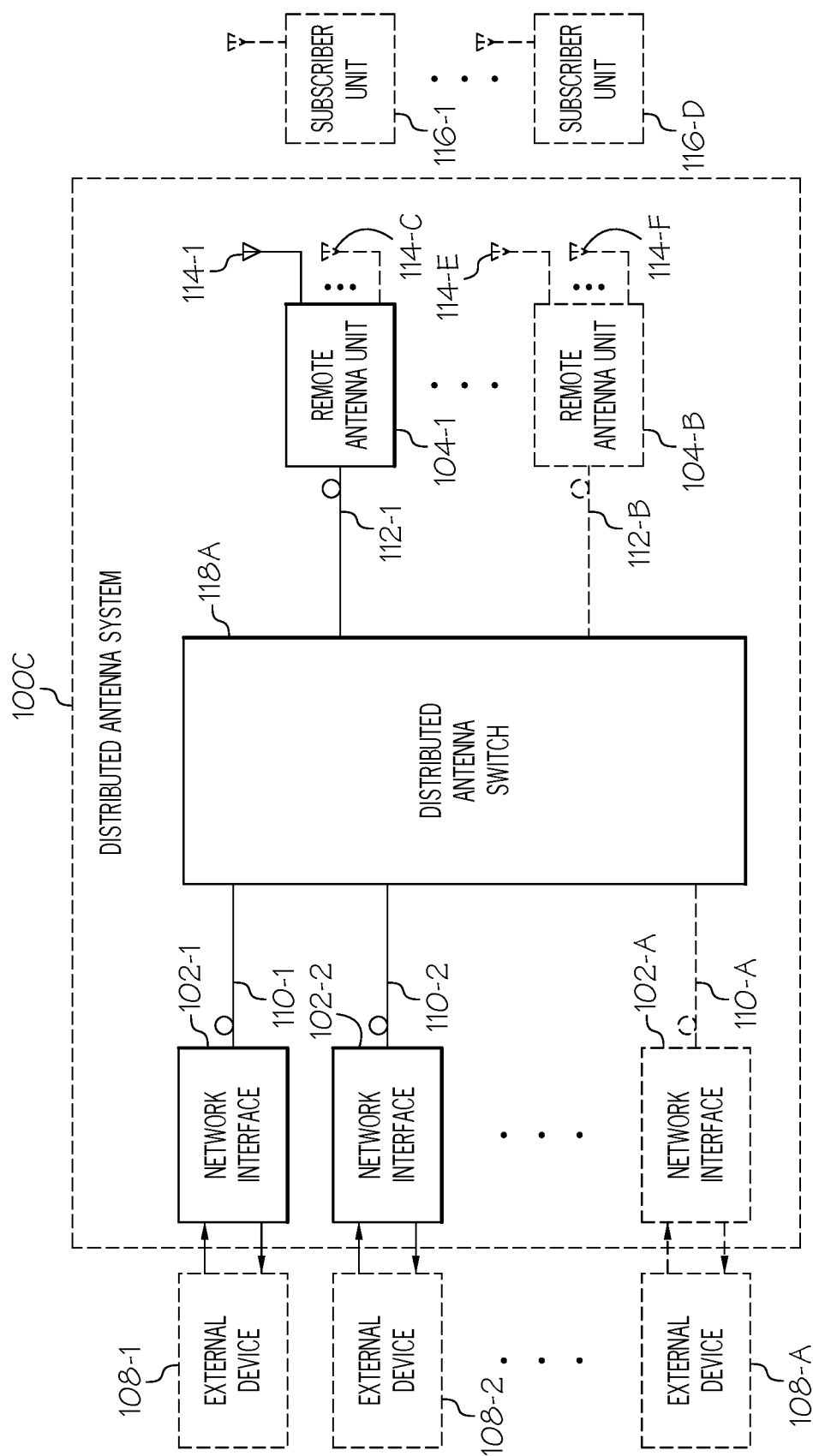

FIG. 1C is a block diagram of an exemplary embodiment of a distributed antenna system 100, distributed antenna system 100C. Distributed antenna system 100C includes a plurality of network interfaces 102 (including network interface 102-1, network interface 102-2, and any amount of optional network interfaces 102 through optional network interface 102-A), at least one remote antenna unit 104 (including remote antenna unit 104-1 and any amount of optional remote antenna units 104 through optional remote antenna unit 104-B), and a distributed antenna switch 118A. Distributed antenna system 100C includes similar components to distributed antenna system 100A and operates according to similar principles and methods as distributed antenna system 100A described above. The difference between distributed antenna system 100B and distributed antenna system 100A is that both digital communication links 110 and digital communication links 112 are optical communication links and that a distributed antenna switch 118A replaces the distributed switching network 106. Each network interface 102 is communicatively coupled to the distributed antenna switch 118A across a digital communication medium 110. Each antenna unit 104 is also communicatively coupled to the distributed antenna switch 118A across a digital communication medium 110. In exemplary embodiments, the distributed antenna switch 118A can be controlled by a separate controller or another component of the system. In exemplary embodiments the distributed antenna switch 118A is controlled either manually or automatically. In exemplary embodiments, the routes can be pre-determined and static. In other exemplary embodiments, the routes can dynamically change based on time of day, load, or other factors.

In the forward path, the distributed antenna switch 118A distributes and/or routes downlink signals received from the network interfaces 102 to the at least one remote antenna unit 104. In exemplary embodiments, downlink data streams from a plurality of network interfaces are aggregated by the distributed antenna switch into an aggregate downlink data stream that is communicated to the at least one remote antenna unit 104. In the reverse path, the distributed antenna switch 118A distributes and/or routes uplink signals received from the at least one remote antenna unit 104 to the plurality of network interfaces 102. In exemplary embodiments, an aggregate uplink data stream from at least one remote antenna unit 104 is split apart into a plurality of uplink data streams by the distributed antenna switch 118A and communicated to the plurality of network interfaces 102.

Figure 1D:
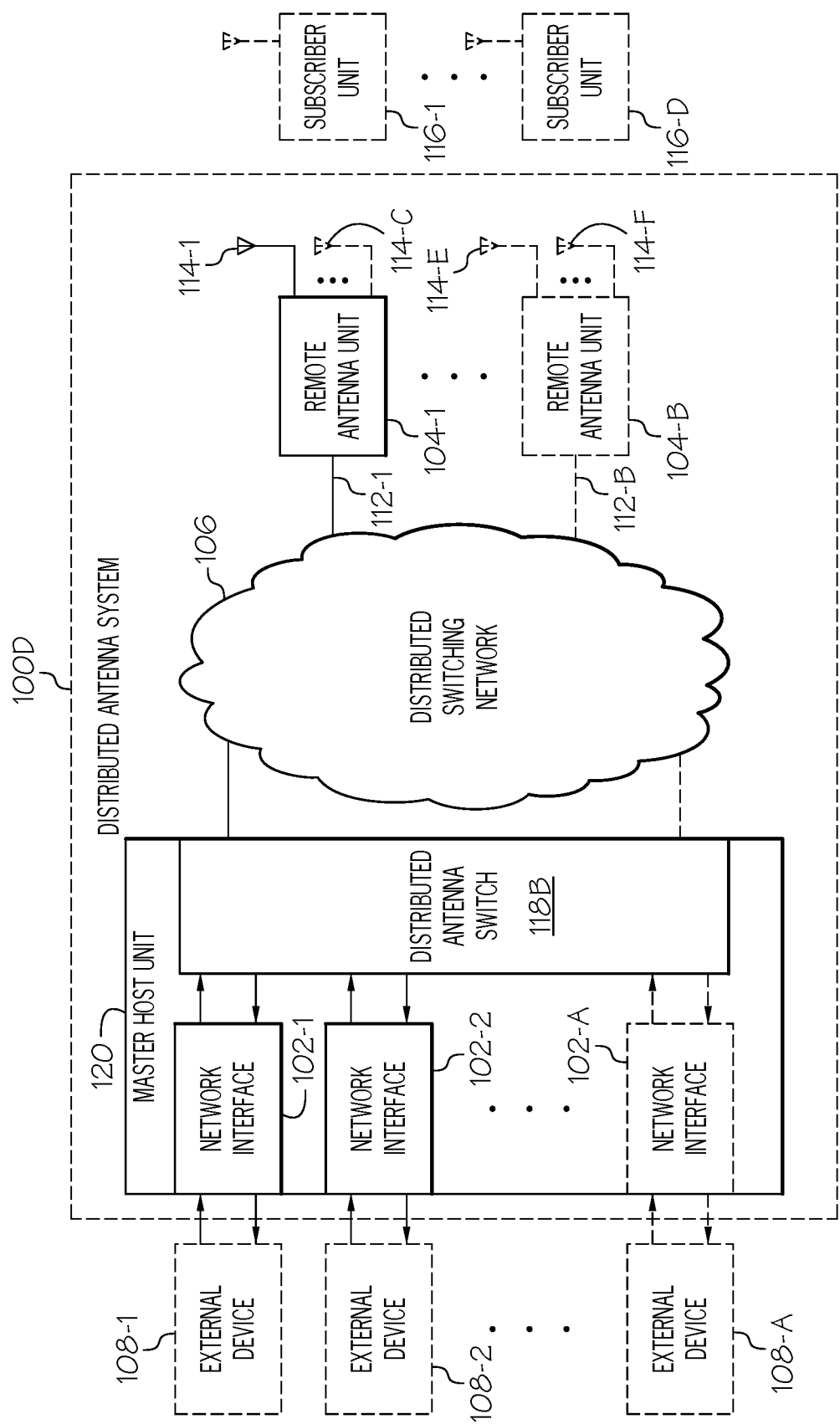

FIG. 1D is a block diagram of an exemplary embodiment of a distributed antenna system 100, distributed antenna system 100D. Distributed antenna system 100D includes a master host unit 120 having a plurality of network interfaces 102 (including network interface 102-1, network interface 102-2, and any amount of optional network interfaces 102 through optional network interface 102-A), a distributed antenna switch 118B, at least one remote antenna unit 104 (including remote antenna unit 104-1 and any amount of optional remote antenna units 104 through optional remote antenna unit 104-B), and a distributed switching network 106. Distributed antenna system 100C includes similar components to distributed antenna systems 100A-100C and operates according to similar principles and methods as distributed antenna systems 100A-100C described above. The difference between distributed antenna system 100D and distributed antenna system 100C is that the network interfaces 102 and the distributed antenna switch 118B are included within a master host unit that is communicatively coupled to the remote antenna units 104 by the distributed switching network 106. In exemplary embodiments, the distributed antenna switch 118B can be controlled by a separate controller or another component of the system. In exemplary embodiments the distributed antenna switch 118B is controlled either manually or automatically. In exemplary embodiments, the routes can be pre-determined and static. In other exemplary embodiments, the routes can dynamically change based on time of day, load, or other factors.

In the forward path, the distributed antenna switch 118B distributes and/or routes downlink signals received from the network interfaces 102 to the at least one remote antenna unit 104 through the distributed switching network 106. In exemplary embodiments, downlink data streams from a plurality of network interfaces are aggregated by the distributed antenna switch 118B into an aggregate downlink data stream that is communicated to the at least one remote antenna unit 104 via the distributed switching network. In the reverse path, the distributed antenna switch 118A distributes and/or routes uplink signals received from the at least one remote antenna unit 104 to the plurality of network interfaces 102. In exemplary embodiments, an aggregate uplink data stream received from at least one remote antenna unit 104 via the distributed switching network 106 is split apart into a plurality of uplink data streams by the distributed antenna switch 118B and communicated to the plurality of network interfaces 102.

Figure 1E:
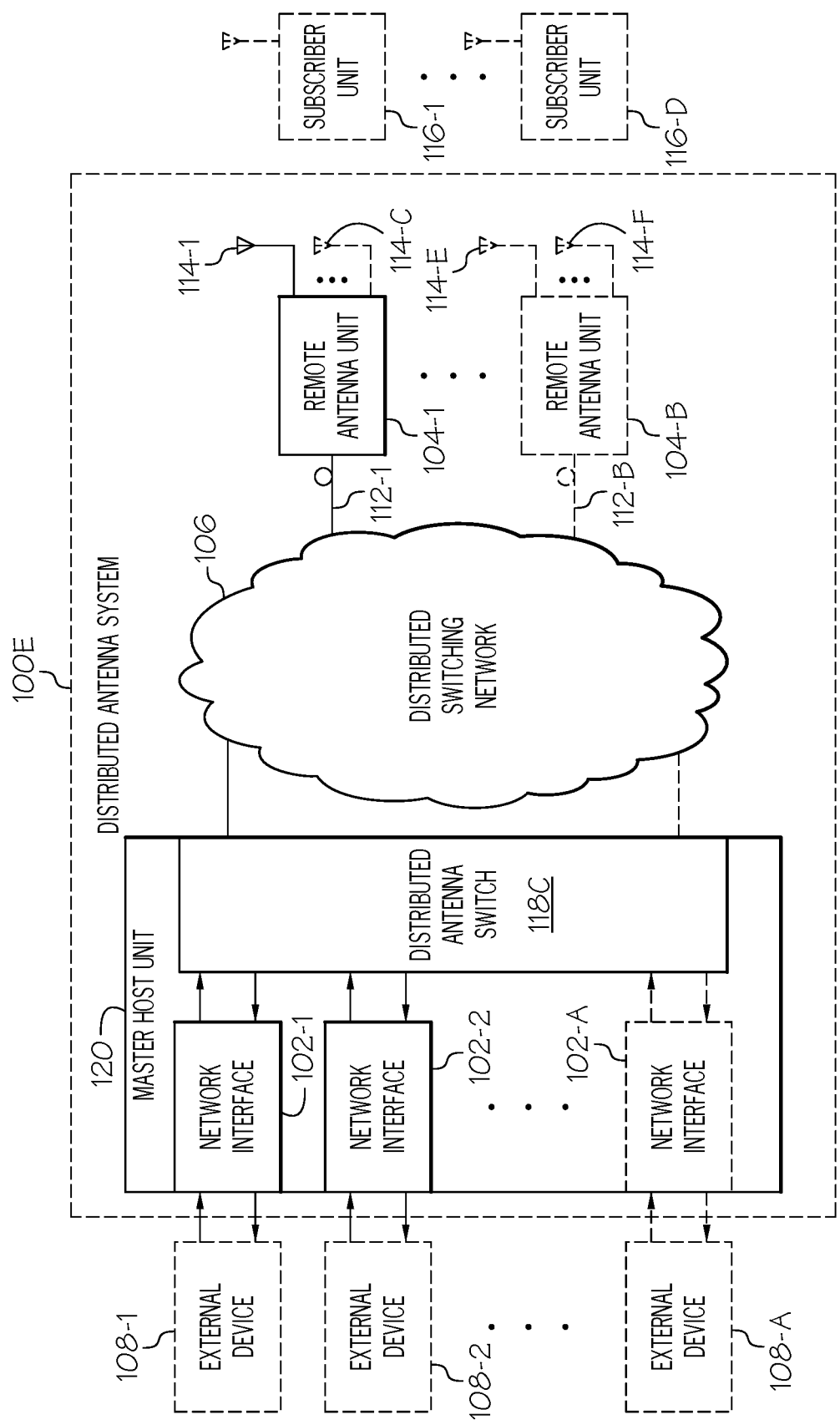

FIG. 1E is a block diagram of an exemplary embodiment of a distributed antenna system 100, distributed antenna system 100E. Distributed antenna system 100E includes a master host unit 120 having a plurality of network interfaces 102 (including network interface 102-1, network interface 102-2, and any amount of optional network interfaces 102 through optional network interface 102-A), a distributed antenna switch 118C, at least one remote antenna unit 104 (including remote antenna unit 104-1 and any amount of optional remote antenna units 104 through optional remote antenna unit 104-B), and a distributed switching network 106. Distributed antenna system 100E includes similar components to distributed antenna systems 100A-100D and operates according to similar principles and methods as distributed antenna systems 100A-100D described above. The difference between distributed antenna system 100E and distributed antenna system 100D is that digital communication links 112 are optical communication links.

FIGS. 2A-2J are block diagrams of exemplary embodiments of base station network interfaces 102 used in distributed antenna systems, such as the exemplary distributed antenna systems 100 described above. Each of FIGS. 2A-2J illustrates a different embodiment of a type of base station network interface 102, labeled 104A-104D respectively.

Figure 2A:
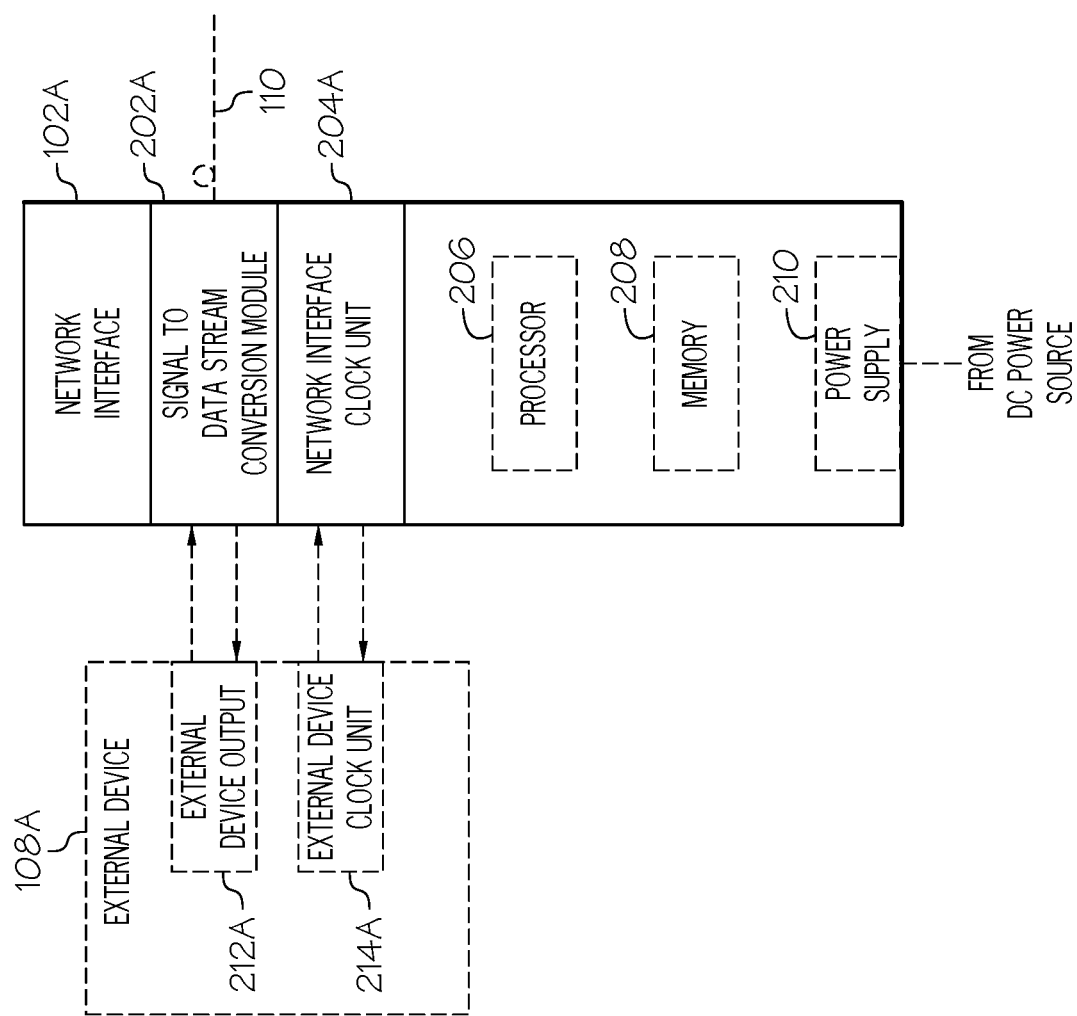

FIG. 2A is a block diagram of an exemplary embodiment of a base station network interface 102, general base station network interface 102A. General base station network interface 102A includes signal to data stream conversion module 202A, network interface clock unit 204A, optional processor 206, optional memory 208, and optional power supply 210. In exemplary embodiments, signal to data stream conversion module 202A is communicatively coupled to an external device output 212A of an external device 108A. Signal to data stream conversion module 202A is also communicatively coupled to at least one digital communication link 110. In exemplary embodiments, the digital communication link 110 is an optical communication link across a fiber optic cable, though it can also be other types of wired or wireless links in other embodiments. In exemplary embodiments, the signal to data stream conversion module 202A and/or the network interface clock unit 204A are implemented using optional processor 206 and optional memory 208. In exemplary embodiments, the optional power supply 210 provides power to the various elements of the base station network interface 102A.

In the downlink, signal to data stream conversion module 202A is configured to receive downlink signals from the external device output 212A of the external device 108A. The signal to data stream conversion module 202A is further configured to convert the received downlink signals to a downlink data stream. In exemplary embodiments, the signal to data stream conversion module 202A further converts the data stream from electrical signals to optical signals for output on digital communication link 110. In other embodiments, the data stream is transported using a conductive communication medium, such as coaxial cable or twisted pair, and the optical conversion is not necessary.

In the uplink, signal to data stream conversion module 202A is configured to receive an uplink data stream from digital communication link 110. In exemplary embodiments where digital communication link 110 is an optical medium, the radio frequency to optical data stream conversion module 202A is configured to convert the uplink data stream between received optical signals and electrical signals. In other embodiments, the data stream is transported using a conductive communication medium, such as coaxial cable or twisted pair, and the optical conversion is not necessary. The signal to data stream conversion module 202A is further configured to convert the uplink data stream to uplink signals. Signal to data stream conversion module 202A is further configured to communicate the uplink signals to the external device output 212A of the external device 108A.

In exemplary embodiments, the network interface clock unit 204A is communicatively coupled to an external device clock unit 214A of the external device 108A. In exemplary embodiments, a master reference clock is provided to the external device clock unit 214A of the external device 108A from the network interface clock unit 204A of the base station network interface 102A. In other exemplary embodiments, a master reference clock is provided from the external device clock unit 214A of the external device 108A to the network interface clock unit 204A of the base station network interface 102A.

Figure 2B:
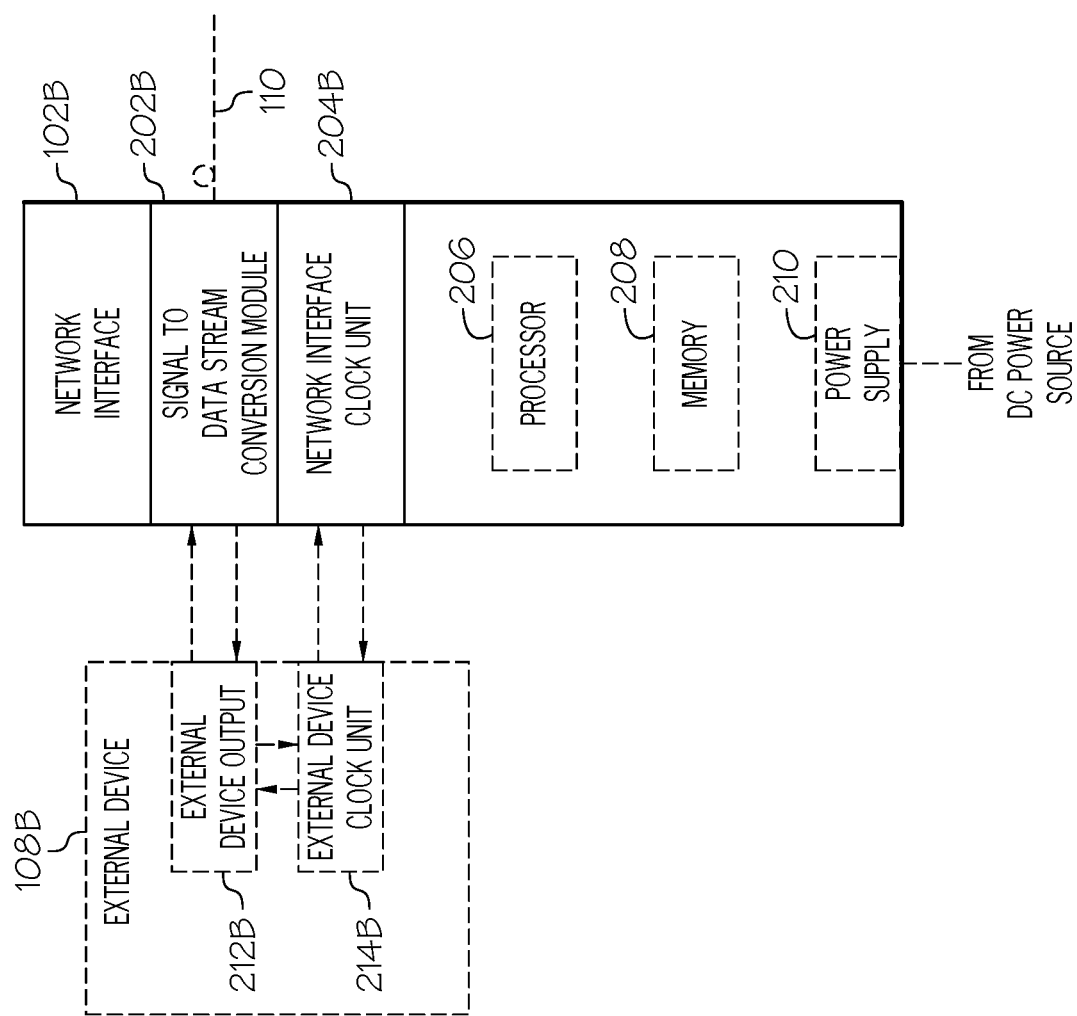

FIG. 2B is a block diagram of an exemplary embodiment of a type of base station interface 102, general base station network interface 102B. General base station network interface 102B includes signal to data stream conversion module 202B, network interface clock unit 204B, optional processor 206, optional memory 208, and optional power supply 210. Similarly to general base station network interface 102A, signal to data stream conversion module 202B is communicatively coupled to an external device output 212B of an external device 108B. In contrast to general base station network interface 102A, base station network interface clock unit 204B is not coupled directly to external device clock unit 214B of external device 108B to provide the master reference clock to the external device 108B. Instead, network interface clock unit 204B provides the master reference clock to the signal to data stream conversion module 202B and the master reference clock is embedded in the upstream signal from the signal to data stream conversion module 202B to the external device output 212B of external device 108B.

In particular, uplink signals can be clocked using the master clock, such that the master clock is embedded in the uplink signals. Then, external device clock unit 214B extracts the master clock from uplink signals and distributes the master clock as appropriate in the external device 108B to establish a common clock with the distributed antenna system in the external device 108B. In exemplary embodiments where the master reference clock is provided from an external device 108B to the distributed antenna system, the master reference clock can be embedded in the downlink signals by the external device clock unit 214B so that the downlink signals communicated from the external device output 212B of the external device 108B to the signal to data stream conversion module 202B can be extracted by the network interface clock unit 204B and distributed as appropriate within the network interface 102B and the distributed antenna system 100 generally.

In exemplary embodiments, the signal to data stream conversion module 202B and/or the network interface clock unit 204B are implemented using optional processor 206 and optional memory 208. In exemplary embodiments, the optional power supply 210 provides power to the various elements of the base station network interface 102B.

Figure 2C:
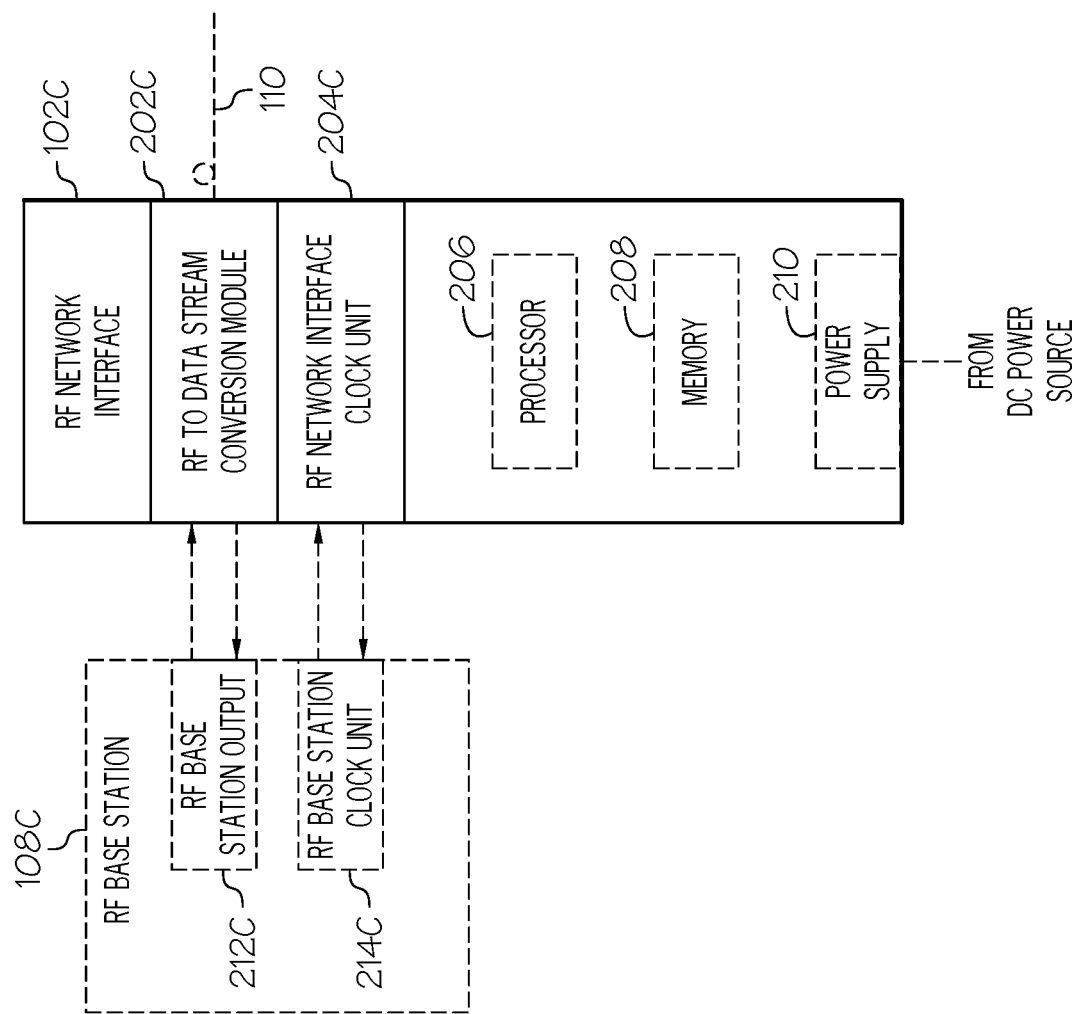

FIG. 2C is a block diagram of an exemplary embodiment of a type of base station network interface 102, radio frequency (RF) network interface 102C. Radio frequency network interface 102C includes a radio frequency (RF) to data stream conversion module 202C, a radio frequency (RF) network interface clock unit 204C, an optional processor 206, optional memory 208, and an optional power supply 210. In exemplary embodiments, radio frequency (RF) to data stream conversion module 202C is communicatively coupled to a radio frequency (RF) base station output 212C of an external device that is a radio frequency base station 108C. Radio frequency to data stream conversion module 202C is also communicatively coupled to at least one digital communication link 110. In exemplary embodiments, the radio frequency to data stream conversion module 202C and/or the radio frequency network interface clock unit 204C are implemented using optional processor 206 and optional memory 208. In exemplary embodiments, the optional power supply 210 provides power to the various elements of the radio frequency network interface 102C.

In the downlink, radio frequency to data stream conversion module 202C is configured to receive radio frequency signals from the radio frequency base station output 212C of the radio frequency base station 108C. The radio frequency to data stream conversion module 202C is further configured to convert the received radio frequency signals to a downlink data stream. In exemplary embodiments, this is done using oscillators and mixers. In exemplary embodiments, the radio frequency to data stream conversion module 202C further converts the data stream from electrical signals to optical signals for output on digital communication link 110. In other embodiments, the data stream is transported using a conductive communication medium, such as coaxial cable or twisted pair, and the optical conversion is not necessary.

In the uplink, radio frequency to data stream conversion module 202C is configured to receive a data stream across digital communication link 110. In exemplary embodiments where digital communication link 110 is an optical medium, the radio frequency to data stream conversion module 202C is configured to convert the uplink data streams between received optical signals and electrical signals. In other embodiments, the data stream is transported using a conductive communication medium, such as coaxial cable or twisted pair, and the optical conversion is not necessary. The radio frequency to data stream conversion module is further configured to convert the uplink data stream to radio frequency signals. In exemplary embodiments, this is done using oscillators and mixers. Radio frequency to data stream conversion module 202C is further configured to communicate the uplink radio frequency signals to the radio frequency base station output 212C of the radio frequency base station 108C.

In exemplary embodiments, the radio frequency network interface clock unit 204C is communicatively coupled to a radio frequency base station clock unit 214C of the radio frequency base station 108C. In exemplary embodiments, a master reference clock is provided to the radio frequency base station clock unit 214C of the radio frequency base station 108C from the radio frequency network interface clock unit 204C of the base station network interface 102C. In other exemplary embodiments, a master reference clock is provided from the radio frequency base station clock unit 214C of the radio frequency base station 108C to the radio frequency network interface clock unit 204C of the radio frequency network interface 102C.

Figure 2D:
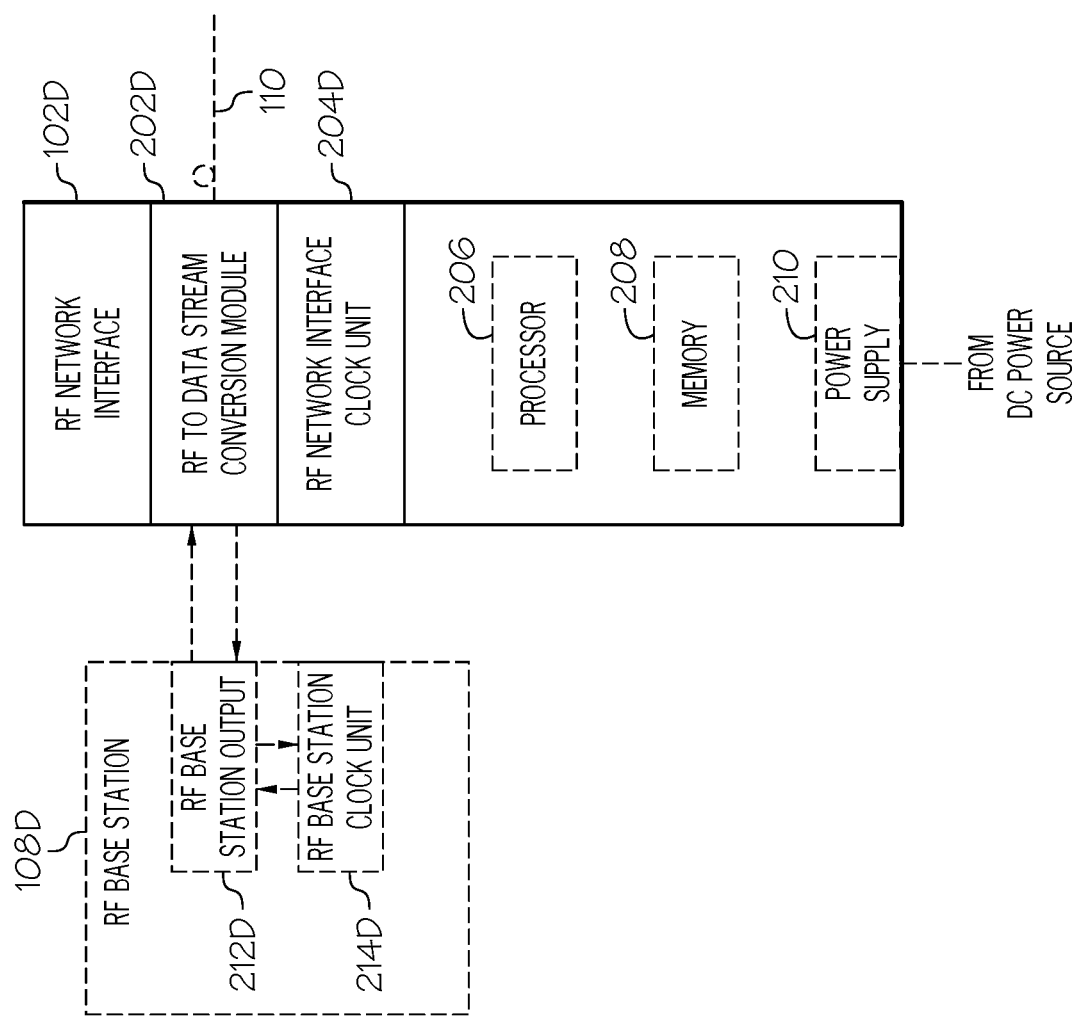

FIG. 2D is a block diagram of an exemplary embodiment of a type of base station interface 102, radio frequency (RF) network interface 102D. Radio frequency network interface 102D includes a radio frequency (RF) to data stream conversion module 202D, a radio frequency (RF) network interface clock unit 204D, an optional processor 206, optional memory 208, and an optional power supply 210. Similarly to radio frequency network interface 102C, radio frequency (RF) to data stream conversion module 202D is communicatively coupled to a radio frequency (RF) base station output 212D of an external device that is a radio frequency base station 108D and to at least one digital communication link 110. In contrast to radio frequency network interface 102C, radio frequency network interface clock unit 204D is not coupled directly to radio frequency base station clock unit 214D of radio frequency base station 108D to provide and/or receive the master reference clock to/from the radio frequency base station 108D. Instead, radio frequency network interface clock unit 204C provides the master reference clock to the radio frequency to data stream conversion module 202D and the master reference clock is embedded in upstream signals from the radio frequency to data stream conversion module 202D to the radio frequency base station output 212D of radio frequency base station 108D.

In particular, uplink signals can be clocked using the master clock, such that the master clock is embedded in the uplink signals. Then, radio frequency base station clock unit 214D extracts the master clock from uplink signals and distributes the master clock as appropriate in the radio frequency base station 108D to establish a common clock with the distributed antenna system 100 in the radio frequency base station 108D. In exemplary embodiments where the master reference clock is provided from the radio frequency base station 108D to the distributed antenna system, the master reference clock can be embedded in the downlink signals by the radio frequency base station clock unit 214D so that the downlink signals communicated from the radio frequency base station output 212D of the radio frequency base station 108D to the radio frequency to data stream conversion module 202D can be extracted by the radio frequency network interface clock unit 204D and distributed as appropriate within the radio frequency network interface 102D and the distributed antenna system 100 generally.

In exemplary embodiments, the radio frequency to data stream conversion module 202D and/or the radio frequency network interface clock unit 204D are implemented using optional processor 206 and optional memory 208. In exemplary embodiments, the optional power supply 210 provides power to the various elements of the base station network interface 102D.

Figure 2E:
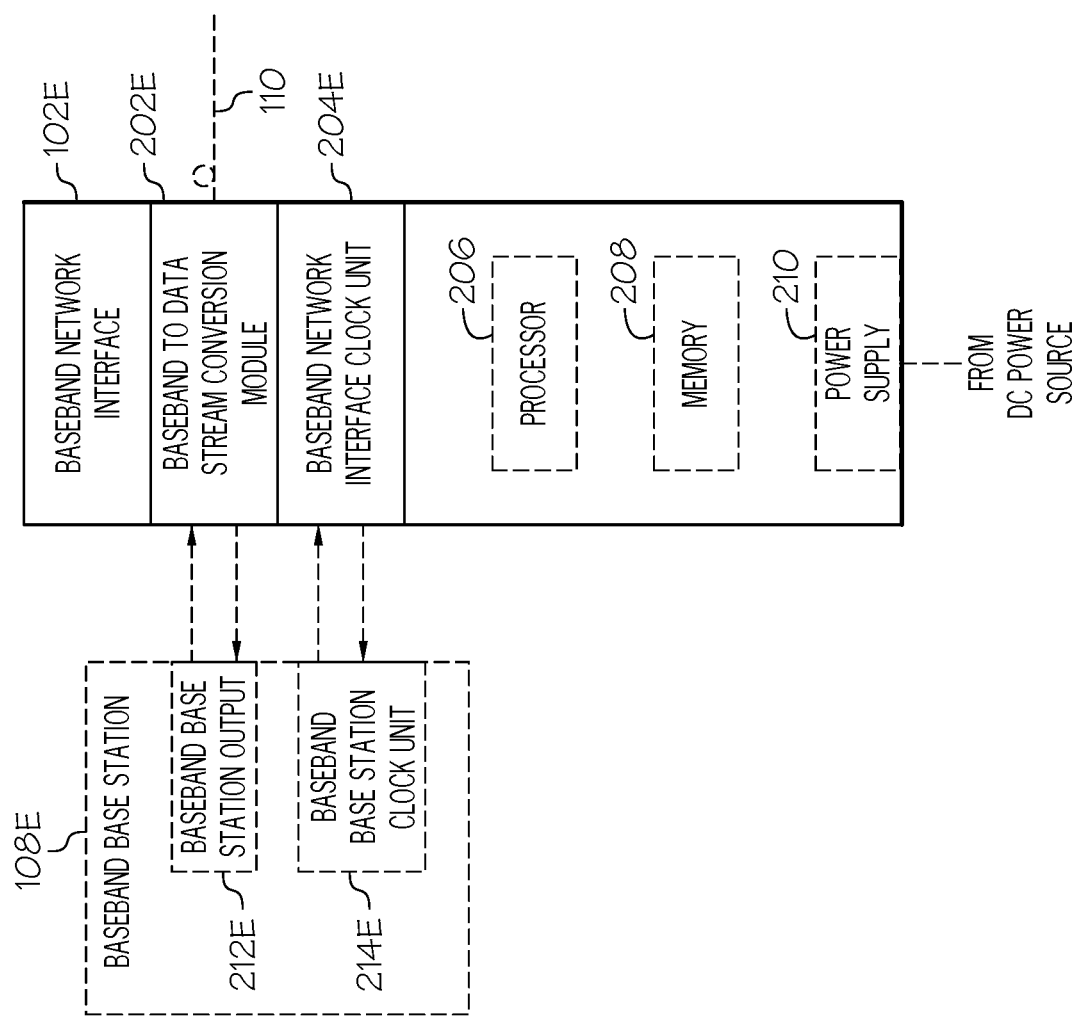

FIG. 2E is a block diagram of an exemplary embodiments of a type of base station network interface 102, baseband network interface 102E. Baseband network interface 102E includes a baseband to data stream conversion module 202E, a baseband network interface clock unit 204E, an optional processor 206, optional memory 208, and an optional power supply 210. In exemplary embodiments, baseband to data stream conversion module 202E is communicatively coupled to a baseband base station output 212E of an external device that is a baseband base station 108E. Baseband to data stream conversion module 202E is also communicatively coupled to at least one digital communication link 110. In exemplary embodiments, the baseband to data stream conversion module 202E and/or the baseband network interface clock unit 204E are implemented using optional processor 206 and optional memory 208. In exemplary embodiments, the optional power supply 210 provides power to the various elements of the baseband network interface 102E.

In the downlink, baseband to data stream conversion module 202E is configured to receive baseband mobile wireless access signals (such as I/Q data) from a baseband base station output 212E of a baseband base station 108E. The baseband to data stream conversion module 202E is further configured to convert the received baseband mobile wireless access signals to a downlink data stream. In exemplary embodiments, the baseband to data stream conversion module 202E further converts the data stream from electrical signals to optical signals for output on the digital communication link 110. In other embodiments, the data stream is transported using a conductive communication medium, such as coaxial cable or twisted pair, and the optical conversion is not necessary.

In the uplink, baseband to data stream conversion module 202E is configured to receive a data stream across digital communication link 110. In exemplary embodiments where digital communication link 110 is an optical medium, the baseband to data stream conversion module 202E is configured to convert the uplink data stream between received optical signals and electrical signals. In other embodiments, the data stream is transported using a conductive communication medium, such as coaxial cable or twisted pair, and the optical conversion is not necessary. The baseband to data stream conversion module 202E is further configured to convert the uplink data stream to uplink baseband wireless access signals. Baseband to data stream conversion module 202E is further configured to communicate the uplink baseband wireless access signals to the baseband base station output 212E.

In exemplary embodiments, the baseband network interface clock unit 204E is communicatively coupled to a baseband base station clock unit 214E of the baseband base station 108E. In exemplary embodiments, a master reference clock is provided to the baseband base station clock unit 214E of the baseband base station 108E from the baseband network interface clock unit 204E of the baseband network interface 102E. In other exemplary embodiments, a master reference clock is provided from the baseband base station clock unit 214E of the baseband base station 108E to the baseband network interface clock unit 204E of the baseband network interface 102E.

Figure 2F:
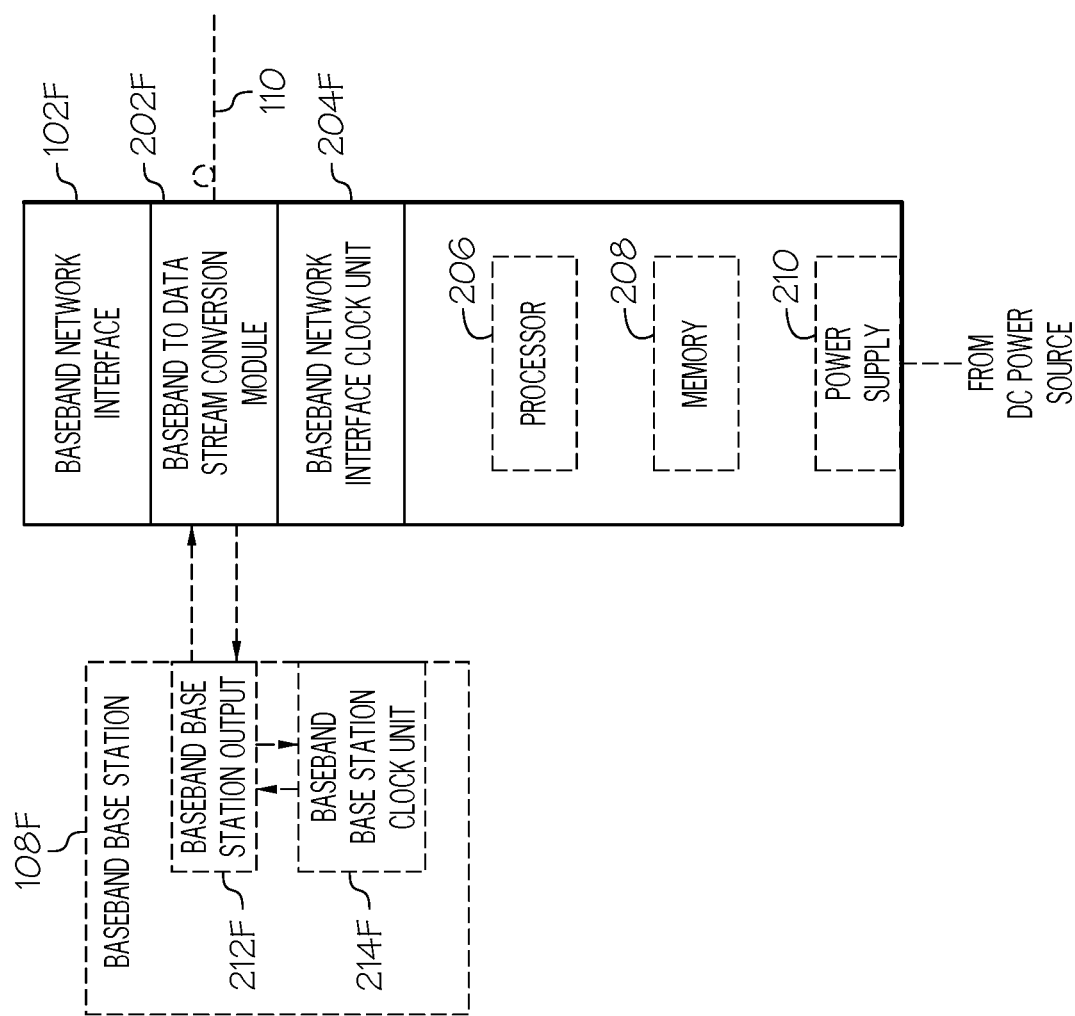

FIG. 2F is a block diagram of an exemplary embodiment of a type of base station interface 102, baseband network interface 102F. Baseband network interface 102F includes a baseband to data stream conversion module 202F, a baseband network interface clock unit 204F, an optional processor 206, optional memory 208, and an optional power supply 210. Similarly to baseband network interface 102E, baseband to data stream conversion module 202F is communicatively coupled to a baseband base station output 212F of an external device that is a baseband base station 108F and to at least one digital communication link 110. In contrast to baseband network interface 102E, baseband network interface clock unit 204F is not coupled directly to baseband base station clock unit 214F of baseband base station 108F to provide and/or receive the master reference clock to/from the baseband base station 108F. Instead, baseband network interface 102F provides the master reference clock to the baseband to data stream conversion module 202F and the master reference clock is embedded in upstream signals from the baseband to data stream conversion module 202F to the baseband base station output 212F of baseband base station 108F.

In particular, uplink signals can be clocked using the master clock, such that the master clock is embedded in the uplink signals. Then, baseband base station clock unit 214F extracts the master clock from uplink signals and distributes the master clock as appropriate in the baseband base station 108F to establish a common clock with the distributed antenna system 100 in the baseband base station 108F. In exemplary embodiments where the master reference clock is provided from the baseband base station 108F to the distributed antenna system, the master reference clock can be embedded in the downlink signals by the baseband base station clock unit 214F so that the downlink signals communicated from the baseband base station output 212F of the baseband base station 108F to the baseband to data stream conversion module 202F can be extracted by the baseband network interface clock unit 204F and distributed as appropriate within the baseband network interface 102F and the distributed antenna system generally.

In exemplary embodiments, the baseband to data stream conversion module 202F and/or the baseband network interface clock unit 204F are implemented using optional processor 206 and optional memory 208. In exemplary embodiments, the optional power supply 210 provides power to the various elements of the baseband network interface 102F.

Figure 2G:
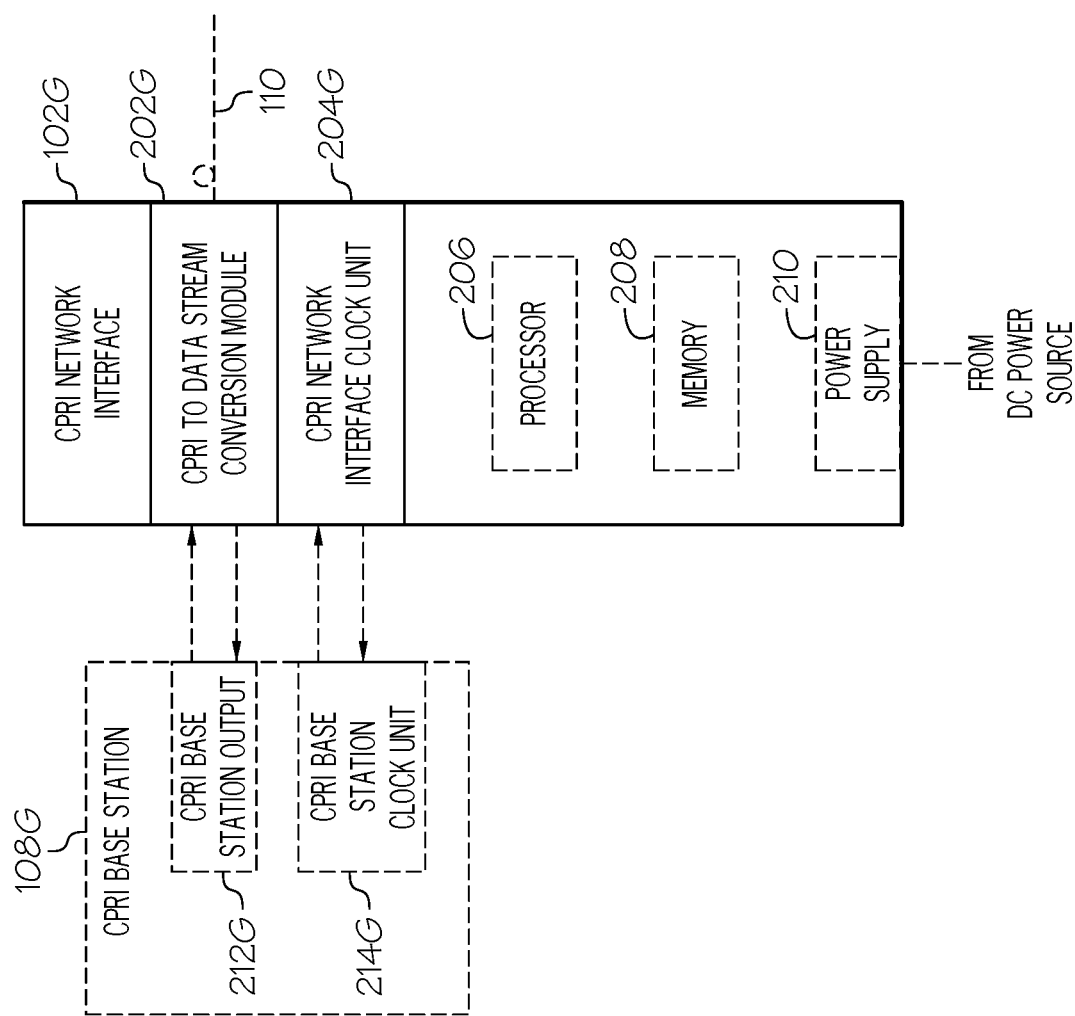

FIG. 2G is a block diagram of an exemplary embodiment of a type of base station network interface 102, Common Public Radio Interface (CPRI) network interface 102G. CPRI network interface 102G includes a CPRI to data stream conversion module 202G, a CPRI network interface clock unit 204G, an optional processor 206, optional memory 208, and an optional power supply 210. In exemplary embodiments, CPRI to data stream conversion module 202G is communicatively coupled to a CPRI base station output 212G of an external device that is a CPRI base station 108G. CPRI to data stream conversion module 202G is also communicatively coupled to at least one digital communication link 110. In exemplary embodiments, the CPRI to data stream conversion module 202G and/or the CPRI network interface clock unit 204G are implemented using optional processor 206 and optional memory 208. In exemplary embodiments, the optional power supply 210 provides power to the various elements of the CPRI network interface 102G.

In the downlink, CPRI to data stream conversion module 202G is configured to receive CPRI signals from the CPRI base station output 212G. The CPRI to data stream conversion module 202G is further configured to convert the received CPRI signals to a downlink data stream. In exemplary embodiments, the CPRI to data stream conversion module 202G further converts the data stream from electrical signals to optical signals for output on the digital communication link 110. In other embodiments, the data stream is transported using a conductive communication medium, such as coaxial cable or twisted pair, and the optical conversion is not necessary.

In the uplink, CPRI to data stream conversion module 202C is configured to receive a data stream across digital communication link 110. In exemplary embodiments where digital communication link 110 is an optical medium, the CPRI to data stream conversion module 202G is configured to convert the uplink data stream between received optical signals and electrical signals. In other embodiments, the data stream is transported using a conductive communication medium, such as coaxial cable or twisted pair, and the optical conversion is not necessary. The CPRI to data stream conversion module 202G is further configured to convert the uplink data stream to uplink CPRI signals. CPRI to data stream conversion module 202G is further configured to communicate the uplink CPRI signal to the CPRI base station output 212G.

In exemplary embodiments, the CPRI network interface clock unit 204G is communicatively coupled to a CPRI base station clock unit 214G of the CPRI base station 108G. In exemplary embodiments, a master reference clock is provided to the CPRI base station clock unit 214G of the CPRI base station 108G from the CPRI network interface clock unit 204G of the CPRI network interface 102G. In other exemplary embodiments, a master reference clock is provided from the CPRI base station clock unit 214G of the CPRI base station 108G to the CPRI network interface clock unit 204E of the CPRI network interface 102G.

Figure 2H:
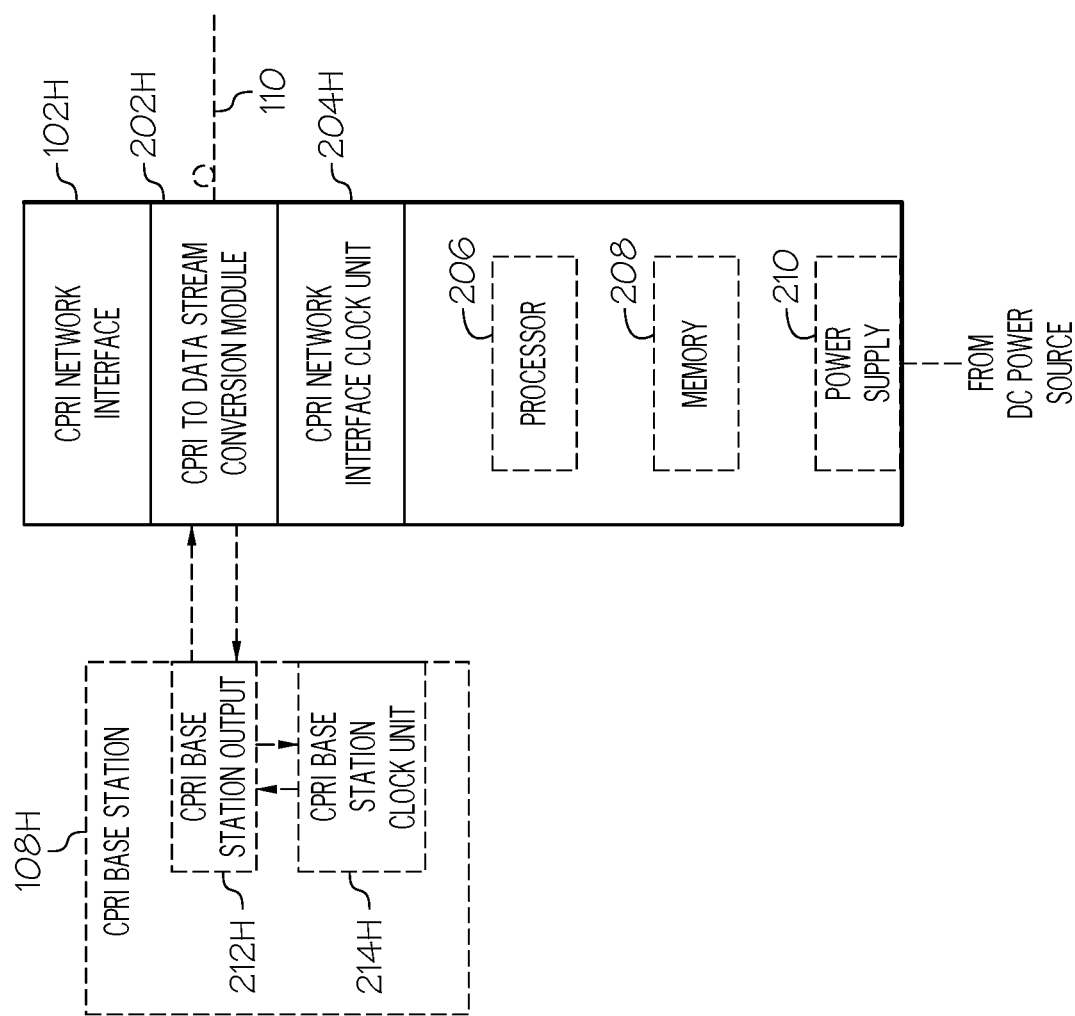
Figure 21:
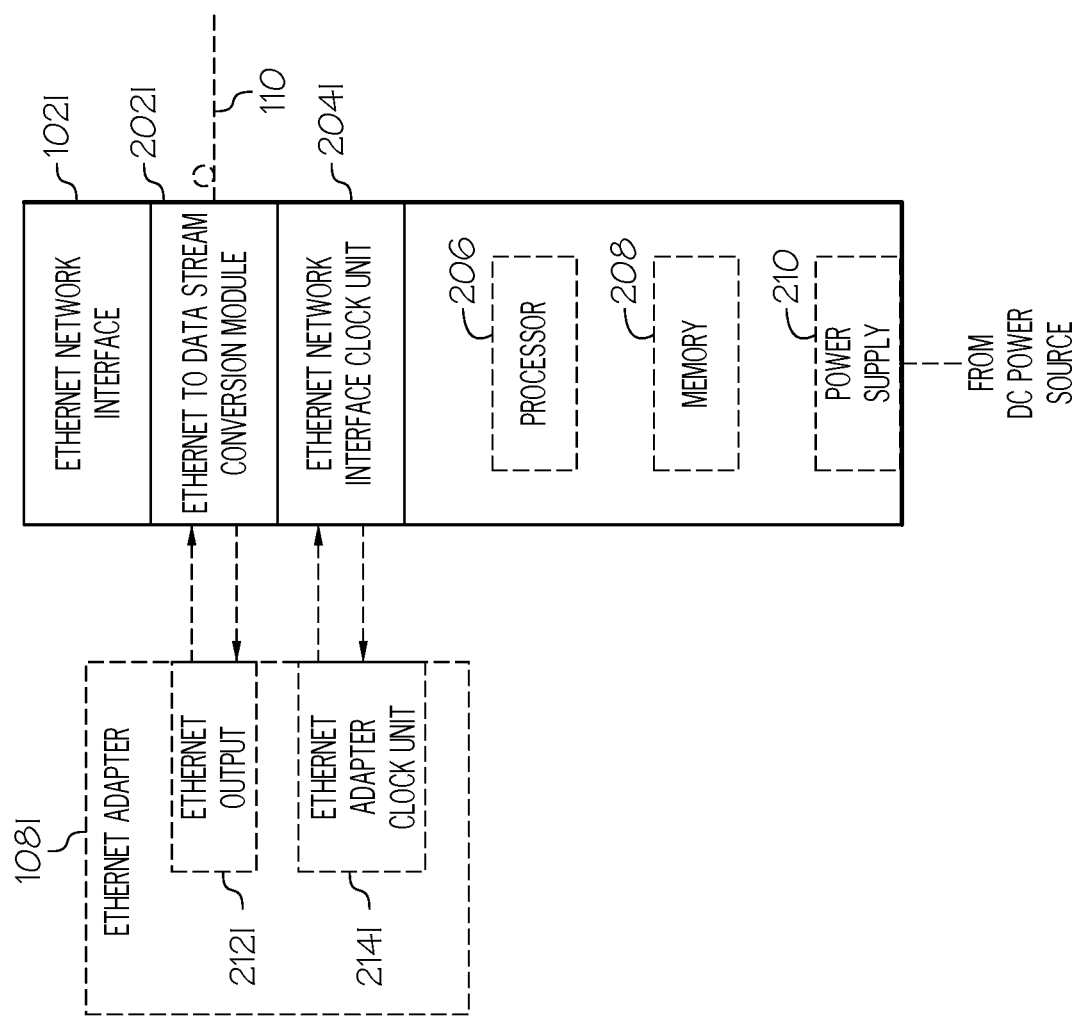

FIG. 2H is a block diagram of an exemplary embodiment of a type of base station interface 102, CPRI network interface 102H. CPRI network interface 102H includes a CPRI to data stream conversion module 202H, a CPRI network interface clock unit 204H, an optional processor 206, optional memory 208, and an optional power supply 210. Similarly to CPRI network interface 102G, CPRI to data stream conversion module 202H is communicatively coupled to a CPRI base station output 212H of an external device that is a CPRI base station 108H and to at least one digital communication link 110. In contrast to CPRI network interface 102G, CPRI network interface clock unit 204H is not coupled directly to CPRI base station clock unit 214G of CPRI base station 108H to provide and/or receive the master reference clock to/from the CPRI base station 108H. Instead, CPRI network interface 102H provides the master reference clock to the CPRI to data stream conversion module 202H and the master reference clock is embedded in upstream signals from the CPRI to data stream conversion module 202H to the CPRI base station output 212H of CPRI base station 108H.

In particular, uplink signals can be clocked using the master clock, such that the master clock is embedded in the uplink signals. Then, CPRI base station clock unit 214H extracts the master clock from uplink signals and distributes the master clock as appropriate in the CPRI base station 108H to establish a common clock with the distributed antenna system 100 in the CPRI base station 108H. In exemplary embodiments where the master reference clock is provided from the CPRI base station 108H to the distributed antenna system 100, the master reference clock can be embedded in the downlink signals by the CPRI base station clock unit 214H so that the downlink signals communicated from the CPRI base station output 212H of the CPRI base station 108H to the CPRI to data stream conversion module 202H can be extracted by the CPRI network interface clock unit 204H and distributed as appropriate within the CPRI network interface 102H and the distributed antenna system 100 generally.

In exemplary embodiments, the CPRI to data stream conversion module 202H and/or the CPRI network interface clock unit 204H are implemented using optional processor 206 and optional memory 208. In exemplary embodiments, the optional power supply 210 provides power to the various elements of the CPRI network interface 102H.

FIG. 2I is a block diagram of an exemplary embodiment of a type of base station network interface 102, Ethernet network interface 102I. Ethernet network interface 102I includes an Ethernet to data stream conversion module 202I, an Ethernet network interface clock unit 204I, an optional processor 206, optional memory 208, and an optional power supply 210. In exemplary embodiments, Ethernet to data stream conversion module 202I is communicatively coupled to an Ethernet output 212I of an external device that is an Ethernet adapter 108I to an internet protocol (IP) based network. Ethernet to data stream conversion module 202I is also communicatively coupled to at least one digital communication link 110. In exemplary embodiments, the Ethernet to data stream conversion module 202I and/or the Ethernet network interface clock unit 204I are implemented using optional processor 206 and optional memory 208. In exemplary embodiments, the optional power supply 210 provides power to the various elements of the Ethernet network interface 102I.

In the downlink Ethernet to data stream conversion module 202I is configured to receive internet protocol packets from the Ethernet output 212I. The Ethernet to data stream conversion module 202I is further configured to convert the internet protocol packets to a downlink data stream. In exemplary embodiments, the Ethernet to data stream conversion module 202I further converts the data stream from electrical signals to optical signals for output on the digital communication link 110. In other embodiments, the data stream is transported using a conductive communication medium, such as coaxial cable or twisted pair, and the optical conversion is not necessary.

In the uplink, Ethernet to data stream conversion module 202I is configured to receive a data stream across digital communication link 110. In exemplary embodiments where digital communication link 110 is an optical medium, the Ethernet to data stream conversion module 202I is configured to convert the uplink data stream between received optical signals and electrical signals. In other embodiments, the data stream is transported using a conductive communication medium, such as coaxial cable or twisted pair, and the optical conversion is not necessary. The Ethernet to data stream conversion module 202I is further configured to convert the uplink data stream to uplink Ethernet frames. Ethernet to data stream conversion module 202I is further configured to communicate the uplink Ethernet frames to the Ethernet output 204I.

In exemplary embodiments, the Ethernet network interface clock unit 204I is communicatively coupled to an Ethernet adapter clock unit 214I of the Ethernet adapter 108I. In exemplary embodiments, a master reference clock is provided to the Ethernet adapter clock unit 214I of the Ethernet adapter 108I from the Ethernet network interface clock unit 204I of the Ethernet network interface 102I. In other exemplary embodiments, a master reference clock is provided from the Ethernet adapter clock unit 214I of the Ethernet adapter 108I to the Ethernet network interface clock unit 204I of the Ethernet network interface 102I.

Figure 2J:
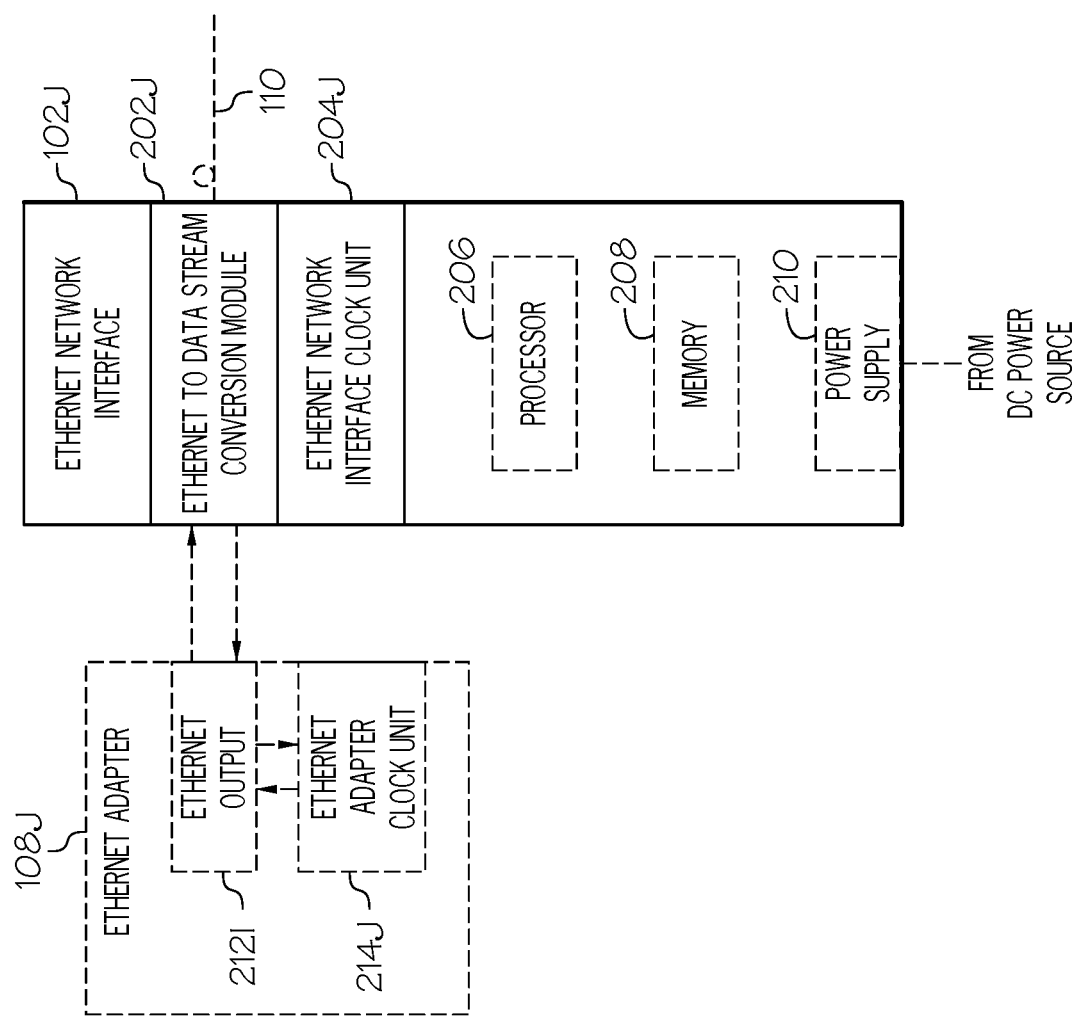

FIG. 2J is a block diagram of an exemplary embodiments of a type of base station interface 102, an Ethernet network interface 102J. Ethernet network interface 102J includes an Ethernet to data stream conversion module 202J, an Ethernet network interface clock unit 204J, an optional processor 206, optional memory 208, and an optional power supply 210. Similarly to Ethernet network interface 102I, Ethernet to data stream conversion module 202J is communicatively coupled to an Ethernet output 212J of an external device that is an Ethernet adapter 108J and to at least one digital communication link 110. In contrast to Ethernet network interface 102I, Ethernet network interface clock unit 204J is not coupled directly to Ethernet adapter clock unit 214J of Ethernet adapter 108J to provide and/or receive the master reference clock to/from the Ethernet adapter 108J. Instead, Ethernet network interface 102J provides the master reference clock to the Ethernet to data stream conversion module 202J and the master reference clock is embedded in upstream signals from the Ethernet to data stream conversion module 202J to the Ethernet output 212J of the Ethernet adapter 108J.

In particular, uplink signals can be clocked using the master clock, such that the master clock is embedded in the uplink signals. Then, Ethernet adapter clock unit 214J extracts the master clock from uplink signals and distributes the master clock as appropriate in the Ethernet adapter 108J to establish a common clock with the distributed antenna system 100 in the Ethernet adapter 108J. In exemplary embodiments where the master reference clock is provided from the Ethernet adapter 108J to the distributed antenna system 100, the master reference clock can be embedded in the downlink signals by the Ethernet adapter clock unit 214J so that the downlink signals communicated from the Ethernet output 212J of the Ethernet adapter 108J to the Ethernet to data stream conversion module 202J can be extracted by the Ethernet network interface clock unit 204J and distributed as appropriate within the Ethernet network interface 102J and the distributed antenna system 100 generally.

In exemplary embodiments, the Ethernet to data stream conversion module 202J and/or the Ethernet network interface clock unit 204J are implemented using optional processor 206 and optional memory 208. In exemplary embodiments, the optional power supply 210 provides power to the various elements of the Ethernet network interface 102J.

Figure 3A:
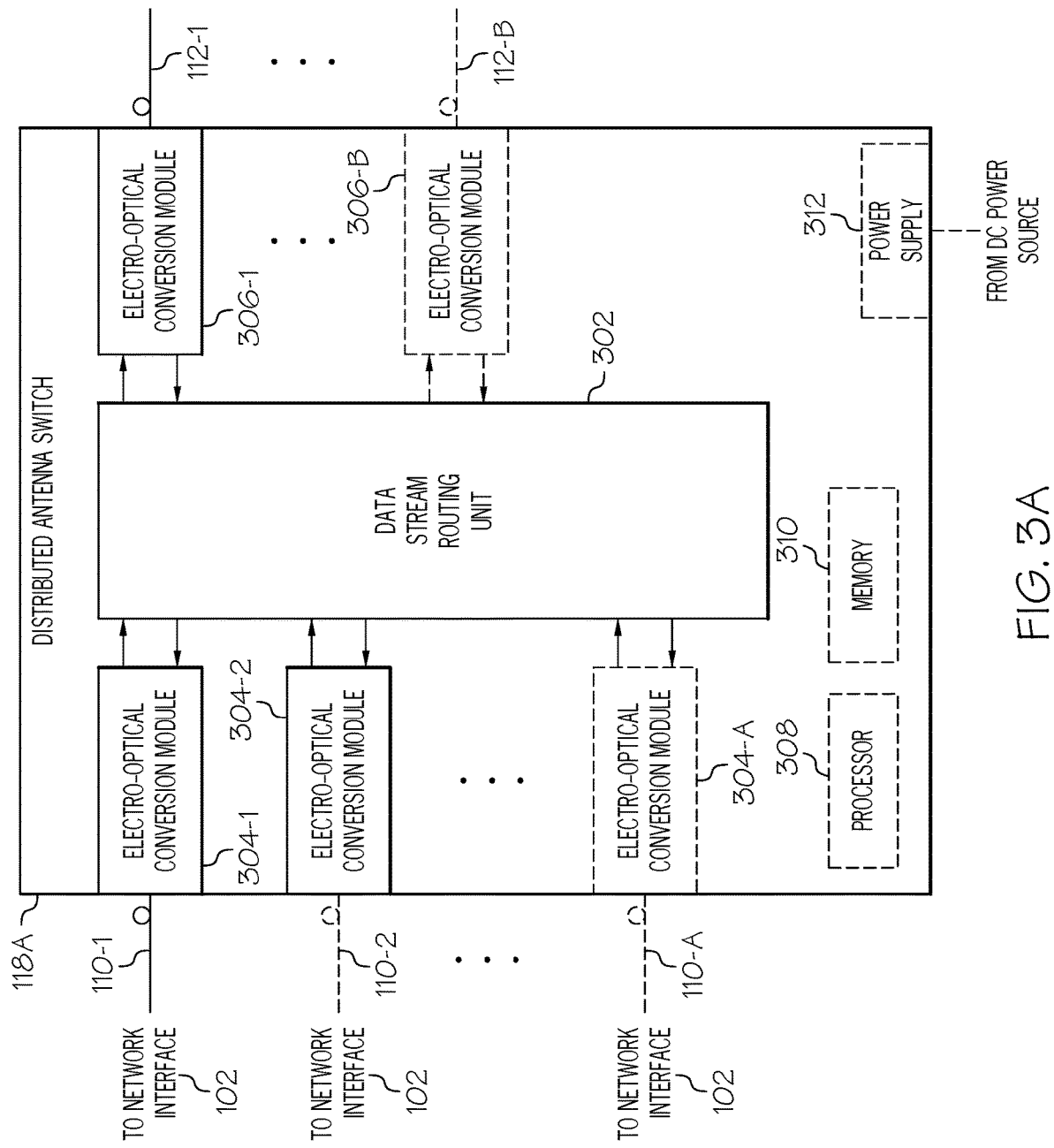
FIGS. 3A-3C are block diagrams of exemplary embodiments of distributed antenna switches used in distributed antenna systems, such as the exemplary distributed antenna systems in FIGS. 1A-1E.
Figure 3B:
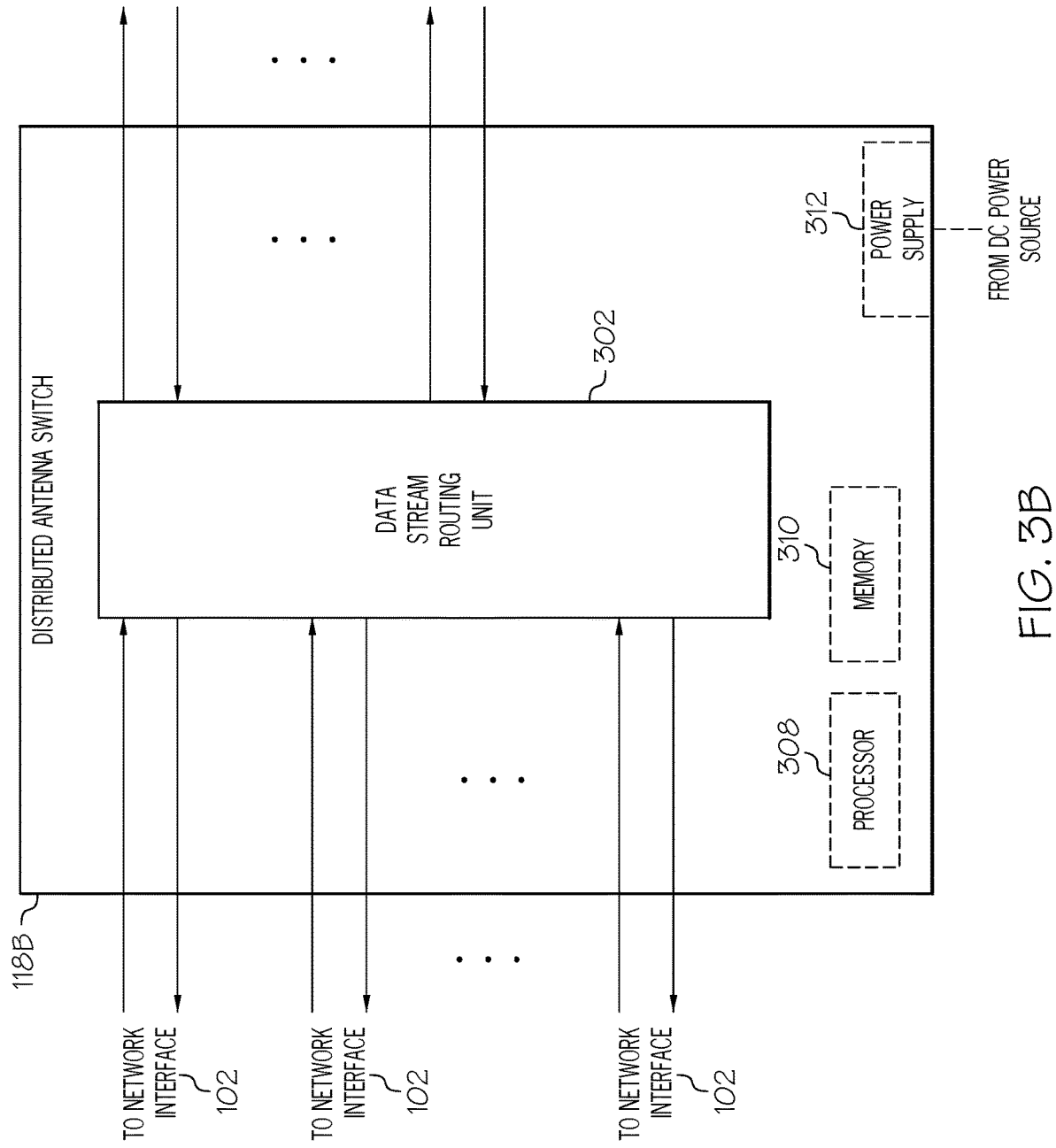
Figure 3C:
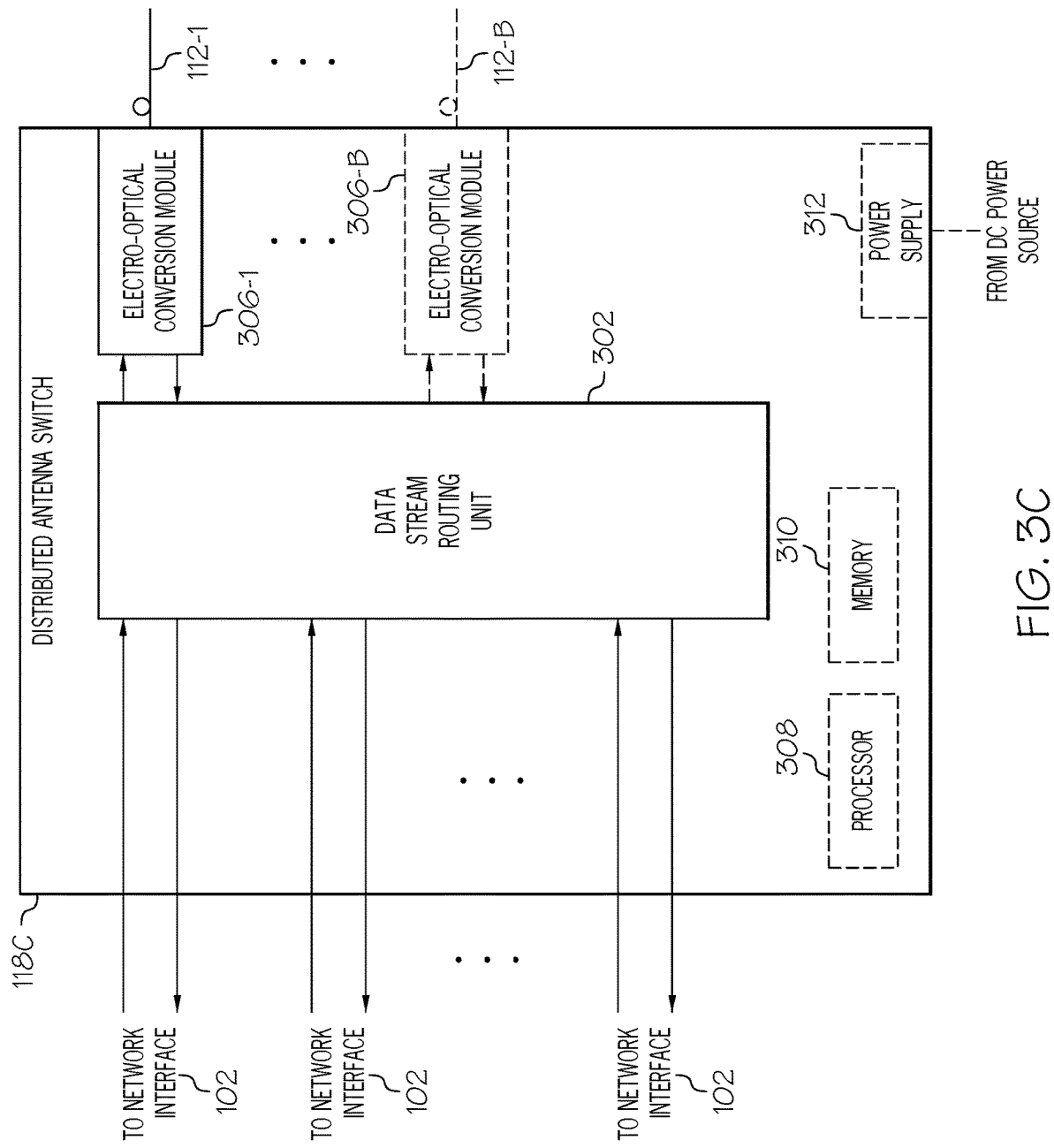

FIGS. 3A-3C are block diagrams of exemplary embodiments of distributed antenna switches used in distributed antenna systems, such as the exemplary distributed antenna systems 100 described above. Each of FIGS. 3A-3C illustrates a different embodiment of distributed antenna switch 118, labeled distributed antenna switch 118A-118C respectively.

FIG. 3A is a block diagram of an exemplary distributed antenna switch 118A including a data stream routing unit 302, electro-optical conversion modules 304 (including electro-optical conversion module 304-1, electro-optical conversion module 304-2, and any amount of optional electro-optical conversion modules 304 through optional electro-optical conversion module 304-A, and at least one electro-optical conversion module 306-1 (and any amount of optional electro-optical conversion modules 306 through optional electro-optical conversion module 306-B). In exemplary embodiments, the data stream routing unit 302 is implemented using optional processor 308 and optional memory 310. In exemplary embodiments, the distributed antenna switch 118A includes optional power supply 312 to power the various elements of the distributed antenna switch 118A. In exemplary embodiments, the distributed antenna switch 118A can be controlled by a separate controller or another component of the system. In exemplary embodiments the distributed antenna switch 118A is controlled either manually or automatically. In exemplary embodiments, the routes can be pre-determined and static. In other exemplary embodiments, the routes can dynamically change based on time of day, load, or other factors.

Each electro-optical conversion module 304 is communicatively coupled to a network interface 102 across a digital communication link 110. In the forward path, each electro-optical conversion module 304 is configured to receive a downlink digitized data stream from at least one network interface 102 across a digital communication link 110. Specifically, electro-optical conversion module 304-1 is configured to receive a downlink digitized data stream from network interface 102-1 across digital communication link 110-1, electro-optical conversion module 304-2 is configured to receive a downlink digitized data stream from network interface 102-2 across digital communication link 110-2, and optional electro-optical conversion module 304-A is configured to receive a downlink digitized data stream from optional network interface 102-A across optional digital communication link 110-A. Each electro-optical conversion module 304 is configured to convert the downlink digitized data streams from optical to electrical signals, which are then passed onto the data stream routing unit 302. Similarly in the reverse path, in exemplary embodiments each electro-optical conversion module 304 is configured to receive an uplink digitized data stream in an electrical format from the data stream routing unit 302 and to convert them to an optical format for communication across a digital communication link 110 to a network interface 102.

Generally in the forward path, the data stream routing unit 302 receives downlink data streams for a plurality of electro-optical conversion modules 304 and aggregates a plurality of these downlink data streams into at least one downlink aggregate data stream that is routed to at least one electro-optical conversion module 306 (such as electro-optical conversion module 306-1) for eventual transmission to a remote antenna unit 104. In exemplary embodiments, the same or different downlink aggregate data streams are routed to a plurality of electro-optical conversion modules 306. In some embodiments, the data stream routing unit 302 is configured to aggregate and route data from a first subset of network interfaces 102 into a first downlink aggregate data stream that is transferred to at least a first remote antenna unit 104 and is further configured to aggregate and route data from a second subset of network interfaces 102 into a second downlink aggregate data stream that is transferred to at least a second remote antenna unit 104. In exemplary embodiments, the first and second subsets are mutually exclusive. In other exemplary embodiments, the first and second subsets partially overlap. In other exemplary embodiments, the first and second subsets are identical. In other exemplary embodiments, data streams from greater numbers of subsets of network interfaces 102 are aggregated and communicated to greater numbers of remote antenna units 104.

Similarly in the reverse path, the data stream routing unit 302 receives at least one uplink aggregate data stream from at least one electro-optical conversion module 306 (such as electro-optical conversion module 306-1) from a remote antenna unit 104 and splits it into a plurality of uplink data streams which are passed to electro-optical conversion modules 304-1 for eventual communication to a network interface 102. In exemplary embodiments, the same or different uplink aggregate data streams are received from a plurality of electro-optical conversion modules 306. In some embodiments, the data stream routing unit 302 is configured to receive, split apart, and route data from a first uplink aggregate data stream from at least a first remote antenna unit 104-1 to a first subset of electro-optical conversion modules 304 destined for a first subset of network interfaces 102 and is further configured to receive, split apart, and route data from a second uplink aggregate data stream from at least a second remote antenna unit 104-2 to a second subset of electro-optical conversion modules 304 destined for a second subset of network interfaces 102. In exemplary embodiments, the first and second subsets are mutually exclusive. In other exemplary embodiments, the first and second subsets partially overlap. In other exemplary embodiments, the first and second subsets are identical. In other exemplary embodiments, aggregate data streams from greater numbers of remote antenna units 104 are split apart and communicated to greater numbers of subsets of network interfaces 102.

Electro-optical conversion module 306 is communicatively coupled to a remote antenna unit 104 across a digital communication link 112. In the forward path, each electro-optical conversion module 304 is configured to receive an aggregate downlink data stream in an electrical format from the data stream routing unit 302. Specifically, electro-optical conversion module 306-1 is configured to receive a first downlink aggregate data stream in an electrical format from the data stream routing unit 302, and optional electro-optical conversion module 306-B is configured to receive a second downlink aggregate data stream from data stream routing unit 302. Each electro-optical conversion module 306 is configured to convert the aggregate downlink data streams from electrical signals to optical signals, which are then communicated across a digital communication link 110 to a remote antenna unit 104. Similarly, in the reverse path, in exemplary embodiments each electro-optical conversion module 304 is configured to receive an uplink aggregate digitized data stream from a remote antenna unit 104 across a digital communication link 110 in an optical format and to convert them to an electrical format for communication to the data stream routing unit 302.

FIG. 3B is a block diagram of an exemplary distributed antenna switch 118B including data stream routing unit 302, optional processor 308, optional memory 310, and optional power supply 312. Distributed antenna switch 118B includes similar components to distributed antenna switch 118A and operates according to similar principles and methods as distributed antenna switch 118A described above. The difference between distributed antenna switch 118B and distributed antenna switch 118A is that distributed antenna switch 118B does not include any electro-optical conversion modules 304 or any electro-optical conversion modules 306. Accordingly, the distributed antenna switch 118B communicates using electrical signals with upstream network interfaces 102 and downstream with remote units 104 through distributed switching network 106. In exemplary embodiments, the distributed antenna switch 118B can be controlled by a separate controller or another component of the system. In exemplary embodiments the distributed antenna switch 118B is controlled either manually or automatically. In exemplary embodiments, the routes can be pre-determined and static. In other exemplary embodiments, the routes can dynamically change based on time of day, load, or other factors.

FIG. 3C is a block diagram of an exemplary distributed antenna switch 118C including data stream routing unit 302, at least one electro-optical conversion module 306, optional processor 308, optional memory 310, and optional power supply 312. Distributed antenna switch 118C includes similar components to distributed antenna switch 118A and operates according to similar principles and methods as distributed antenna switch 118A described above. The difference between distributed antenna switch 118C and distributed antenna switch 118A is that distributed antenna switch 118C does not include any electro-optical conversion modules 304. Accordingly, the distributed antenna switch 118C communicates using electrical signals with upstream network interfaces 102 and using optical signals with downstream remote antenna units 104 through distributed switching network 106. Exemplary embodiments combine electrical and optical communication in either the upstream and/or downstream at the distributed antenna switch 118. In exemplary embodiments, the distributed antenna switch 118C can be controlled by a separate controller or another component of the system. In exemplary embodiments the distributed antenna switch 118C is controlled either manually or automatically. In exemplary embodiments, the routes can be pre-determined and static. In other exemplary embodiments, the routes can dynamically change based on time of day, load, or other factors.

Figure 4:
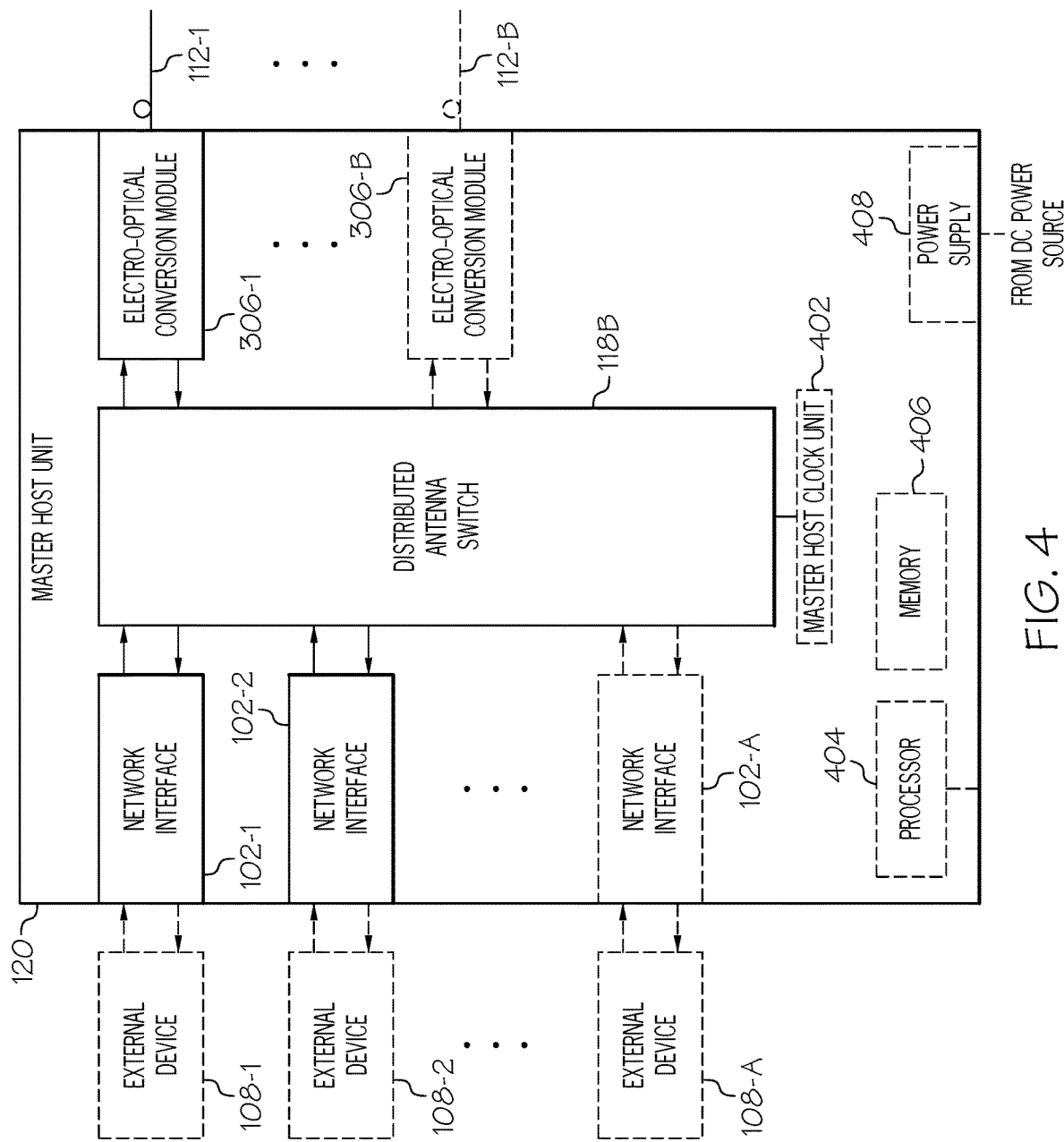
FIG. 4 is a block diagram of an exemplary embodiment of a master host unit used in distributed antenna systems, such as the exemplary distributed antenna systems in FIGS. 1A-1E.

FIG. 4 is a block diagram of an exemplary embodiment of a master host unit 120 used in distributed antenna systems, such as the exemplary distributed antenna systems 100 described above. Exemplary master host unit 120 includes at least two network interfaces 102 (including network interface 102-1, network interface 102-2, and any number of optional network interfaces 102 through optional network interface 102-A), distributed antenna switch 118B, at least one electro-optical conversion module 306 (including electro-optical conversion module 306-1 and any amount of optional electro-optical conversion modules 306 through electro-optical conversion module 306-B), an optional master host clock unit 402, an optional processor 404, optional memory 406, and an optional power supply 408. In exemplary embodiments, the network interfaces 102, distributed antenna switch 118B, the at least one electro-optical conversion module 306, and/or master host clock unit 402 are implemented by optional processor 404 and memory 406. In exemplary embodiments, power supply 408 provides power for the various components of the master host unit 120. In exemplary embodiments, the distributed antenna switch 118B can be controlled by a separate controller or another component of the system. In exemplary embodiments the distributed antenna switch 118B is controlled either manually or automatically. In exemplary embodiments, the routes can be pre-determined and static. In other exemplary embodiments, the routes can dynamically change based on time of day, load, or other factors.

In the forward path, each network interface 102 receives downlink signals from a respective external device 108, converts the downlink signals into a downlink data stream, and communicates the downlink data stream to the distributed antenna switch 118B. In exemplary embodiments, the distributed antenna switch 118B aggregates the downlink data streams and outputs the aggregate downlink data stream to the at least one electro-optical conversion module 306-1. In other embodiments, the distributed antenna switch 118B aggregates and routes downlink data streams received from respective network interfaces 102 in different ways. In exemplary embodiments, the electro-optical conversion module 306-1 converts the aggregate downlink data stream output by the distributed antenna switch from electrical format to optical format and outputs it on optical communication medium 112-1. In exemplary embodiments, electro-optical conversion modules 306 convert various downlink data streams output by the distributed antenna switch from electrical format to optical format and outputs them on optical communication mediums 112.

In the reverse path, the electro-optical conversion module 306-1 receives optical formatted uplink data streams from the optical communication medium 112-1, converts them to electrical signals and passes the electrically formatted uplink data streams to the distributed antenna switch 118B. In exemplary embodiments, the distributed antenna switch splits apart, aggregates, and routes uplink data streams received from respective network interfaces 102 in different ways to various network interfaces 102. The network interfaces 102 then convert the uplink data streams into uplink signals that are passed onto the respective external devices 108.

In exemplary embodiments, the master host clock unit 402 extracts the master reference clock from signal supplied by at least one external device 108 and distributes this master clock with other external devices 108 through the corresponding network interfaces 102. In exemplary embodiments, the master host clock unit 402 generates a master reference clock and distributes the generated master reference clock with external devices 108 through the corresponding network interfaces 102. In exemplary embodiments, the master clock is also supplied to other components of the distributed antenna system 100 in the downlink.

Figure 5:
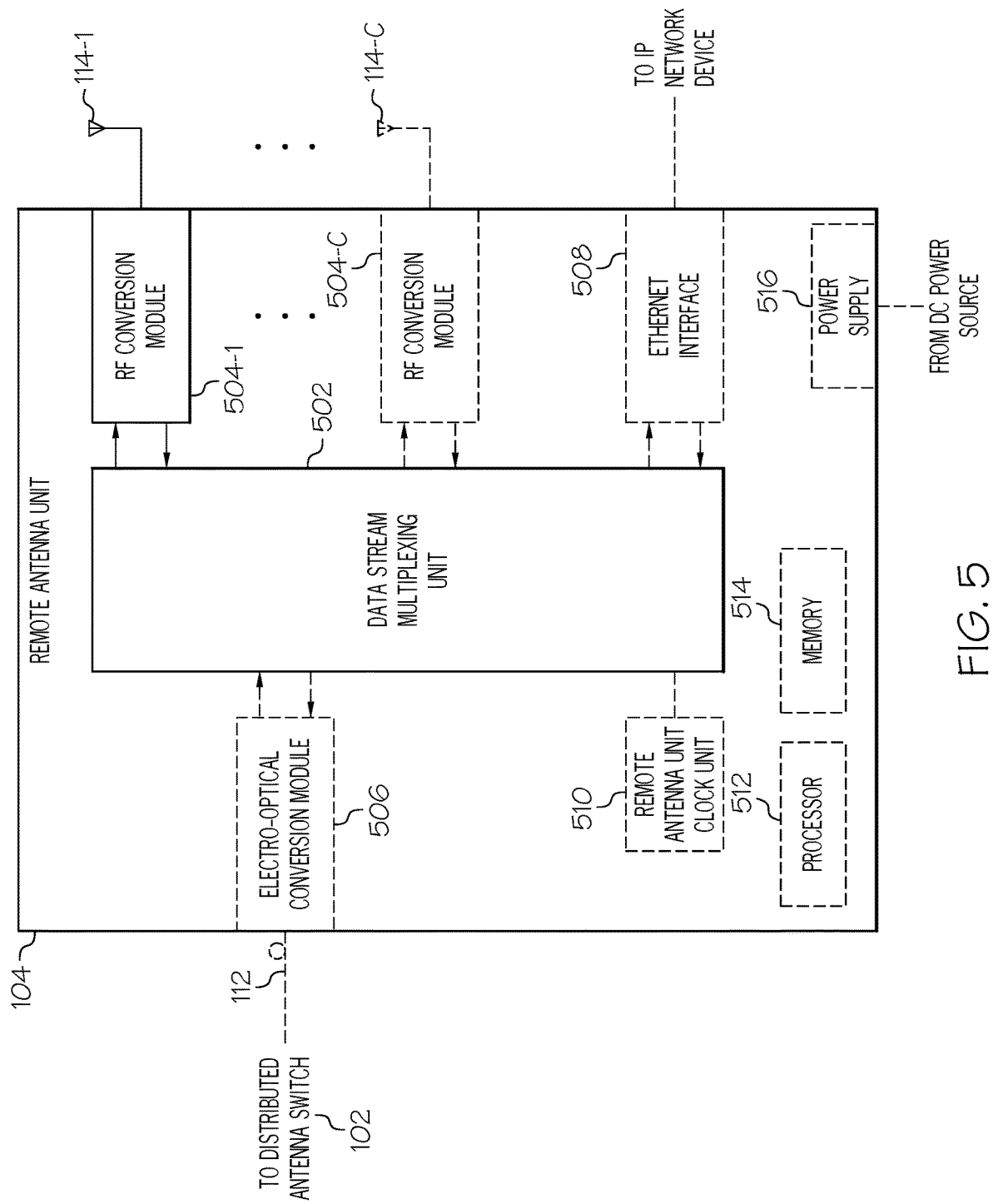
FIG. 5 is a block diagram of an exemplary embodiment of a remote antenna unit used in distributed antenna systems, such as the exemplary distributed antenna systems in FIGS. 1A-1E.

FIG. 5 is a block diagram of an exemplary embodiment of a remote antenna unit 104 used in distributed antenna systems, such as the exemplary distributed antenna systems 100 described above. The remote antenna unit 104 includes a data stream multiplexing unit 502, at least one radio frequency (RF) conversion module 504 (including RF conversion module 504-1 and any amount of optional RF conversion modules 504 through optional RF conversion module 504-C), optional electro-optical conversion module 506, optional Ethernet interface 508, optional remote antenna unit clock unit 510, optional processor 512, optional memory 514, and optional power supply 516. In exemplary embodiments, data stream multiplexing unit 502, at least one RF conversion module 504, and/or the optional electro-optical conversion module 506 are implemented at least in part by optional processor 512 and memory 514. In exemplary embodiments, optional power supply 516 is used to power the various components of the remote antenna unit 104.

In exemplary embodiments, data stream multiplexing unit 502 receives at least one downlink data stream from at least one network interface 102 through the distributed switching network 106. In exemplary embodiments, the at least one downlink data stream is received through the optional electro-optical conversion module 506 that converts the downlink data stream from an optical format to an electrical format. In exemplary embodiments, more input lines and/or more electro-optical conversion modules 506 are included in the remote antenna unit 104. In exemplary embodiments, the data stream multiplexing unit 502 splits apart an aggregate downlink data stream into at least one downlink data stream that is sent to RF conversion module 504-1 for eventual transmission as a radio frequency on antenna 114-1. In exemplary embodiments, the data stream multiplexing unit 502 splits apart the aggregate downlink data stream into a plurality of downlink data streams that are sent to a plurality of RF conversion modules 504 for eventual transmission as radio frequency signals at antennas 114.

In exemplary embodiments, data stream multiplexing unit 502 receives at least one uplink data stream from at least one RF conversion module 504. In exemplary embodiments, the data stream multiplexing unit 502 receives a plurality of uplink data streams from a plurality of RF conversion modules 504. In exemplary embodiments, the data stream multiplexing unit aggregates at least one uplink data stream received from an RF conversion module 504-1 with another uplink data stream received from another RF conversion module 504. In exemplary embodiments, the data stream multiplexing unit 502 aggregates a plurality of uplink data streams into a single aggregate uplink data stream. In exemplary embodiments, the aggregate uplink data stream is provided to optional electro-optical conversion module 506 which converts the aggregate uplink data stream from electrical signals to optical signals before communicating the aggregate uplink data stream to the distributed antenna switch 102 through the distributed switching network 106.

In other embodiments, the aggregate uplink data stream is communicated as electrical signals toward the distributed antenna switch 102 through the distributed switching network 106. In exemplary embodiments, the aggregate uplink signal is converted to optical signals at another place in the distributed antenna system 100.

In exemplary embodiments, the optional Ethernet interface 508 receives a downlink data stream from the data stream multiplexing unit 502 and converts it to Ethernet packets and communicates the Ethernet packets with an internet protocol network device. The optional Ethernet interface 508 also receives Ethernet packets from the internet protocol network device and converts them to an uplink data stream and communicates it to the data stream multiplexing unit 502.

In exemplary embodiments, the optional remote antenna unit clock unit 510 extracts the master reference clock from the downlink data stream and uses this master clock within the remote antenna unit 104 to establish a common time base in the remote antenna unit 104 with the rest of the distributed antenna system 100. In exemplary embodiments, the optional remote antenna unit clock unit 510 generates a master reference clock and distributes the generated master reference clock to other components of the distributed antenna system 100 (and even the external devices 108) in the upstream using the uplink data stream.

Figure 6A:
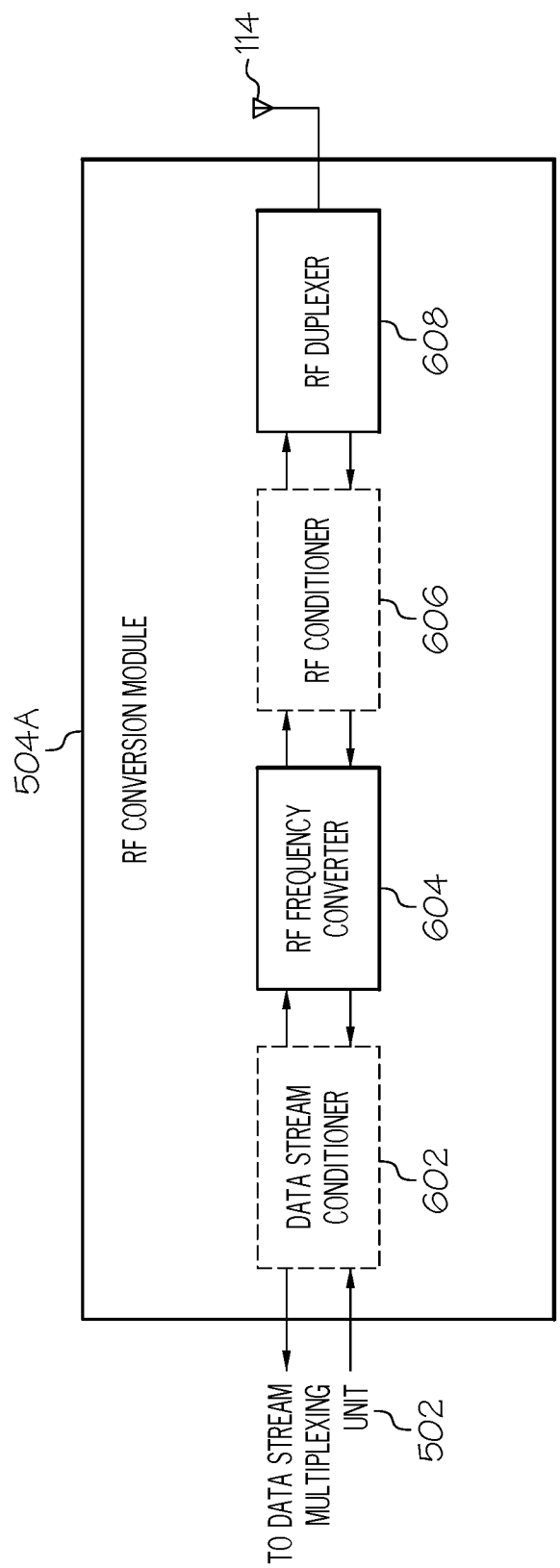
FIGS. 6A-6C are block diagrams of exemplary embodiments of RF conversion modules used in remote antenna units of distributed antenna systems, such as the exemplary remote antenna unit in FIG. 5.
Figure 6B:
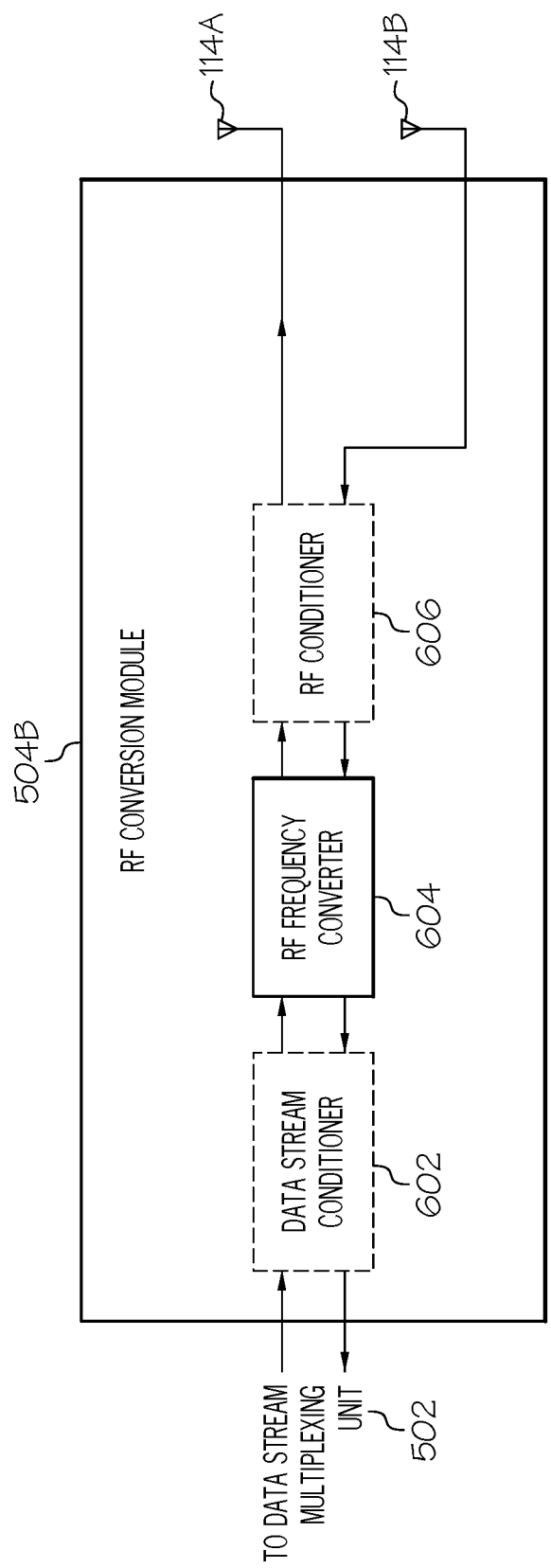
Figure 6C:
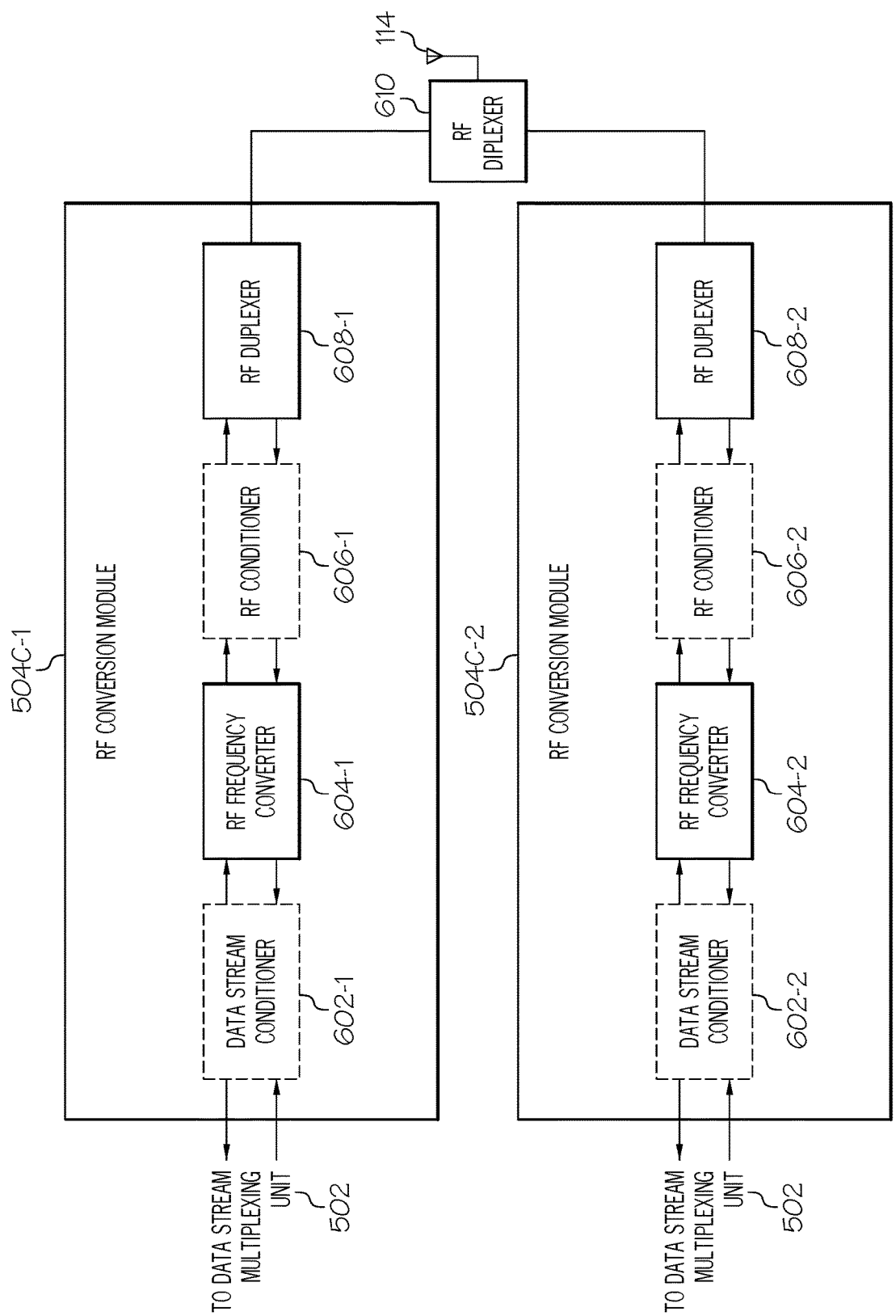

FIGS. 6A-6C are block diagrams of exemplary embodiments of RF conversion modules 504 used in remote antenna units of distributed antenna systems, such as the exemplary remote antenna unit 100 described above. Each of FIGS. 6A-6C are block diagrams of exemplary embodiments of RF conversion module 504, labeled RF conversion module 504A-504C respectively.

FIG. 6A is a block diagram of an exemplary RF conversion module 504A including an optional data stream conditioner 602, an RF frequency converter 604, an optional RF conditioner 606, and an RF duplexer 608 coupled to a single antenna 114.

The optional data stream conditioner 602 is communicatively coupled to a data stream multiplexing unit 502 and the radio frequency (RF) converter 604. In the forward path, the optional data stream conditioner 602 conditions the downlink data stream (for example, through amplification, attenuation, and filtering) received from the data stream multiplexing unit 502 and passes the downlink data stream to the RF converter 604. In the reverse path, the optional data stream conditioner 602 conditions the uplink data stream (for example, through amplification, attenuation, and filtering) received from the RF converter 604 and passes the uplink data stream to the data stream multiplexing unit 502.

The RF converter 604 is communicatively coupled to either the data stream multiplexing unit 502 or the optional data stream conditioner 602 on one side and to either RF duplexer 608 or the optional RF conditioner 606 on the other side. In the downstream, the RF converter 604 converts a downlink data stream to downlink radio frequency (RF) signals and passes the downlink RF signals onto either the RF duplexer 608 or the optional RF conditioner 606. In the upstream, the RF converter 604 converts uplink radio frequency (RF) signals received from either the RF duplexer 608 or the optional RF conditioner 606 to an uplink data stream and passes the uplink data stream to either the data stream multiplexing unit 502 or the optional data stream conditioner 602.

The RF duplexer 608 is communicatively coupled to either the RF frequency converter 604 or the optional RF conditioner 606 on one side and the antenna 114 on the other side. The RF duplexer 608 duplexes the downlink RF signals with the uplink RF signals for transmission/reception using the antenna 114.

FIG. 6B is a block diagram of an exemplary RF conversion module 504B including an optional data stream conditioner 602, an RF frequency converter 604, and an optional RF conditioner 606 coupled to a downlink antenna 114A and an uplink antenna 114B. RF conversion module 504B includes similar components to RF conversion module 504A and operates according to similar principles and methods as RF conversion module 504A described above. The difference between RF conversion module 504B and RF conversion module 504A is that RF conversion module 504B does not include RF duplexer 608 and instead includes separate downlink antenna 114A used to transmit RF signals to at least one subscriber unit and uplink antenna 114B used to receive RF signals from at least one subscriber unit.

FIG. 6C is a block diagram of an exemplary RF conversion module 504C-1 and exemplary RF conversion module 504C-2 that share a single antenna 114 through an RF diplexer 610. The RF conversion module 504C-1 includes an optional data stream conditioner 602-1, an RF frequency converter 604-1, an optional RF conditioner 606-1, and an RF duplexer 608-1 communicatively coupled to RF diplexer 610 that is communicatively coupled to antenna 114. Similarly, the RF conversion module 504C-2 includes an optional data stream conditioner 602-2, an RF frequency converter 604-2, an optional RF conditioner 606-2, and an RF duplexer 608-2 communicatively coupled to RF diplexer 610 that is communicatively coupled to antenna 114. Each of RF conversion module 504C-1 and 504C-2 operate according to similar principles and methods as RF conversion module 504A described above. The difference between RF conversion modules 504C-1 and 504C-2 and RF conversion module 504A is that RF conversion modules 504C-1 and 504C-2 are both coupled to a single antenna 114 through RF diplexer 610. The RF diplexer 610 diplexes the duplexed downlink and uplink signals for both RF conversion module 504C-1 and 504C-2 for transmission/reception using the single antenna 114.

Figure 7:
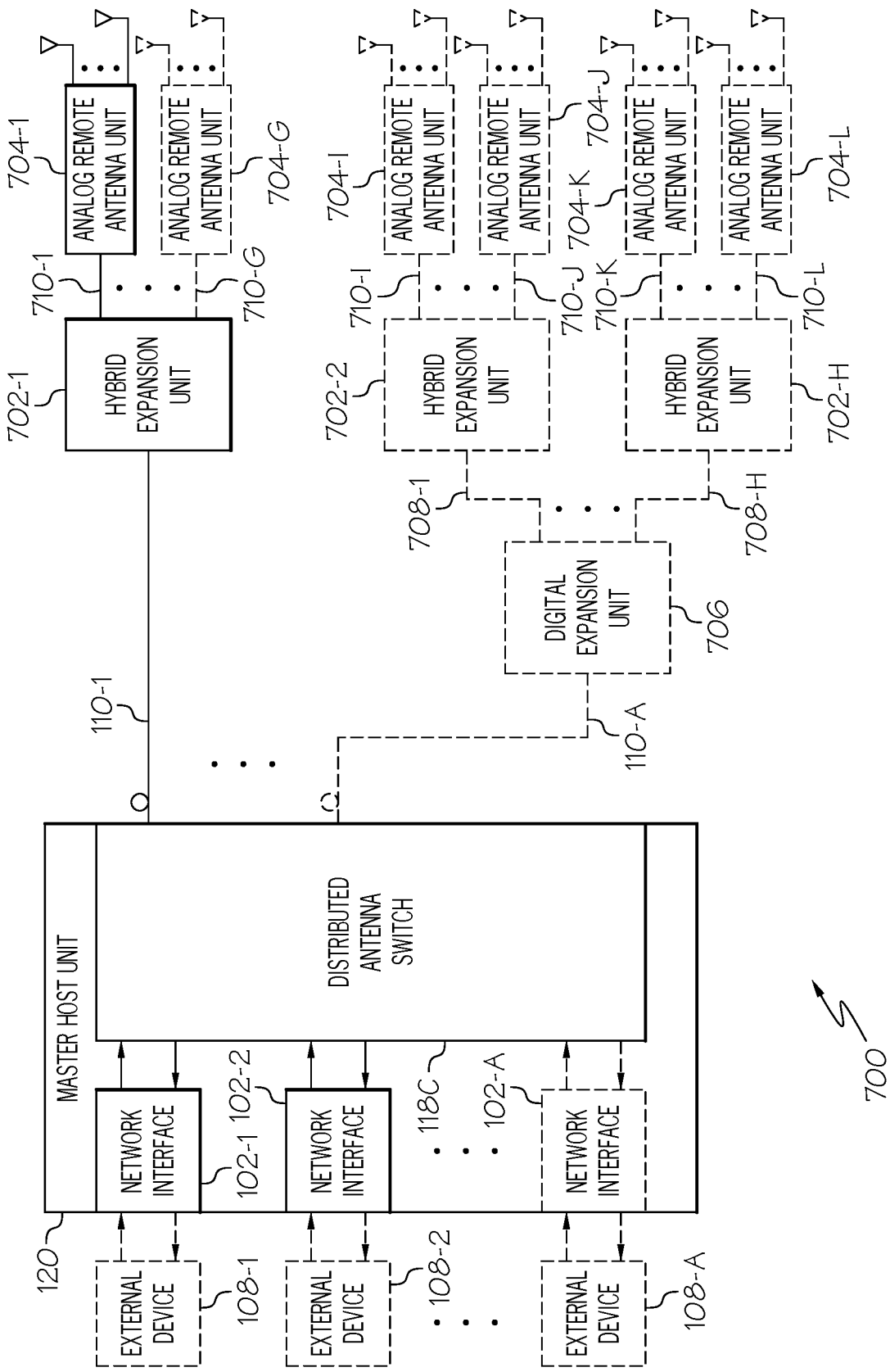
FIG. 7 is a block diagram of an exemplary embodiment of a hybrid distributed antenna system.

FIG. 7 is a block diagram of an exemplary embodiment of a hybrid distributed antenna system 700. Hybrid distributed antenna system 700 includes a master host unit 120 having a plurality of network interfaces 102 (including network interface 102-1, network interface 102-2, and any amount of optional network interfaces 102 through optional network interface 102-A) and a distributed antenna switch 118C, at least one hybrid expansion unit 702 (including hybrid expansion unit 702-1, optional hybrid expansion unit 702-2 and any amount of additional optional hybrid expansion units 702 through optional hybrid expansion unit 702-H), at least one analog remote antenna unit 704 (including analog remote antenna unit 704-1 and any amount of optional analog remote antenna units 704 through analog remote antenna unit 704-L), and optional digital expansion unit 706. Master host unit 120 including network interfaces 102 and distributed antenna switch 118C operate as described above. The main differences between the hybrid distributed antenna system 700 and the distributed antenna systems 100 described above is the inclusion of at least one hybrid expansion unit 702 that acts as the interface between the digital portion of the distributed antenna system 700 (between the master host unit 120 and the hybrid expansion unit 702) and the analog portion of the distributed antenna system 700 (between the hybrid expansion unit 702 and the at least one analog remote antenna unit 704). In exemplary embodiments, the distributed antenna switch 118C can be controlled by a separate controller or another component of the system. In exemplary embodiments the distributed antenna switch 118C is controlled either manually or automatically. In exemplary embodiments, the routes can be pre-determined and static. In other exemplary embodiments, the routes can dynamically change based on time of day, load, or other factors.

In the forward path, the hybrid expansion unit 702 converts between the digital downlink data stream provided by the distributed antenna switch 118C across digital communication link 110 and analog downlink signals that are communicated to the at least one analog remote antenna unit 704. In exemplary embodiments, the hybrid expansion unit 702 aggregates, splits apart, and routes downlink data streams converted to downlink analog signals to various analog remote antenna units 704. In exemplary embodiments, the analog downlink signals are intermediate frequency analog signals communicated across an analog wired medium 710, such as a coaxial cable or twisted pair cabling. The analog remote antenna unit 704 then converts the analog signals to radio frequency signals and communicates them with a subscriber unit.

In the reverse path, the analog remote antenna unit 704 receives radio frequency signals from a subscriber unit and converts the radio frequency signals to analog signals for transmission across the analog wired medium 710. The hybrid expansion unit 702 converts between analog uplink signals received from the analog remote antenna unit to an uplink data stream that is communicated to the distributed antenna switch 118C across digital communication link 110. In exemplary embodiments, the hybrid expansion unit 702 aggregates, splits apart, and routes uplink analog signals converted to uplink data streams to various ports of the distributed antenna switch 118C or different master host units 120 altogether. In exemplary embodiments, the analog uplink signals are intermediate frequency analog signals communicated across the analog wired medium 710.

Figure 8:
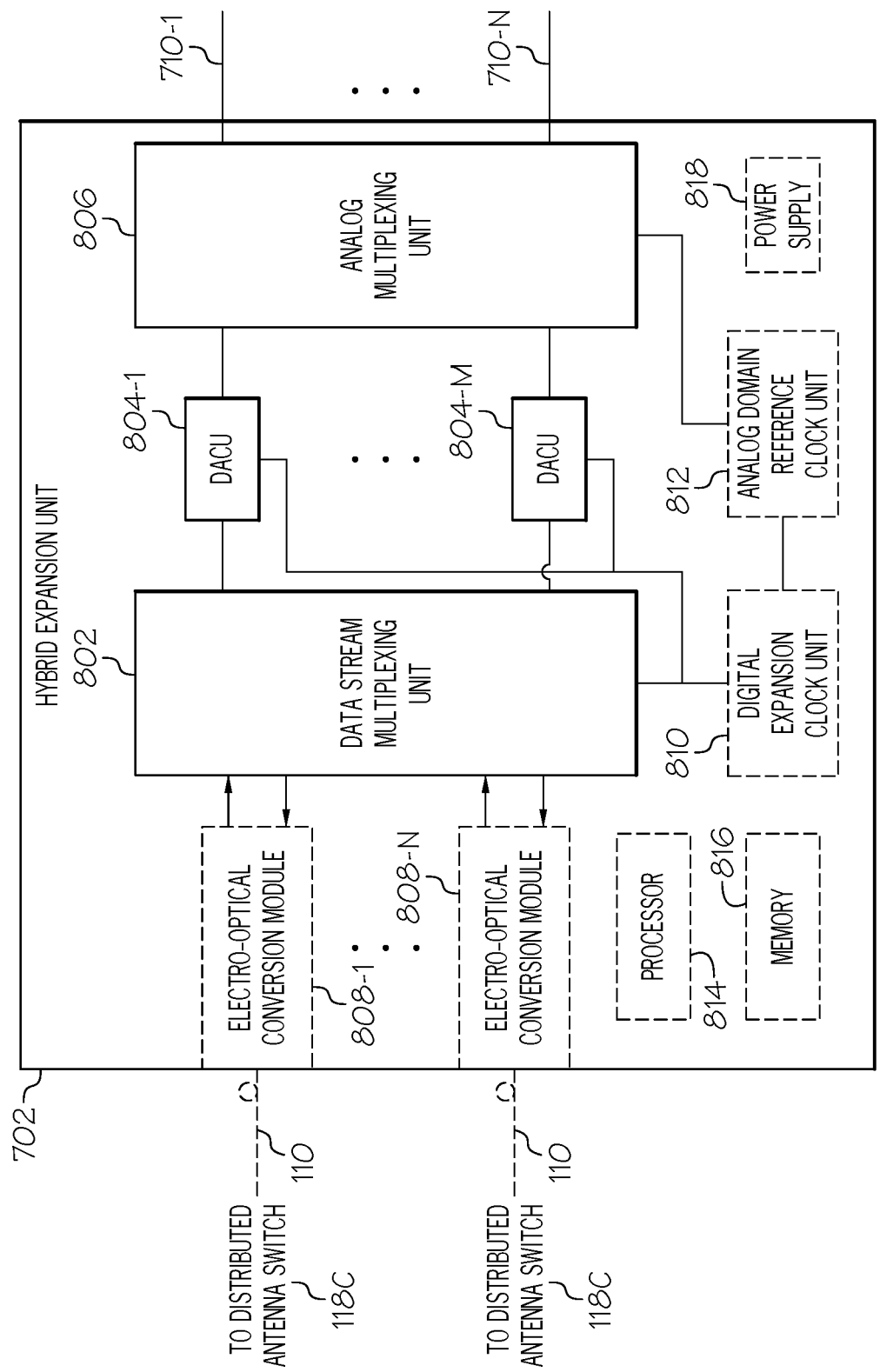
FIG. 8 is a block diagram of an exemplary embodiment of a hybrid expansion unit used in hybrid distributed antenna systems, such as the hybrid distributed antenna system in FIG. 7.

FIG. 8 is a block diagram of an exemplary embodiment of a hybrid expansion unit 702 used in hybrid distributed antenna systems, such as the hybrid distributed antenna system 700. Hybrid expansion unit 702 includes a data stream multiplexing unit 802, a plurality of digital to analog conversion units 804 (including digital to analog conversion unit 804-1 and any number of optional digital to analog conversion units 804 through digital to analog conversion unit 804-M), an analog multiplexing unit 806, optional electro-optical conversion modules 808 (including optional electro-optical conversion module 808-1 though optional electro-optical conversion module 808-N), an optional digital expansion clock unit 810, an optional analog domain reference clock unit 812, an optional processor 814, optional memory 816, and an optional power supply 818. In exemplary embodiments, the data stream multiplexing unit 802, the digital to analog conversion units 804, the analog multiplexing unit 806, the digital expansion clock unit 810, and/or the analog domain reference clock unit 816 are at least in part implemented using optional processor 814 and optional memory 816. In exemplary embodiments, the optional power supply 818 provides power to the various elements of the hybrid expansion unit 702.

In the forward path, the data stream multiplexing unit 802 receives downlink data streams from distributed antenna switches 118C. In exemplary embodiments, the downlink data streams are converted from optical signals to electrical signals by optional electro-optical conversion modules 808. The data stream multiplexing unit 802 then routes the data streams to appropriate digital to analog conversion units 804 for conversion to analog signals from digital data streams. In exemplary embodiments, the digital to analog conversion units 804 convert the downlink data streams into downlink intermediate frequency signals. In exemplary embodiments, the analog multiplexing unit 806 receives the downlink analog signals and routes them to appropriate analog communication medium 710.

In the reverse path, the analog multiplexing unit 806 receives uplink analog signals from the analog communication media 710 and routes them to the appropriate digital to analog conversion unit 804 to be converted to uplink data streams and passed to the data stream multiplexing unit 802 for routing to the appropriate digital communication medium 110 destined to a particular port of a distributed antenna switch 118C.

In exemplary embodiments, the digital expansion clock unit 810 extracts the master reference clock from a downlink data stream received from the distributed antenna switch 118C and passes it to the analog domain reference clock unit 812, which converts the master reference clock to an analog clock that is then embedded in the downlink analog signals at the analog multiplexing unit 806. Accordingly, the reference clock can be used within the hybrid expansion unit 702 and sent to the analog remote antenna units 704 for use by them. In other embodiments, the master reference clock is received from one of the analog remote antenna units 704 or another downstream component of the distributed antenna system 700 and is extracted by the analog domain reference clock unit 812 and provided to the digital expansion clock unit 810 which embeds it into uplink digital data streams for communication to the distributed antenna switch 118C.

FIG. 9 is a block diagram of an exemplary embodiment of an analog remote antenna unit 704 used in hybrid or analog distributed antenna systems, such as the exemplary hybrid distributed antenna system 700. The analog remote antenna unit includes an analog multiplexing unit 902, at least one radio frequency (RF) conversion module 904 (including RF conversion module 904-1 and any amount of optional RF conversion modules 904 through optional RF conversion module 904-0), optional Ethernet interface 906, optional remote antenna unit clock unit 908, optional processor 910, optional memory 912, and optional power supply 914. In exemplary embodiments, analog multiplexing unit 902, at least one RF conversion module 904, and/or the remote antenna unit clock unit 908 are implemented at least in part by optional processor 910 and optional memory 912. In exemplary embodiments, optional power supply 914 is used to power the various components of the analog remote antenna unit 704.

In exemplary embodiments, analog multiplexing unit 902 receives at least one multiplexed analog signal from at least one hybrid expansion unit 702. In exemplary embodiments more input lines are included in the analog remote antenna unit 704. In exemplary embodiments, the analog multiplexing unit 904 splits apart an aggregate multiplexed downlink analog signal into at least one downlink analog signal that is sent to RF conversion module 904-1 for eventual transmission as a radio frequency on antenna 114-1. In exemplary embodiments, the analog multiplexing unit 902 splits apart the aggregate downlink analog signals into a plurality of downlink analog signals that are sent to a plurality of RF conversion modules 904 for eventual transmission as radio frequency signals at antennas 114.

In exemplary embodiments, analog multiplexing unit 902 receives at least one uplink analog signal from at least one RF conversion module 904. In exemplary embodiments, the analog multiplexing unit 902 receives a plurality of uplink analog signals from a plurality of RF conversion modules 904. In exemplary embodiments, the analog multiplexing unit 902 aggregates at least one uplink analog signal received from an RF conversion module 904-1 with another uplink analog signal received from another RF conversion module 904. In exemplary embodiments, the analog multiplexing unit 902 aggregates a plurality of uplink analog signals into a single aggregate analog multiplexed signal. In exemplary embodiments, the aggregate uplink data stream is communicated as electrical signals to the hybrid expansion unit 702.

In exemplary embodiments, the optional remote antenna unit clock unit 908 extracts the master reference clock from the downlink analog signal and uses this master clock within the analog remote antenna unit 704 to establish a common time base in the remote antenna unit 704 with the rest of the distributed antenna system 100. In exemplary embodiments, the optional remote antenna unit clock unit 908 generates a master reference clock and distributes the generated master reference clock to other components of the distributed antenna system 100 (and even the external devices 108) in the upstream using the uplink analog signal.

In exemplary embodiments, the optional Ethernet interface 906 receives a downlink analog signal from the analog multiplexing unit 902 and converts it to Ethernet packets and communicates the Ethernet packets with an internet protocol network device. The optional Ethernet interface 906 also receives Ethernet packets from the internet protocol network device and converts them to an uplink analog signal and communicates it to the analog multiplexing unit 902.

FIGS. 10A-10C are block diagrams of exemplary embodiments of RF conversion modules 904 used in analog remote antenna units of hybrid or analog distributed antenna systems, such as the exemplary remote antenna unit 700 described above. Each of FIGS. 10A-10C are block diagrams of exemplary embodiments of RF conversion module 904, labeled RF conversion module 904A-904C respectively.

FIG. 10A is a block diagram of an exemplary RF conversion module 904A including an optional analog intermediate frequency conditioner 1002, an RF frequency converter 1004, an optional RF conditioner 1006, and an RF duplexer 1008 coupled to a single antenna 114.

The optional analog intermediate frequency conditioner 1002 is communicatively coupled to a data stream multiplexing unit 502 and the radio frequency (RF) converter 1004. In the forward path, the optional analog intermediate frequency conditioner 1002 conditions the downlink data stream (for example, through amplification, attenuation, and filtering) received from the data stream multiplexing unit 502 and passes the downlink data stream to the RF converter 1004. In the reverse path, the optional analog intermediate frequency conditioner 1002 conditions the uplink data stream (for example, through amplification, attenuation, and filtering) received from the RF converter 1004 and passes the uplink data stream to the data stream multiplexing unit 502.

The RF converter 1004 is communicatively coupled to either the data stream multiplexing unit 502 or the optional analog intermediate frequency conditioner 1002 on one side and to either RF duplexer 1008 or the optional RF conditioner 1006 on the other side. In the downstream, the RF converter 1004 converts a downlink data stream to downlink radio frequency (RF) signals and passes the downlink RF signals onto either the RF duplexer 1008 or the optional RF conditioner 1006. In the upstream, the RF converter 1004 converts uplink radio frequency (RF) signals received from either the RF duplexer 1008 or the optional RF conditioner 1006 to an uplink data stream and passes the uplink data stream to either the data stream multiplexing unit 502 or the optional analog intermediate frequency conditioner 1002.

The RF duplexer 1008 is communicatively coupled to either the RF frequency converter 1004 or the optional RF conditioner 1006 on one side and the antenna 114 on the other side. The RF duplexer 1008 duplexes the downlink RF signals with the uplink RF signals for transmission/reception using the antenna 114.

FIG. 10B is a block diagram of an exemplary RF conversion module 904B including an optional analog intermediate frequency conditioner 1002, an RF frequency converter 1004, and an optional RF conditioner 1006 coupled to a downlink antenna 114A and an uplink antenna 114B. RF conversion module 904B includes similar components to RF conversion module 904A and operates according to similar principles and methods as RF conversion module 904A described above. The difference between RF conversion module 904B and RF conversion module 904A is that RF conversion module 904B does not include RF duplexer 1008 and instead includes separate downlink antenna 114A used to transmit RF signals to at least one subscriber unit and uplink antenna 114B used to receive RF signals from at least one subscriber unit.

FIG. 10C is a block diagram of an exemplary RF conversion module 904C-1 and exemplary RF conversion module 904C-2 that share a single antenna 114 through an RF diplexer 1010. The RF conversion module 904C-1 includes an optional analog intermediate frequency conditioner 1002-1, an RF frequency converter 1004-1, an optional RF conditioner 1006-1, and an RF duplexer 1008-1 communicatively coupled to RF diplexer 1010 that is communicatively coupled to antenna 114. Similarly, the RF conversion module 904C-2 includes an optional analog intermediate frequency conditioner 1002-2, an RF frequency converter 1004-2, an optional RF conditioner 1006-2, and an RF duplexer 1008-2 communicatively coupled to RF diplexer 1010 that is communicatively coupled to antenna 114. Each of RF conversion module 904C-1 and 904C-2 operate according to similar principles and methods as RF conversion module 904A described above. The difference between RF conversion modules 904C-1 and 904C-2 and RF conversion module 904A is that RF conversion modules 904C-1 and 904C-2 are both coupled to a single antenna 114 through RF diplexer 1010. The RF diplexer 1010 diplexes the duplexed downlink and uplink signals for both RF conversion module 904C-1 and 904C-2 for transmission/reception using the single antenna 114.

FIG. 11 is a flow diagram illustrating one exemplary embodiment of a method 1100 of sourcing a master reference clock for a base station network interface from a distributed antenna system. Exemplary method 1100 begins at block 1102 with receiving a first downlink signal from a first external device external to a distributed antenna system via a first network interface unit. Exemplary method 1100 proceeds to block 1104 with converting the first downlink signal into a first downlink data stream at the first network interface unit. In exemplary embodiments, the first downlink data stream is a baseband data stream. In exemplary implementations, the baseband data stream includes quadrature samples of I/Q pairs.

Exemplary method 1100 proceeds to block 1106 with receiving a second downlink signal from a second external device external to the distributed antenna system via a second network interface unit. Exemplary method 1100 proceeds to block 1108 with converting the second downlink signal into a second downlink data stream at the second network interface unit. In exemplary embodiments, the second downlink data stream is a baseband data stream. In exemplary implementations, the baseband data stream includes quadrature samples of I/Q pairs.

Exemplary method 1100 proceeds to block 1110 with communicating the first downlink data stream from the first network interface unit to at least one of a first remote antenna unit and an intermediary device. Exemplary method 1100 proceeds to block 1112 with converting at least one of the first downlink data stream and a first downlink signal derived from the first downlink data stream at the intermediary device into a first radio frequency band signal at a first remote antenna unit. Exemplary method 1100 proceeds to block 1114 with transmitting the first radio frequency band signal to the first subscriber unit at the first remote antenna unit.

Exemplary method 1100 proceeds to block 1116 with transmitting a master reference clock to the first external device through the first network interface unit. In exemplary embodiments, this includes transmitting uplink signals to the first external device through the first base station network interface unit, wherein the uplink signals are clocked using the master reference clock such that the master reference clock is embedded in the uplink signals. Exemplary embodiments of method 1100 further include locking a reference clock of the first device of the devices external to the distributed antenna system to the master reference clock embedded in the uplink signals. In exemplary embodiments, transmitting the master reference clock to the first device of the devices external to the distributed antenna system includes transmitting the master reference clock across a separate master reference clock channel.

Exemplary embodiments of method 1100 further include generating the master reference clock within the distributed antenna system. Exemplary embodiments of method 1100 further include deriving the master reference clock from the second external device through the second base station network interface. In exemplary embodiments, this includes locking the master reference clock to a clock embedded in the second downlink signals received from the second external device.

Exemplary embodiments of method 1100 further include communicating the first downlink data stream to a hybrid expansion unit communicatively coupled between the first base station network interface unit and the first downlink data stream at the hybrid expansion unit; converting the first downlink data stream to the first downlink signal derived from the first downlink data stream at the hybrid expansion unit; communicating the first downlink signal derived from the first downlink data stream from the hybrid expansion unit to the first remote antenna unit; and converting the first downlink signal derived from the first downlink data stream into a first radio frequency band signal at the first remote antenna unit. In exemplary embodiments, the first downlink signal derived from the first downlink data stream is a downlink analog intermediate frequency signal.

Exemplary embodiments of method 1100 further include communicating the second downlink data stream from the second base station network interface unit to the first remote antenna unit; converting the second downlink data stream into a second radio frequency band signal at the first remote antenna unit; and transmitting the second radio frequency band signal to a second subscriber unit at the first remote antenna unit.

Exemplary embodiments of method 1100 further include communicating the second downlink data stream from the second base station network interface unit to a hybrid expansion unit communicatively coupled between the second base station network interface unit and the first remote antenna unit; converting the second downlink data stream to a second downlink signal derived from the first downlink data stream at the hybrid expansion unit; communicating the second downlink signal derived from the second downlink data stream from the hybrid expansion unit to the first remote antenna unit; converting the second downlink signal derived from the second downlink data stream into a second radio frequency band signal at the first remote antenna unit; and transmitting the second radio frequency band signal to a second subscriber unit at the first remote antenna unit.

Exemplary embodiments of method 1100 further include communicating the second downlink data stream from the second base station network interface unit to a second remote antenna unit; converting the first downlink data stream into a second radio frequency band signal at the second remote antenna unit; and transmitting the second radio frequency band signal to a second subscriber unit at the second remote antenna unit.

Exemplary embodiments of method 1100 further include communicating the second downlink data stream from the second base station network interface unit to a hybrid expansion unit communicatively coupled between the second base station network interface unit and the first remote antenna unit; converting the second downlink data stream to a second downlink signal derived from the first downlink data stream at the hybrid expansion unit; communicating the second downlink signal derived from the second downlink data stream from the hybrid expansion unit to the first remote antenna unit; converting the second downlink signal derived from the second downlink data stream into a second radio frequency band signal at the second remote antenna unit; and transmitting the second radio frequency band signal to a second subscriber unit at the second remote antenna unit.

Exemplary embodiments of method 1100 further include communicating the first downlink data stream from the first base station network interface unit to a distributed antenna switch communicatively coupled between the first base station network interface unit and the first distributed antenna switch; communicating the second downlink data stream from the second base station network interface unit to the distributed antenna switch communicatively coupled between the second base station network interface unit and the second distributed antenna switch; aggregating the first downlink data stream with the second downlink data stream into an aggregate downlink data stream at the distributed antenna switch; communicating the aggregate downlink data stream to the first remote antenna unit; and extracting the first downlink data stream from the aggregate downlink data stream at the first remote antenna unit.

Exemplary embodiments of method 1100 further include receiving a first uplink radio frequency band signal from the first subscriber unit at the first remote antenna unit; converting the first uplink radio frequency band signal to a first uplink data stream at the first remote antenna unit; communicating the first uplink data stream from the first remote antenna unit to the first base station network interface unit; converting the first uplink data stream into first uplink signals at the first base station network interface; and communicating the first uplink signals to the first external device at the first base station network interface.

Exemplary embodiments of method 1100 further include receiving a first uplink radio frequency band signal from the first subscriber unit at the first remote antenna unit; converting the first uplink radio frequency band signal to a first uplink analog intermediate frequency signal at the first remote antenna unit; communicating the first analog intermediate frequency signal from the first remote antenna unit to a hybrid expansion unit communicatively coupled between the first base station network interface and the first remote antenna unit; converting the first uplink analog intermediate frequency signal to a first uplink data stream at the hybrid expansion unit; communicating the first uplink data stream from the hybrid expansion unit to the first base station network interface unit; converting the first uplink data stream into first uplink signals at the first base station network interface; and communicating the first uplink signals to the first external device at the first base station network interface.

Any of the processors described above may include or function with software programs, firmware or other computer readable instructions for carrying out various methods, process tasks, calculations, and control functions, described herein. These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

EXAMPLE EMBODIMENTS

Example 1 includes a distributed antenna system comprising: a first base station network interface unit configured to receive first downlink signals from a first external device external to the distributed antenna system and to convert the first downlink signals into a first downlink data stream; a second base station network interface unit configured to receive second downlink signals from a second external device external to the distributed antenna system and to convert the second downlink signals into a second downlink data stream; a first remote antenna unit communicatively coupled to the first base station network interface unit and configured to receive at least one of the first downlink data stream from the first base station network interface unit and a first downlink signal derived from the first downlink data stream; the first remote antenna unit having a first radio frequency converter configured to convert at least one of the first downlink data stream and the first downlink signal derived from the first downlink data stream into a first radio frequency band signal and a first radio frequency antenna configured to transmit the first radio frequency band signal to a first subscriber unit; and wherein the distributed antenna system is configured to transmit a master reference clock to the first external device.

Example 2 includes the distributed antenna system of Example 1, wherein the distributed antenna system is configured to generate the master reference clock internally.

Example 3 includes the distributed antenna system of any of Examples 1-2, wherein the distributed antenna system is configured to derive the master reference clock from the second external device.

Example 4 includes the distributed antenna system of Example 3, wherein the distributed antenna system is configured to derive the master reference clock from the second external device by being configured to lock the master reference clock to a clock embedded in the second downlink signals received from the second external device.

Example 5 includes the distributed antenna system of any of Examples 1-4, wherein the distributed antenna system is configured to transmit the master reference clock to the first external device by being configured to transmit first uplink signals to the first external device through the first base station network interface unit, wherein the first uplink signals are clocked using the master reference clock such that the master reference clock is embedded in the uplink signals.

Example 6 includes the distributed antenna system of any of Examples 4-5, wherein the first external device is configured to lock its clock to the master reference clock embedded in the first uplink signals.

Example 7 includes the distributed antenna system of any of Examples 1-6, wherein the distributed antenna system is configured to transmit the master reference clock to the first external device by being configured to transmit the master reference clock across a separate master reference clock channel.

Example 8 includes the distributed antenna system of any of Examples 1-7, further comprising: a hybrid expansion unit communicatively coupled between the first base station network interface unit and the first remote antenna unit and configured to receive the first downlink data stream and convert the first downlink data stream to the first downlink signal derived from the first downlink data stream; wherein the first remote antenna unit is further configured to receive the first downlink signal derived from the first downlink data stream and to convert the first downlink signal derived from the first downlink data stream into the second radio frequency band signal.

Example 9 includes the distributed antenna system of Example 8, wherein the first downlink signal derived from the first downlink data stream is a downlink analog intermediate frequency signal.

Example 10 includes the distributed antenna system of any of Examples 1-9, wherein the first remote antenna unit is further communicatively coupled to the second base station network interface unit and configured to receive at least one of the second downlink data stream from the second base station network interface unit and a second downlink signal derived from the second downlink data stream; the first remote antenna unit further having a second radio frequency converter configured to convert at least one of the second downlink data stream and the second downlink signal derived from the second downlink data stream into a second radio frequency band signal and a second radio frequency antenna configured to transmit the second radio frequency band signal to a second subscriber unit.

Example 11 includes the distributed antenna system of any of Examples 1-10, wherein the first remote antenna unit is further communicatively coupled to the second base station network interface unit and configured to receive at least one of the second downlink data stream from the second base station network interface unit and a second downlink signal derived from the second downlink data stream; the first remote antenna unit further having a second radio frequency converter configured to convert at least one of the second downlink data stream and the second downlink signal derived from the second downlink data stream into a second radio frequency band signal; and wherein the first radio frequency antenna is further configured to transmit the second radio frequency band signal to a second subscriber unit.

Example 12 includes the distributed antenna system of any of Examples 1-11, further comprising a second remote antenna unit communicatively coupled to the second base station network interface unit and configured to receive at least one of the second downlink data stream from the second base station network interface unit and a second downlink signal derived from the second downlink data stream; and the second remote antenna unit further having a second radio frequency converter configured to convert at least one of the second downlink data stream and the second downlink signal derived from the second downlink data stream into a second radio frequency band signal and a second radio frequency antenna configured to transmit the second radio frequency band signal to a second subscriber unit.

Example 13 includes the distributed antenna system of any of Examples 1-12, further comprising: a distributed antenna switch communicatively coupled between both the first base station network interface unit and the second base station network interface unit and the first remote antenna unit, the distributed antenna switch configured to receive the first downlink data stream from the first base station network interface unit and the second downlink data stream from the second base station network interface unit and to aggregate the first downlink data stream with the second downlink data stream into an aggregate downlink data stream; the distributed antenna switch further configured to transmit the aggregate downlink data stream to the first remote antenna unit; and the first remote antenna unit further configured to receive the aggregate downlink data stream and to extract the first downlink data stream from the aggregate downlink data stream.

Example 14 includes the distributed antenna system of Example 13, further comprising a second remote antenna unit communicatively coupled to the second base station network interface unit through the distributed antenna switch and configured to receive aggregate downlink data stream and to extract the second downlink data stream from the second aggregate downlink data stream; the second remote antenna unit further having a second radio frequency converter configured to convert the second downlink data stream into a second radio frequency band signal and a second radio frequency antenna configured to transmit the second radio frequency band signal to a second subscriber unit.

Example 15 includes the distributed antenna system of any of Examples 1-14, wherein the first radio frequency antenna is further configured to receive a first uplink radio frequency band signal from the first subscriber unit; wherein the first radio frequency converter is further configured to convert the first uplink radio frequency band signal to a first uplink data stream; wherein the first remote antenna unit is further configured to communicate the first uplink data stream to the first base station network interface unit; wherein the first base station network interface unit is configured to receive the first uplink data stream from the first remote antenna unit; wherein the first network interface is configured to convert the first uplink data stream into first uplink signals; and wherein the first base station network interface unit is configured to communicate the first uplink signals to the first external device.

Example 16 includes the distributed antenna system of any of Examples 1-15, wherein the first radio frequency antenna is further configured to receive a first uplink radio frequency band signal from the first subscriber unit; wherein the first radio frequency converter is further configured to convert the first uplink radio frequency band signal to a first uplink analog intermediate frequency signal; wherein the first remote antenna unit is further configured to communicate the first uplink analog intermediate frequency signals to a hybrid expansion unit; wherein the hybrid expansion unit is configured to receive the first uplink analog intermediate frequency signals from the first remote antenna unit; wherein the hybrid expansion unit is configured to convert the first uplink analog intermediate frequency signals to a first uplink data stream; wherein the hybrid expansion unit is configured to communicate the first uplink data stream to the first base station network interface unit; wherein the first base station network interface unit is configured to receive the first uplink data stream from the hybrid expansion unit; wherein the first network interface is configured to convert the first uplink data stream into first uplink signals; and wherein the first base station network interface unit is configured to communicate the first uplink signals to the first external device.

Example 17 includes the distributed antenna system of any of Examples 1-16, wherein the first external device is a base band unit of a wireless access base station.

Example 18 includes the distributed antenna system of any of Examples 1-17, wherein the first external device is a Common Public Radio Interface (CPRI) base station, wherein the first base station network interface unit is a CPRI converter interface communicatively coupled to a CPRI base station, the CPRI converter interface configured to receive CPRI data from the CPRI base station, the CPRI converter interface further configured to convert the CPRI data into a first downlink data stream of the plurality of downlink data streams.

Example 19 includes the distributed antenna system of any of Examples 1-18, wherein the first downlink data stream is a baseband data stream.

Example 20 includes the distributed antenna system of Example 19, wherein the baseband data stream includes quadrature samples of I/Q pairs.

Example 21 includes a method comprising: receiving a first downlink signal from a first external device external to a distributed antenna system via a first base station network interface unit; converting the first downlink signal into a first downlink data stream at the first base station network interface unit; receiving a second downlink signal from a second external device external to the distributed antenna system via a second base station network interface unit; converting the second downlink signal into a second downlink data stream at the second base station network interface unit; communicating the first downlink data stream from the first base station network interface unit to at least one of a first remote antenna unit and an intermediary device; converting at least one of the first downlink data stream and a first downlink signal derived from the first downlink data stream at the intermediary device into a first radio frequency band signal at the first remote antenna unit; transmitting the first radio frequency band signal to a first subscriber unit at the first remote antenna unit; transmitting a master reference clock to the first external device through the first base station network interface unit.

Example 22 includes the method of Example 21, further comprising: generating the master reference clock within the distributed antenna system.

Example 23 includes the method of any of Examples 21-22, further comprising: deriving the master reference clock from the second external device through the second base station network interface unit.

Example 24 includes the method of Example 23, wherein deriving the master reference clock from the second external device through the second base station network interface unit includes: locking the master reference clock to a clock embedded in the second downlink signals received from the second external device.

Example 25 includes the method of any of Examples 21-24, wherein transmitting the master reference clock to the first external device includes transmitting uplink signals to the first external device through the first base station network interface unit, wherein the uplink signals are clocked using the master reference clock such that the master reference clock is embedded in the uplink signals.

Example 26 includes the method of Example 25, further comprising: locking a reference clock of the first device of the devices external to the distributed antenna system to the master reference clock embedded in the uplink signals.

Example 27 includes the method of any of Examples 21-26, wherein transmitting the master reference clock to the first device of the devices external to the distributed antenna system includes transmitting the master reference clock across a separate master reference clock channel.

Example 28 includes the method of any of Examples 21-27, further comprising: communicating the first downlink data stream to a hybrid expansion unit communicatively coupled between the first base station network interface unit and the first remote antenna unit; converting the first downlink data stream to the first downlink signal derived from the first downlink data stream at the hybrid expansion unit; communicating the first downlink signal derived from the first downlink data stream from the hybrid expansion unit to the first remote antenna unit; and converting the first downlink signal derived from the first downlink data stream into a first radio frequency band signal at the first remote antenna unit.

Example 29 includes the method of Example 28, wherein the first downlink signal derived from the first downlink data stream is a downlink analog intermediate frequency signal.

Example 30 includes the method of any of Examples 21-29, further comprising: communicating the second downlink data stream from the second base station network interface unit to the first remote antenna unit; converting the second downlink data stream into a second radio frequency band signal at the first remote antenna unit; and transmitting the second radio frequency band signal to a second subscriber unit at the first remote antenna unit.

Example 31 includes the method of any of Examples 21-30, further comprising: communicating the second downlink data stream from the second base station network interface unit to a hybrid expansion unit communicatively coupled between the second base station network interface unit and the first remote antenna unit; converting the second downlink data stream to a second downlink signal derived from the first downlink data stream at the hybrid expansion unit; communicating the second downlink signal derived from the second downlink data stream from the hybrid expansion unit to the first remote antenna unit; converting the second downlink signal derived from the second downlink data stream into a second radio frequency band signal at the first remote antenna unit; and transmitting the second radio frequency band signal to a second subscriber unit at the first remote antenna unit.

Example 32 includes the method of any of Examples 21-31, further comprising: communicating the second downlink data stream from the second base station network interface unit to a second remote antenna unit; converting the first downlink data stream into a second radio frequency band signal at the second remote antenna unit; and transmitting the second radio frequency band signal to a second subscriber unit at the second remote antenna unit.

Example 33 includes the method of any of Examples 21-32, further comprising: communicating the second downlink data stream from the second base station network interface unit to a hybrid expansion unit communicatively coupled between the second base station network interface unit and the first remote antenna unit; converting the second downlink data stream to a second downlink signal derived from the first downlink data stream at the hybrid expansion unit; communicating the second downlink signal derived from the second downlink data stream from the hybrid expansion unit to the first remote antenna unit; and converting the second downlink signal derived from the second downlink data stream into a second radio frequency band signal at the second remote antenna unit; and transmitting the second radio frequency band signal to a second subscriber unit at the second remote antenna unit.

Example 34 includes the method of any of Examples 21-33, further comprising: communicating the first downlink data stream from the first base station network interface unit to a distributed antenna switch communicatively coupled between the first base station network interface unit and the first distributed antenna switch; communicating the second downlink data stream from the second base station network interface unit to the distributed antenna switch communicatively coupled between the second base station network interface unit and the second distributed antenna switch; aggregating the first downlink data stream with the second downlink data stream into an aggregate downlink data stream at the distributed antenna switch; communicating the aggregate downlink data stream to the first remote antenna unit; and extracting the first downlink data stream from the aggregate downlink data stream at the first remote antenna unit.

Example 35 includes the method of any of Examples 21-34, further comprising: receiving a first uplink radio frequency band signal from the first subscriber unit at the first remote antenna unit; converting the first uplink radio frequency band signal to a first uplink data stream at the first remote antenna unit; communicating the first uplink data stream from the first remote antenna unit to the first base station network interface unit; converting the first uplink data stream into first uplink signals at the first base station network interface; and communicating the first uplink signals to the first external device at the first base station network interface.

Example 36 includes the method of any of Examples 21-35, further comprising: receiving a first uplink radio frequency band signal from the first subscriber unit at the first remote antenna unit; converting the first uplink radio frequency band signal to a first uplink analog intermediate frequency signal at the first remote antenna unit; communicating the first analog intermediate frequency signal from the first remote antenna unit to a hybrid expansion unit communicatively coupled between the first base station network interface and the first remote antenna unit; converting the first uplink analog intermediate frequency signal to a first uplink data stream at the hybrid expansion unit; communicating the first uplink data stream from the hybrid expansion unit to the first base station network interface unit; converting the first uplink data stream into first uplink signals at the first base station network interface; and communicating the first uplink signals to the first external device at the first base station network interface.

Example 37 includes the method of any of Examples 21-36, wherein the first downlink data stream is a baseband data stream.

Example 38 includes the method of Example 37, wherein the baseband data stream includes quadrature samples of I/Q pairs.

Example 39 includes a base station comprising: a base station network interface configured to be communicatively coupled to a corresponding base station network interface of a distributed antenna system and configured to communicate signals with the distributed antenna system; a clocking unit configured to receive a master clock signal from the distributed antenna system; and wherein the base station is further configured to synchronize itself with the distributed antenna system using the master clock signal from the distributed antenna system.

Example 40 includes the base station of Example 39, wherein the clocking unit is configured to receive the master clock signal from the distributed antenna system by being configured to lock to the master clock embedded in an uplink signal received from the distributed antenna system.

Example 41 includes the base station of any of Examples 39-40, wherein the clocking unit is configured to receive the master clock signal from the first external device across a separate master reference clock channel.

Example 42 includes the base station of any of Examples 39-41, wherein the master reference clock is generated within the distributed antenna system.

Example 43 includes the base station of any of Examples 39-42, wherein the master reference clock is derived from an device external to the distributed antenna system.

What is claimed is:
1. A network interface for use within a distributed antenna system, the network interface comprising:
 circuitry configured to:
  receive a downlink digital communication signal from an external device external to the distributed antenna system, wherein a reference clock is embedded in the downlink digital communication signal;
  generate a master reference clock for the distributed antenna system using the reference clock embedded in the downlink digital communication signal;
  convert the downlink digital communication signal into a downlink signal;
  communicate the downlink signal toward a remote antenna unit within the distributed antenna system; and
  wherein the distributed antenna system is configured to distribute the master reference clock to various components of the distributed antenna system to keep the various components of the distributed antenna system locked to a single clock, wherein the various components of the distributed antenna system include the remote antenna unit.

2. The network interface of claim 1, wherein the circuitry is configured to generate the master reference clock at least in part by being configured to lock the master reference clock to the reference clock embedded in the downlink digital communication signal.

3. The network interface of claim 1, wherein the external device is a base band unit of a wireless access base station.

4. The network interface of claim 1, wherein the external device is a Common Public Radio Interface (CPRI) base station, wherein the network interface is a CPRI converter interface communicatively coupled to the CPRI base station, the CPRI converter interface configured to receive CPRI data from the CPRI base station, the CPRI converter interface further configured to convert the CPRI data into a first downlink data stream of a plurality of downlink data streams.

5. The network interface of claim 1, wherein the downlink signal is a data stream.

6. The network interface of claim 1, wherein the downlink signal is a baseband data stream.

7. The network interface of claim 1, wherein the remote antenna unit includes an antenna for communicating wirelessly with at least one subscriber unit.

8. A base station comprising:
circuitry configured to:
embed a reference clock in a downlink digital communication signal;
communicate the downlink digital communication signal to a network interface of a distributed antenna system;
wherein the distributed antenna system is configured to generate a master reference clock for the distributed antenna system using the reference clock embedded in the downlink digital communication signal and to distribute the master reference clock to various components of the distributed antenna system to keep the various components of the distributed antenna system locked to a single master clock.

9. The base station of claim 8, wherein the base station is a base band unit of a wireless access base station.

10. The base station of claim 8, wherein the base station is a Common Public Radio Interface (CPRI) base station, wherein the network interface is a CPRI converter interface communicatively coupled to the CPRI base station, the CPRI converter interface configured to receive CPRI data from the CPRI base station, the CPRI converter interface further configured to convert the CPRI data into a first downlink data stream of a plurality of downlink data streams.

11. A method comprising:
embedding a reference clock in a downlink digital communication signal at an external device external to a distributed antenna system;
communicating the downlink digital communication signal from the external device to a network interface of the distributed antenna system;
generating a master reference clock for the distributed antenna system at the network interface using the reference clock embedded in the downlink digital communication signal;
converting the downlink digital communication signal into a downlink signal at the network interface;
communicating the downlink signal toward a remote antenna unit within the distributed antenna system; and
distributing the master reference clock from the network interface to various components of the distributed antenna system to keep the various components of the distributed antenna system locked to a single clock, wherein the various components of the distributed antenna system include the remote antenna unit.

12. The method of claim 11, wherein generating the master reference clock occurs at least in party by locking the master reference clock to the reference clock embedded in the downlink digital communication signal.

13. The method of claim 11, wherein the external device is a base band unit of a wireless access base station.

14. The method of claim 11, wherein the external device is a Common Public Radio Interface (CPRI) base station, wherein the network interface is a CPRI converter interface communicatively coupled to the CPRI base station, the CPRI converter interface configured to receive CPRI data from the CPRI base station, the CPRI converter interface further configured to convert the CPRI data into a first downlink data stream of a plurality of downlink data streams.

15. The method of claim 11, wherein the downlink signal is a data stream.

16. The method of claim 11, wherein the downlink signal is a baseband data stream.

17. The method of claim 11, further comprising:
communicating wirelessly from the remote antenna unit of the distributed antenna system with at least one subscriber unit.

* * * * *